(12) United States Patent
Chang et al.

(10) Patent No.: US 11,264,502 B2
(45) Date of Patent: Mar. 1, 2022

(54) SEMICONDUCTOR DEVICE AND METHOD

(71) Applicant: Taiwan Semiconductor Manufacturing Co., Ltd., Hsinchu (TW)

(72) Inventors: Jung-Hung Chang, Changhua County (TW); Lo-Heng Chang, Hsinchu (TW); Zhi-Chang Lin, Zhubei (TW); Shih-Cheng Chen, New Taipei (TW); Kuo-Cheng Chiang, Zhubei (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/803,278

(22) Filed: Feb. 27, 2020

(65) Prior Publication Data
US 2021/0273098 A1    Sep. 2, 2021

(51) Int. Cl.
*H01L 21/3065*    (2006.01)
*H01L 27/092*    (2006.01)
(Continued)

(52) U.S. Cl.
CPC .... *H01L 29/7848* (2013.01); *H01L 21/02532* (2013.01); *H01L 21/02603* (2013.01); *H01L 21/308* (2013.01); *H01L 21/3065* (2013.01); *H01L 21/31116* (2013.01); *H01L 21/823807* (2013.01); *H01L 21/823814* (2013.01); *H01L 21/823828* (2013.01); *H01L 21/823864* (2013.01); *H01L 21/823892* (2013.01); *H01L 27/092* (2013.01); *H01L 29/0673* (2013.01); *H01L 29/1083* (2013.01);
(Continued)

(58) Field of Classification Search
CPC ......... H01L 27/0886; H01L 21/823431; H01L 29/78696; H01L 21/823468; H01L 27/088; H01L 29/42392
See application file for complete search history.

(56) References Cited

U.S. PATENT DOCUMENTS 9,209,247 B2    12/2015    Colinge et al.
9,236,267 B2    1/2016    De et al.
(Continued)

*Primary Examiner* — Brian Turner
(74) *Attorney, Agent, or Firm* — Slater Matsil, LLP

(57) ABSTRACT

A method of independently forming source/drain regions in NMOS regions including nanosheet field-effect transistors (NSFETs), NMOS regions including fin field-effect transistors (FinFETs) PMOS regions including NSFETs, and PMOS regions including FinFETs and semiconductor devices formed by the method are disclosed. In an embodiment, a device includes a semiconductor substrate; a first nanostructure over the semiconductor substrate; a first epitaxial source/drain region adjacent the first nanostructure; a first inner spacer layer adjacent the first epitaxial source/drain region, the first inner spacer layer comprising a first material; a second nanostructure over the semiconductor substrate; a second epitaxial source/drain region adjacent the (Continued)

second nanostructure; and a second inner spacer layer adjacent the second epitaxial source/drain region, the second inner spacer layer comprising a second material different from the first material.

20 Claims, 54 Drawing Sheets

(51) Int. Cl.

| | |
|---|---|
| *H01L 29/66* | (2006.01) |
| *H01L 21/28* | (2006.01) |
| *H01L 21/8238* | (2006.01) |
| *H01L 29/78* | (2006.01) |
| *H01L 21/308* | (2006.01) |
| *H01L 29/06* | (2006.01) |
| *H01L 29/10* | (2006.01) |
| *H01L 29/423* | (2006.01) |
| *H01L 29/786* | (2006.01) |
| *H01L 21/02* | (2006.01) |
| *H01L 21/311* | (2006.01) |

(52) U.S. Cl.
CPC .... *H01L 29/42392* (2013.01); *H01L 29/6656* (2013.01); *H01L 29/66537* (2013.01); *H01L 29/66545* (2013.01); *H01L 29/66553* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2015/0318399 | A1* | 11/2015 | Jeong ................ H01L 29/165 257/401 |
| 2019/0198639 | A1* | 6/2019 | Kim ................ H01L 29/66795 |
| 2020/0381305 | A1* | 12/2020 | Ando ................ H01L 27/0886 |

\* cited by examiner

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
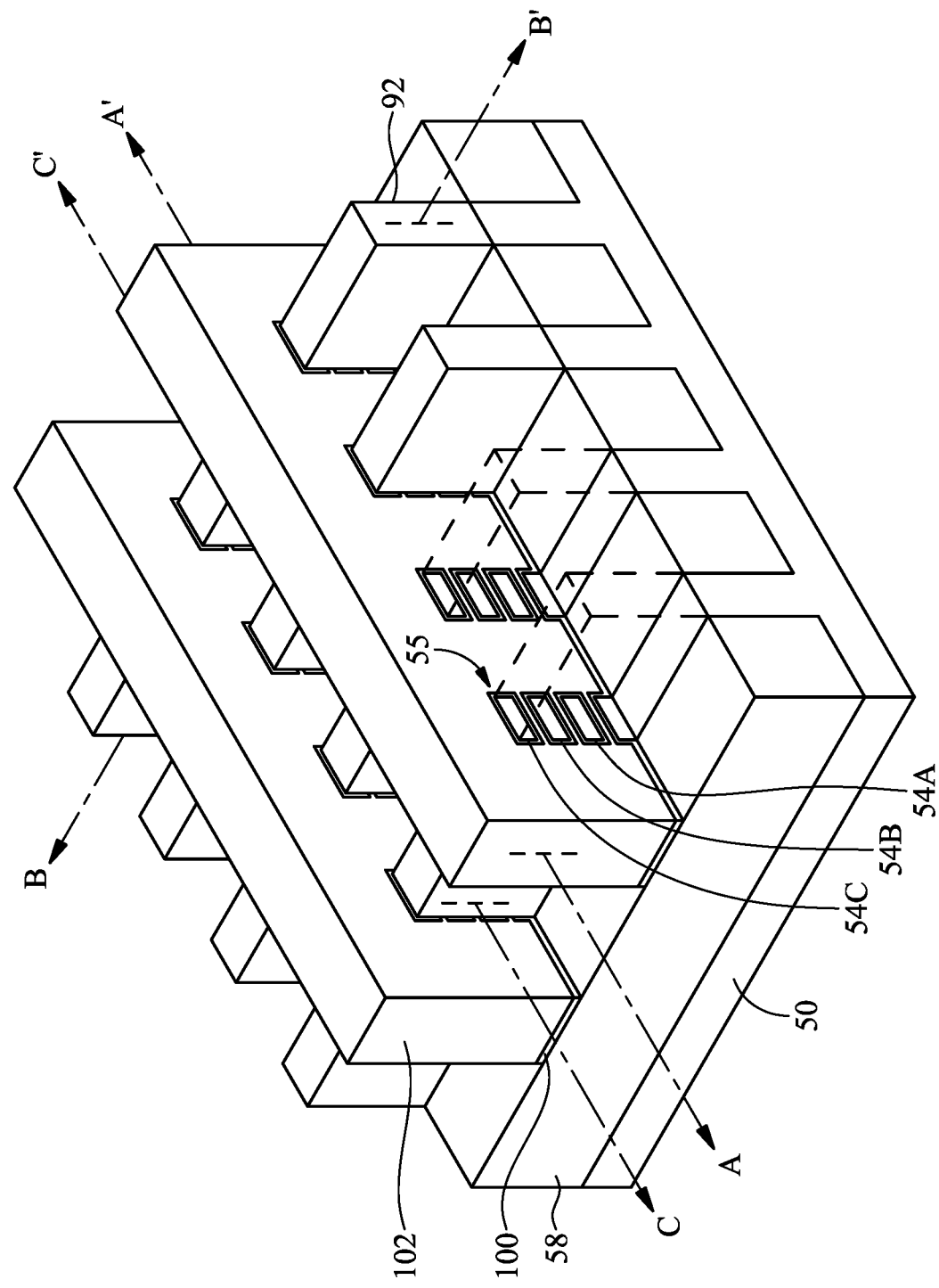
FIGS. 1A and 1B illustrate examples of a semiconductor device including nanosheet field-effect transistors (NSFETs) and a semiconductor device including fin field-effect transistors (FinFETs), respectively, in three-dimensional views, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices and methods of forming the same in which nanostructure (e.g., nanosheet, nanowire, or the like) field-effect transistors (NSFETs) and fin field-effect transistors (FinFETs) are formed on a wafer. In specific embodiments, unique epitaxial structures may be formed in each of NMOS regions including NSFETs, PMOS regions including NSFETs, NMOS regions including FinFETs, and PMOS regions including FinFETs by using masking steps during the etching of recesses and the growth of the epitaxial structures in the recesses. Using the masking steps allows for independent control of the epitaxial structures in the NMOS regions including the NSFETs, the PMOS regions including the NSFETs, the NMOS regions including the FinFETs, and the PMOS regions including the FinFETs, which results in greater design flexibility, reduced device defects, and improved device performance.

Figure 1B:
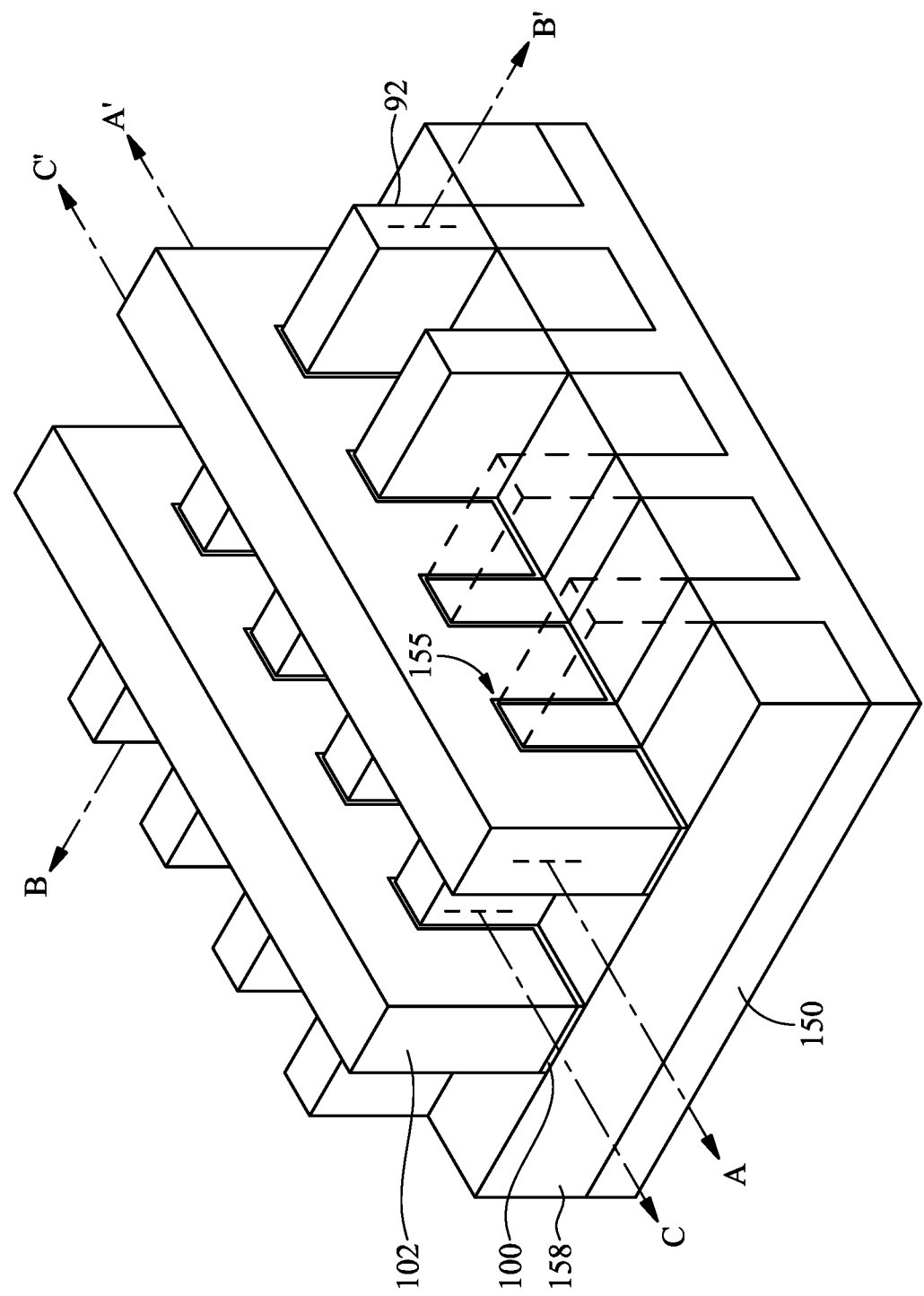

FIGS. 1A and 1B illustrate three-dimensional views of examples of semiconductor devices including NSFETs and FinFETs, respectively, in accordance with some embodiments. As illustrated in FIG. 1A, the NSFETs comprise nanostructures 55 on a substrate 50 (e.g., a semiconductor substrate). The nanostructures 55 include second semiconductor layers 54A-54C, which act as channel regions of the nanostructures 55. Shallow trench isolation (STI) regions 58 are disposed in the substrate 50, and the nanostructures 55 protrude above and from between neighboring STI regions 58. Although the STI regions 58 are described/illustrated as being separate from the substrate 50, as used herein, the term "substrate" may refer to the semiconductor substrate alone or a combination of the semiconductor substrate and the STI regions.

Gate dielectric layers 100 are along top surfaces, sidewalls, and bottom surfaces of the nanostructures 55, such as on top surfaces, sidewalls, and bottom surfaces of each of the second semiconductor layers 54A-54C. Gate electrodes 102 are over the gate dielectric layers 100. Epitaxial source/drain regions 92 are disposed in opposite sides of the nanostructures 55 with respect to the gate dielectric layers 100 and the gate electrodes 102. FIG. 1A further illustrates reference cross-sections that are used in later figures. Cross-section A-A' is along a longitudinal axis of a gate electrode 102 and in a direction, for example, perpendicular to the direction of current flow between the epitaxial source/drain regions 92 of the NSFETs. Cross-section B-B' is perpendicular to cross-section A-A' and is along a longitudinal axis of a nanostructure 55 and in a direction of, for example, the current flow between the epitaxial source/drain regions 92 of the NSFETs. Cross-section C-C' is parallel to cross-section A-A' and extends through the epitaxial source/drain regions 92 of the NSFETs. Subsequent figures refer to these reference cross-sections for clarity.

As illustrated in FIG. 1B, the FinFET comprises a fin 155 on a substrate 150 (e.g., a semiconductor substrate). Shallow trench isolation (STI) regions 158 are disposed in the substrate 150, and the fin 155 protrudes above and from between neighboring STI regions 158. Although the STI regions 158 are described/illustrated as being separate from the substrate 150, as used herein the term "substrate" may be used to refer to just the semiconductor substrate or a semiconductor substrate inclusive of isolation regions. Additionally, although the fin 155 is illustrated as a single, continuous material as the substrate 150, the fin 155 and/or the substrate 150 may comprise a single material or a plurality of materials. In this context, the fin 155 refers to the portion extending between the neighboring STI regions 158.

A gate dielectric layer 100 is along sidewalls and over a top surface of the fin 155, and a gate electrode 102 is over the gate dielectric layer 100. Epitaxial source/drain regions 92 are disposed in opposite sides of the fin 155 with respect to the gate dielectric layer 100 and gate electrode 102. FIG. 1B further illustrates reference cross-sections that are used in later figures. Cross-section A-A' is along a longitudinal axis of a gate electrode 102 and in a direction, for example, perpendicular to the direction of current flow between the epitaxial source/drain regions 92 of the FinFETs. Cross-section B-B' is perpendicular to cross-section A-A' and is along a longitudinal axis of a fin 155 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of NSFETs and FinFETs formed using gate-last processes. In other embodiments, a gate-first process may be used. Also, some embodiments contemplate aspects used in planar devices, such as planar FETs.

FIGS. 2A-39B are cross-sectional views of intermediate stages in the manufacturing of semiconductor devices including NSFETs and FinFETs, in accordance with some embodiments. FIGS. 2A, 3A, 4A, 5A, 6A, 23A, 24A, 25A, 26A, 27A, and 28A illustrate reference cross-section A-A' illustrated in FIG. 1A. FIGS. 2B, 3B, 4B, 5B, 6C, 23C, 24C, 25C, 26C, 27C, and 28C illustrate reference cross-section A-A' illustrated in FIG. 1B. FIGS. 6B, 7B, 8B, 9B, 10, 11, 14B, 15B, 15C, 16B, 17B, 18, 19, 22B, 23B, 24B, 25B, 26B, 27B, 28B, 29B, 33B, 36B, 37B, and 38B illustrate reference cross-section B-B' illustrated in FIG. 1A. FIGS. 6D, 7D, 12C, 13B, 14D, 15E, 15F, 20C, 21B, 22D, 23D, 24D, 25D, 26D, 27D, 28D, 31C, 35C, and 39B illustrate reference cross-section B-B' illustrated in FIG. 1B. FIGS. 7A, 8A, 9A, 12A, 14A, 15A, 16A, 17A, 20A, 22A, 29A, 30A, 31A, 32A, 33A, 34A, 35A, 36A, 37A, and 38A illustrate reference cross-section C-C' illustrated in FIG. 1A. FIGS. 7C, 8C, 12B, 13A, 14C, 15D, 16C, 20B, 21A, 22C, 39C, 30B, 31B, 32B, 33C, 34B, 35B, and 39A illustrate reference cross-section C-C' illustrated in FIG. 1B.

Figure 2A:
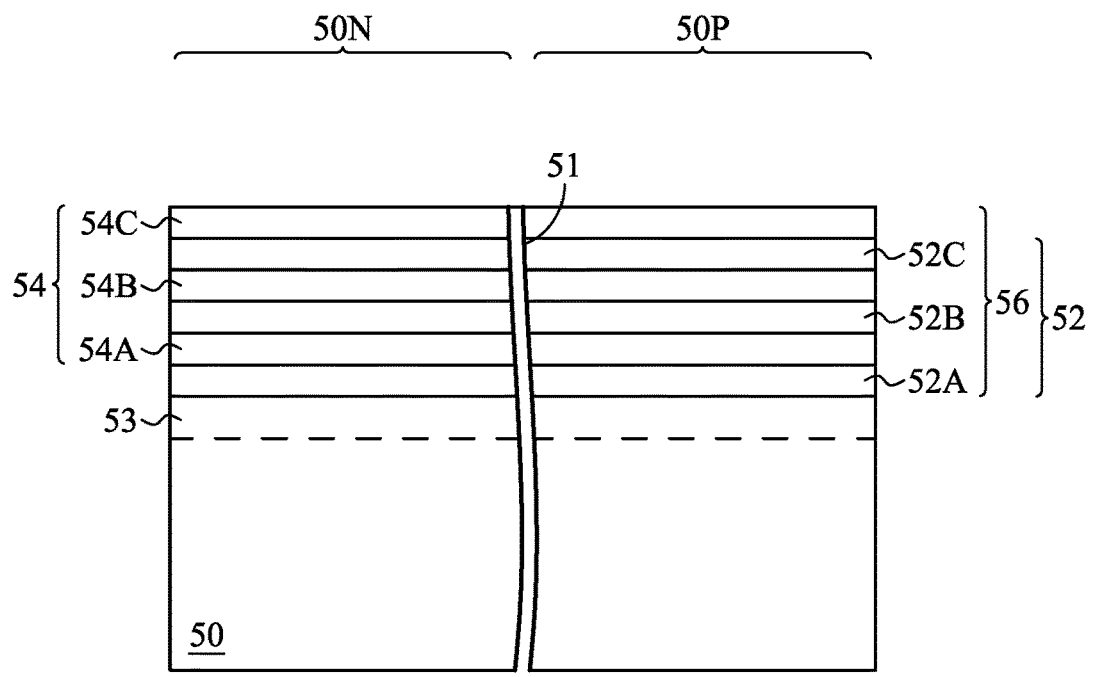
FIGS. 2A, 2B, 3A, 3B, 4A, 4B, 5A, 5B, 6A-6D, 7A-7D, 8A-8C, 9A, 9B, 10, 11, 12A-12C, 13A, 13B, 14A-14D, 15A-15F, 16A-16C, 17A, 17B, 18, 19, 20A-20C, 21A, 21B, 22A-22D, 23A-23D, 24A-24D, 25A-25D, 26A-26D, 27A-27D, 28A-28D, 29A-29C, 30A, 30B, 31A-31C, 32A, 32B, 33A-33C, 34A, 34B, 35A-35C, 36A, 36B, 37A, 37B, 38A, 38B, 39A, and 39B are cross-sectional views of intermediate stages in the manufacturing of semiconductor devices, in accordance with some embodiments.

In FIG. 2A, a substrate 50 is provided for forming NSFETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type NSFETs. The region 50P can be for forming p-type devices, such as PMOS transistors, e.g., p-type NSFETs. The region 50N may be physically separated from the region 50P (as illustrated by divider 51), and any number of device features (e.g., other active devices, doped regions, isolation structures, etc.) may be disposed between the region 50N and the region 50P.

The substrate 50 may be lightly doped with a p-type or an n-type impurity. An anti-punch-through (APT) implantation may be performed on an upper portion of the substrate 50 to form an APT region 53. During the APT implantation, dopants may be implanted in the region 50N and the region 50P. The dopants may have a conductivity type opposite a conductivity type of source/drain regions (such as the first epitaxial source/drain regions 92 and the third epitaxial source/drain regions 292, discussed below with respect to FIGS. 14A, 14B, 22A, and 22B) to be formed in each of the region 50N and the region 50P. The APT region 53 may extend under the subsequently formed source/drain regions in the resulting NSFETs, which will be formed in subsequent processes. The APT region 53 may be used to reduce the leakage from the source/drain regions to the substrate 50. In some embodiments, the doping concentration in APT region 53 may be from about $1\times10^{18}$ atoms/cm$^3$ to about $1\times10^{19}$ atoms/cm$^3$, such as about $5.5\times10^{18}$ atoms/cm$^3$. For simplicity and legibility, the APT region 53 is not illustrated in subsequent drawings.

Further in FIG. 2A, a multi-layer stack 56 is formed over the substrate 50. The multi-layer stack 56 includes alternating first semiconductor layers 52 and second semiconductor layers 54 of different semiconductor materials. The first semiconductor layers 52 may be formed of first semiconductor materials, which may include, for example, silicon germanium (SiGe) or the like. The second semiconductor layers 54 may be formed of second semiconductor materials, which may include, for example, silicon (Si), silicon carbon (SiC), or the like. In other embodiments, the first semiconductor layers 52 may be formed of the second semiconductor materials and the second semiconductor layers 54 may be formed of the first semiconductor materials. For purposes of illustration, the multi-layer stack 56 includes three of the first semiconductor layers 52 (e.g., first semiconductor layers 52A-52C) and three of the second semiconductor layers 54 (e.g., second semiconductor layers 54A-54C). In other embodiments, the multi-layer stack 56 may include any number of the first semiconductor layers 52 and the second semiconductor layers 54. Each of the layers of the multi-layer stack 56 may be epitaxially grown using a process such as chemical vapor deposition (CVD), atomic layer deposition (ALD), vapor phase epitaxy (VPE), molecular beam epitaxy (MBE), or the like.

For purposes of illustration, the second semiconductor layers 54 will be described as forming channel regions in completed NSFET devices. The first semiconductor layers 52 may be sacrificial layers, which may be subsequently removed. Each of the first semiconductor layers 52A-52C and the second semiconductor layers 54A-54C may have a thickness from about 5 nm to about 8 nm, such as about 6 nm. Nevertheless, in some embodiments the second semiconductor layers 54A-54C may form channel regions in completed NSFET devices, while the first semiconductor layers 52A-52D may be sacrificial layers.

Figure 2B:
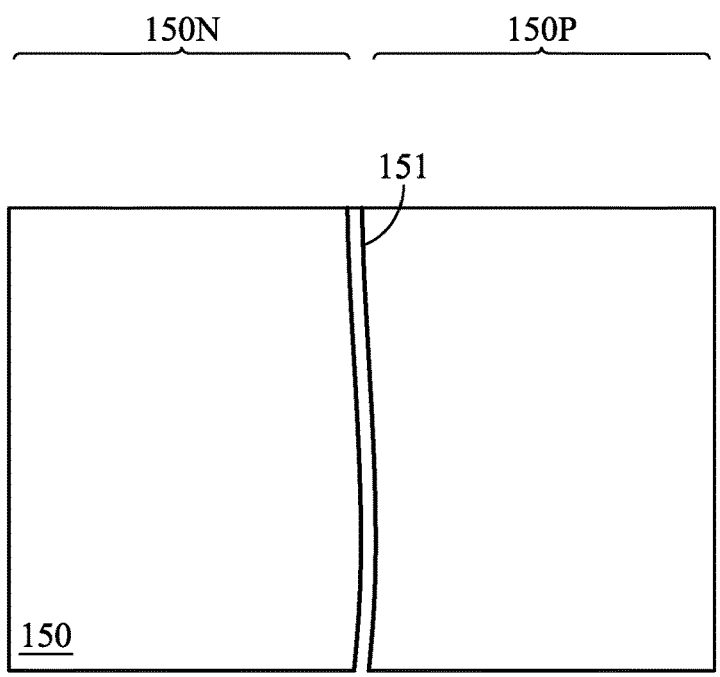

In FIG. 2B, a substrate 150 is provided. The substrate 150 may be a semiconductor substrate, such as a bulk semiconductor, a semiconductor-on-insulator (SOI) substrate, or the like, which may be doped (e.g., with a p-type or an n-type dopant) or undoped. The substrate 150 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 150 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 150 has a region 150N and a region 150P. The region 150N can be for forming n-type devices, such as NMOS transistors, e.g., n-type FinFETs. The region 150P can be for forming p-type devices, such as PMOS transistors, e.g., p-type FinFETs. The region 150N may be physically separated from the region 150P (as illustrated by divider 151), and any number of device features (e.g., other active devices, doped regions, isolation structures, etc.) may be disposed between the region 150N and the region 150P.

Figure 3A:
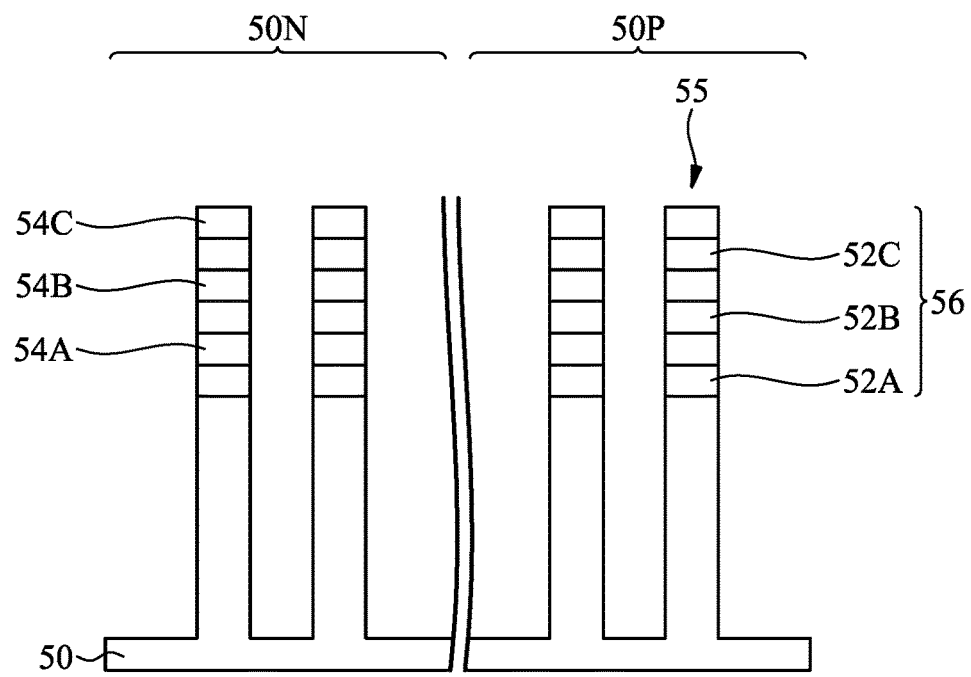
Figure 3B:
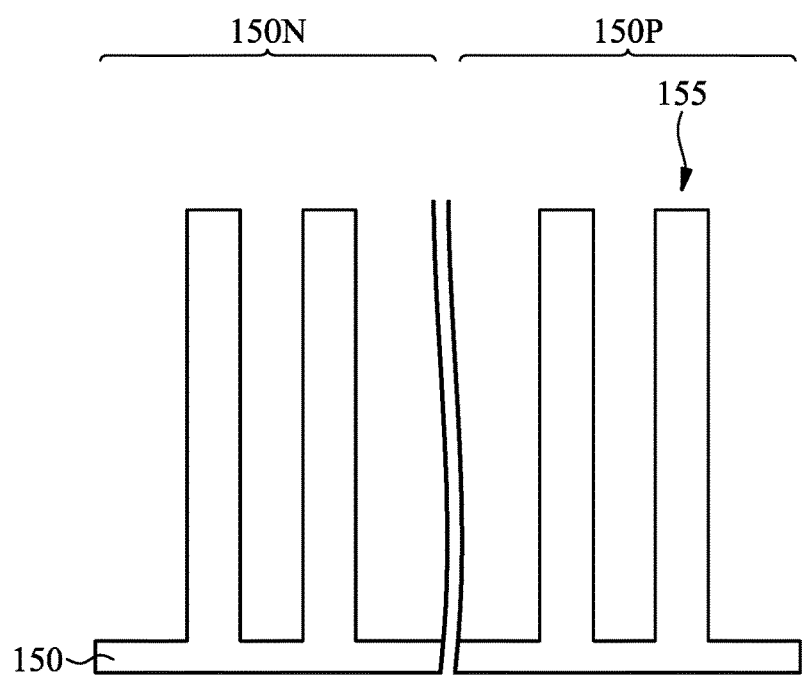

In FIGS. 3A and 3B, nanostructures 55 are formed in the multi-layer stack 56 and the substrate 50 and fins 155 are formed in the substrate 150. In some embodiments, the nanostructures 55 may be formed by etching trenches in the multi-layer stack 56 and the substrate 50. The fins 155 may be formed in the substrate 150 by etching trenches in the substrate 150. The etching may be any acceptable etch process, such as a reactive ion etch (RIE), neutral beam etch (NBE), the like, or a combination thereof. The etching may be anisotropic.

The nanostructures 55 and the fins 155 may be patterned by any suitable method. For example, the nanostructures 55/fins 155 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 55/fins 155. In some embodiments, a mask (or other layer) may remain on the nanostructures 55/fins 155 after patterning the nanostructures 55/fins 155.

Figure 4A:
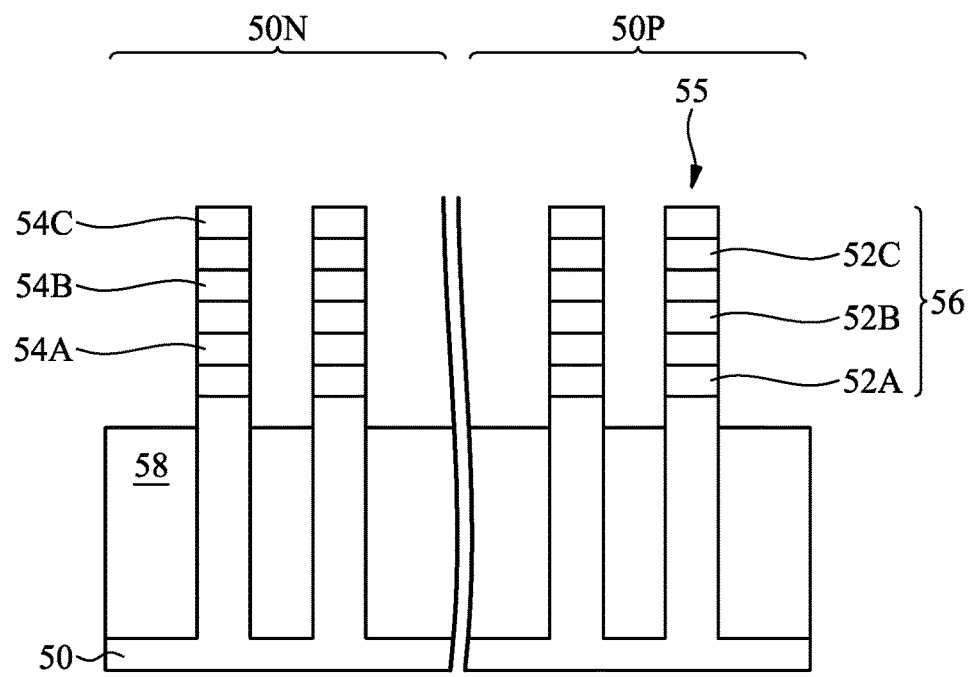
Figure 4B:
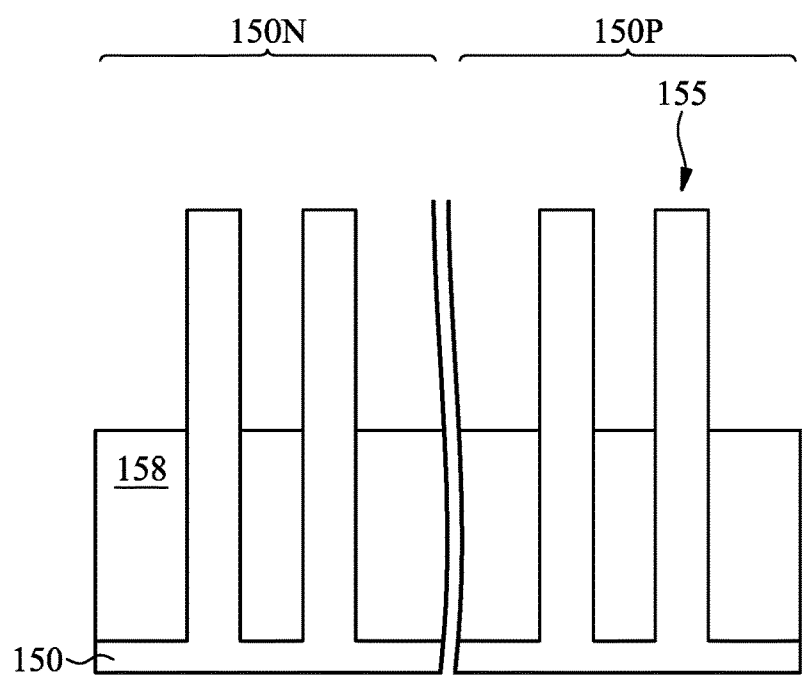

In FIGS. 4A and 4B, shallow trench isolation (STI) regions 58 and 158 are formed adjacent the nanostructures 55 and the fins 155, respectively. The STI regions 58/158 may be formed by forming an insulation material (not separately illustrated) over the substrates 50/150 and between neighboring nanostructures 55 and fins 155. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55 and the fins 155. The insulation material may comprise a single layer or may utilize multiple layers. For example, in some embodiments a liner (not separately illustrated) may first be formed along surfaces of the substrates 50/150, the nanostructures 55, and the fins 155. Thereafter, a fill material, such as those discussed above may be formed over the liner.

A removal process is then applied to the insulation material to remove excess insulation material over the nanostructures 55 and the fins 155. In some embodiments, a planarization process such as a chemical mechanical polish (CMP), an etch-back process, combinations thereof, or the like may be utilized. The planarization process may planarize the insulation material, the nanostructures 55, and the fins 155. The planarization process exposes the nanostructures 55 and the fins 155 such that top surfaces of the nanostructures 55 and the fins 155 and the insulation material are level after the planarization process is complete.

The insulation material is then recessed to form the STI regions 58/158 as illustrated in FIGS. 4A and 4B. The insulation material is recessed such that upper portions of the nanostructures 55 the fins 155 protrude from between neighboring STI regions 58/158. Further, the top surfaces of the STI regions 58/158 may have flat surfaces as illustrated, convex surfaces, concave surfaces (such as dishing), or a combination thereof. The top surfaces of the STI regions 58/158 may be formed flat, convex, and/or concave by an appropriate etch. The STI regions 58/158 may be recessed using an acceptable etching process, such as one that is selective to the material of the insulation material (e.g., etches the material of the insulation material at a faster rate than the material of the nanostructures 55 and the fins 155). For example, an oxide removal using, for example, dilute hydrofluoric (dHF) acid may be used.

The process described with respect to FIGS. 2A through 4B is just one example of how the nanostructures 55 and the fins 155 may be formed. In some embodiments, the nanostructures 55 and the fins 155 may be formed by epitaxial growth processes. For example, dielectric layers may be formed over top surfaces of the substrates 50/150, and trenches may be etched through the dielectric layers to expose the underlying substrates 50/150. Epitaxial structures may be epitaxially grown in the trenches, and the dielectric layers may be recessed such that the epitaxial structures protrude from the dielectric layer to form the nanostructures 55 and the fins 155. In the nanostructures, the epitaxial structures may comprise alternating layers of the first semiconductor materials and the second semiconductor materials. In the fins 155, the epitaxial structures may comprise homoepitaxial structures or heteroepitaxial structures. The dielectric layers may be subsequently recessed such that the nanostructures 55 and the fins 155 protrude from the dielectric layer. In embodiments where the nanostructures 55 and the fins 155 are epitaxially grown, the epitaxially grown materials may be in situ doped during growth, which may obviate prior and subsequent implantations, although in situ and implantation doping may be used together.

Still further, it may be advantageous to epitaxially grow material in regions 50N/150N (e.g., the NMOS regions) different from the materials in regions 50P/150P (e.g., the PMOS regions). In various embodiments, upper portions of the fins 155 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIGS. 4A and 4B, appropriate wells (not separately illustrated) may be formed in the nanostructures 55, the fins 155, and/or the substrates 50/150. In some embodiments, P wells may be formed in the regions 50N/150N, and N wells may be formed in the regions 50P/150P. In further embodiments, P wells or N wells may be formed in each of the regions 50N/150N and the regions 50P/150P.

In embodiments including different well types, different implant steps for the regions 50N/150N and the regions 50P/150P may be achieved using a photoresist or other masks (not separately illustrated). For example, a photoresist may be formed over the nanostructures 55, the fins 155, and the STI regions 58/158 in the regions 50N/150N. The photoresist is patterned to expose the region 50P/150P of the substrates 50/150. The photoresist can be formed by using a spin-on technique and can be patterned using acceptable photolithography techniques. Once the photoresist is patterned, an n-type impurity implant is performed in the regions 50P/150P, and the photoresist may act as a mask to substantially prevent n-type impurities from being implanted into the regions 50N/150N. The n-type impurities may be phosphorus, arsenic, antimony, or the like implanted in the region to a concentration of equal to or less than $1\times10^{18}$ atoms/$cm^3$, such as from about $1\times10^{16}$ atoms/$cm^3$ to about $1\times10^{18}$ atoms/$cm^3$, or about $5.05\times10^{17}$ atoms/$cm^3$. After the implant, the photoresist is removed, such as by an acceptable ashing process.

Following the implanting of the regions 50P/150P, a photoresist is formed over the nanostructures 55, the fins 155, and the STI regions 58/158 in the regions 50P/150P. The photoresist is patterned to expose the regions 50N/150N of the substrates 50/150. The photoresist can be formed by using a spin-on technique and can be patterned using acceptable photolithography techniques. Once the photoresist is patterned, a p-type impurity implant may be performed in the regions 50N/150N, and the photoresist may act as a mask to substantially prevent p-type impurities from being implanted into the regions 50P/150P. The p-type impurities may be boron, boron fluoride, indium, or the like implanted in the region to a concentration of equal to or less than $1\times10^{18}$ atoms/$cm^3$, such as from about $1\times10^{16}$ atoms/$cm^3$ to about $1\times10^{18}$ atoms/$cm^3$, or about $5.05\times10^{17}$ atoms/$cm^3$. After the implant, the photoresist may be removed, such as by an acceptable ashing process.

After the implants of the regions 50N/150N and the regions 50P/150P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5A:
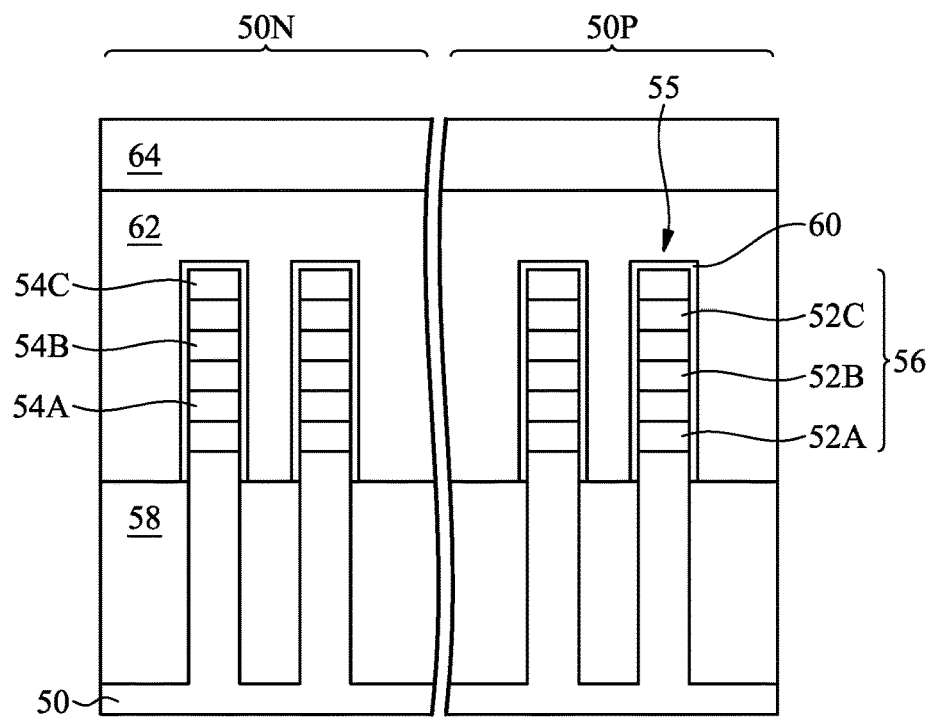
Figure 5B:
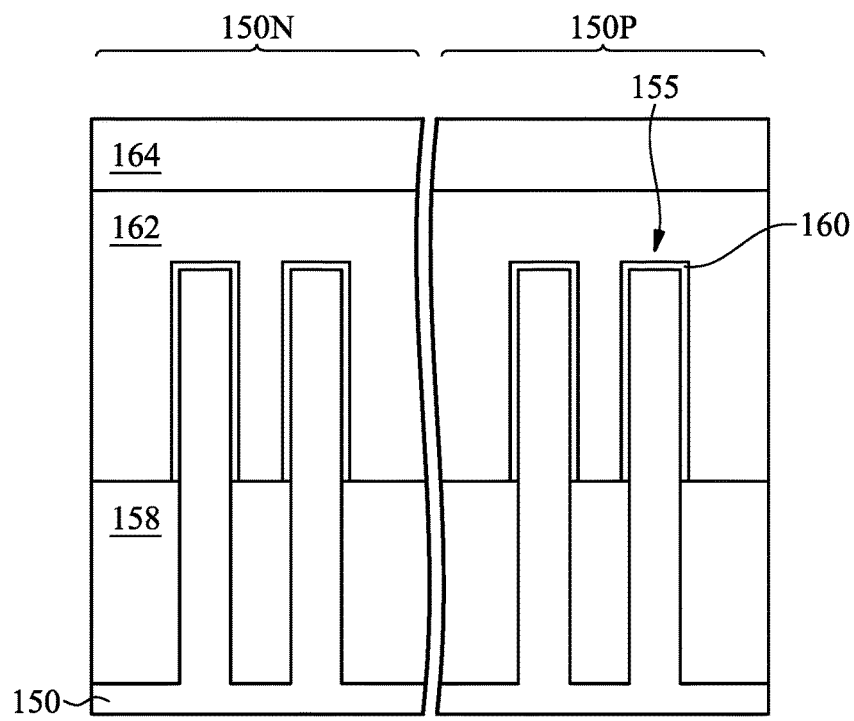

In FIGS. 5A and 5B, dummy dielectric layers 60/160 are formed on the nanostructures 55 and the fins 155. The dummy dielectric layers 60/160 may be, for example, silicon oxide, silicon nitride, a combination thereof, or the like, and may be deposited or thermally grown according to acceptable techniques. Dummy gate layers 62/162 are formed over the dummy dielectric layers 60/160, and mask layers 64/164 are formed over the dummy gate layers 62/162. The dummy gate layers 62/162 may be deposited over the dummy dielectric layers 60/160 and then planarized by a process such as CMP. The mask layers 64/164 may be deposited over the dummy gate layers 62/162. The dummy gate layers 62/162 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layers 62/162 may be deposited by physical vapor deposition (PVD), CVD, sputter deposition, or other techniques known and used in the art for depositing the selected material. The dummy gate layers 62/162 may be made of other materials that have a high etching selectivity from the etching of isolation regions. The mask layers 64/164 may include, for example, silicon nitride, silicon oxynitride, or the like. In this example, single dummy gate layers 62/162 and single mask layers 64/164 are formed across the regions 50N/150N and the regions 50P/150P. It is noted that the dummy dielectric layers 60/160 are shown covering only the nanostructures 55/fins 155 for illustrative purposes only. In some embodiments, the dummy dielectric layers 60/160 may be deposited such that the dummy dielectric layers 60/160 covers the STI regions 58/158, extending between the dummy gate layers 62/162 and the STI regions 58/158.

In FIGS. 6A-6D, the mask layers 64/164 (see FIGS. 5A and 5B) may be patterned using acceptable photolithography and etching techniques to form masks 74/174. An acceptable etching technique may be used to transfer the pattern of the masks 74/174 to the dummy gate layers 62/162 to form dummy gates 72/172. In some embodiments, the pattern of the masks 74/174 may also be transferred to the dummy dielectric layers 60/160. The dummy gates 172 cover respective channel regions 168 of the fins 155. In an embodiment, the channel regions may be formed of the second semiconductor materials. The pattern of the masks 74/174 may be used to physically separate each of the dummy gates 72/172 from adjacent dummy gates 72/172. The dummy gates 72/172 may also have a lengthwise direction substantially perpendicular to the lengthwise direction of respective nanostructures 55 and fins 155.

Figure 6A:
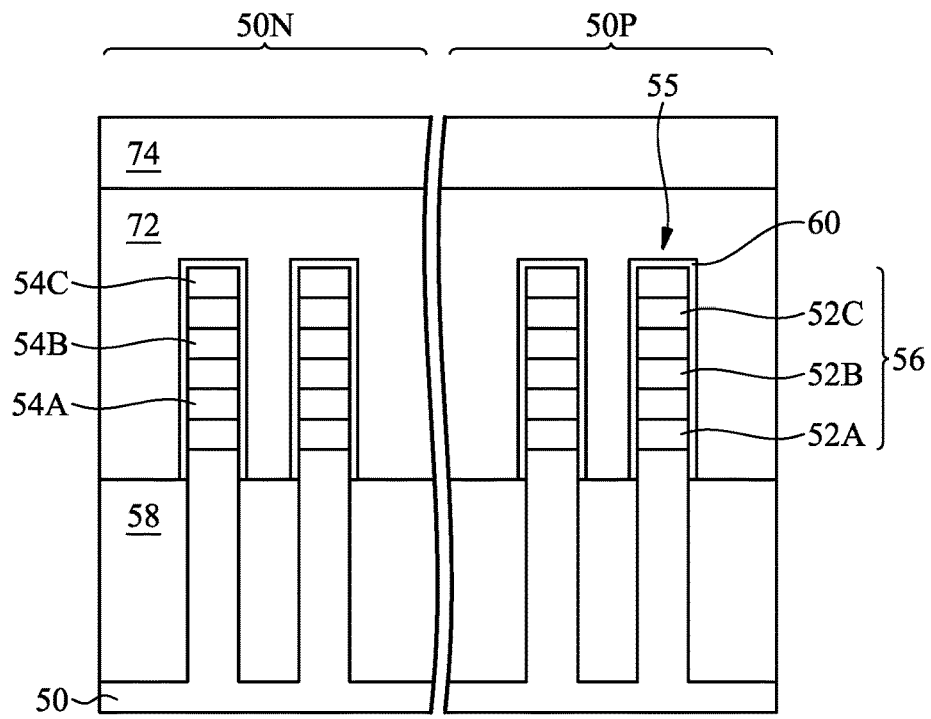
Figure 6B:
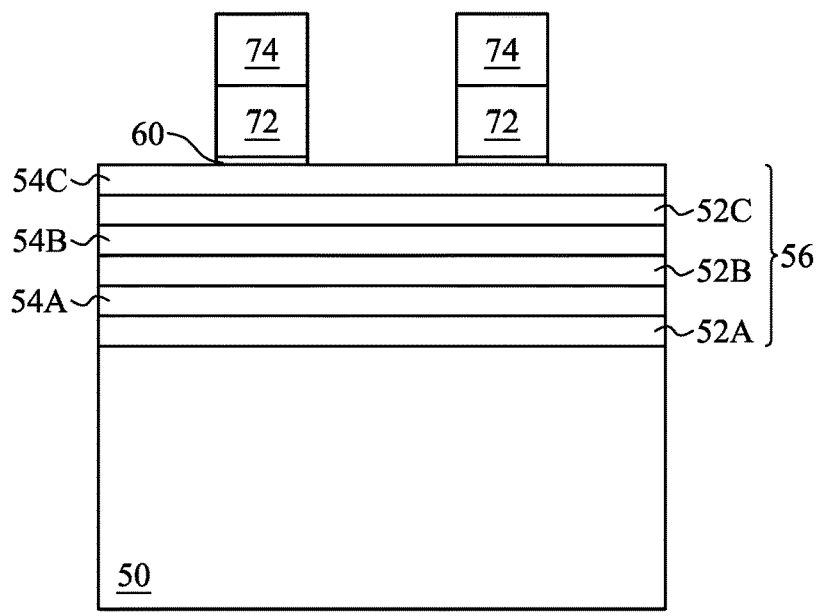
Figure 6C:
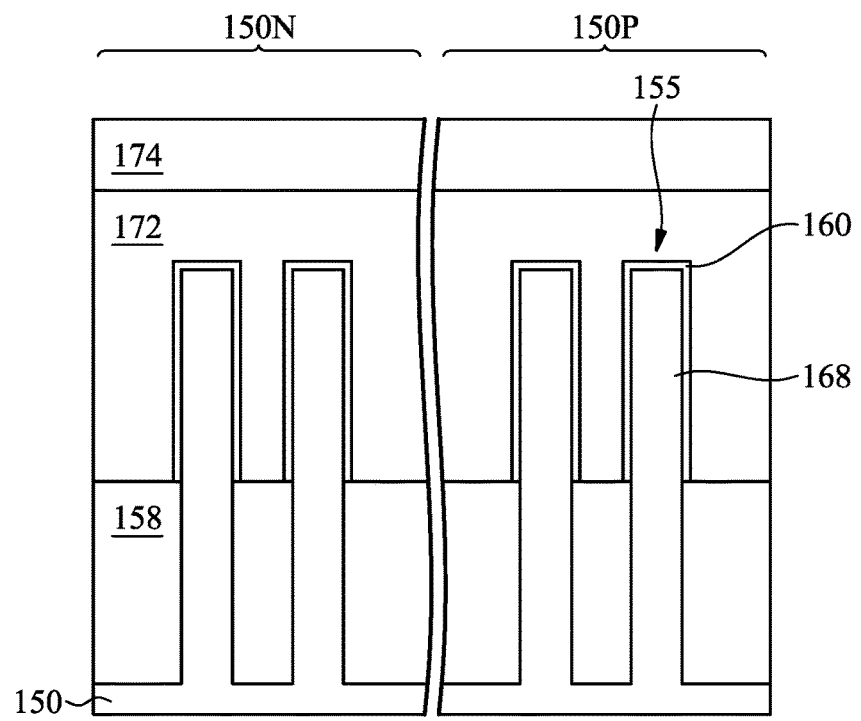
Figure 6D:
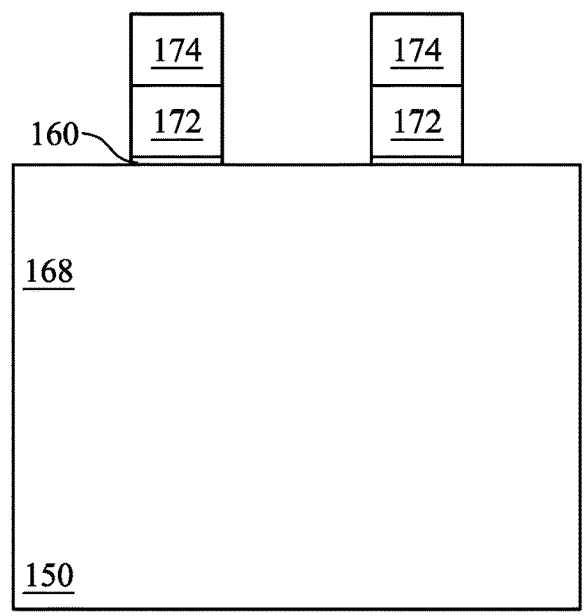
Figure 7A:
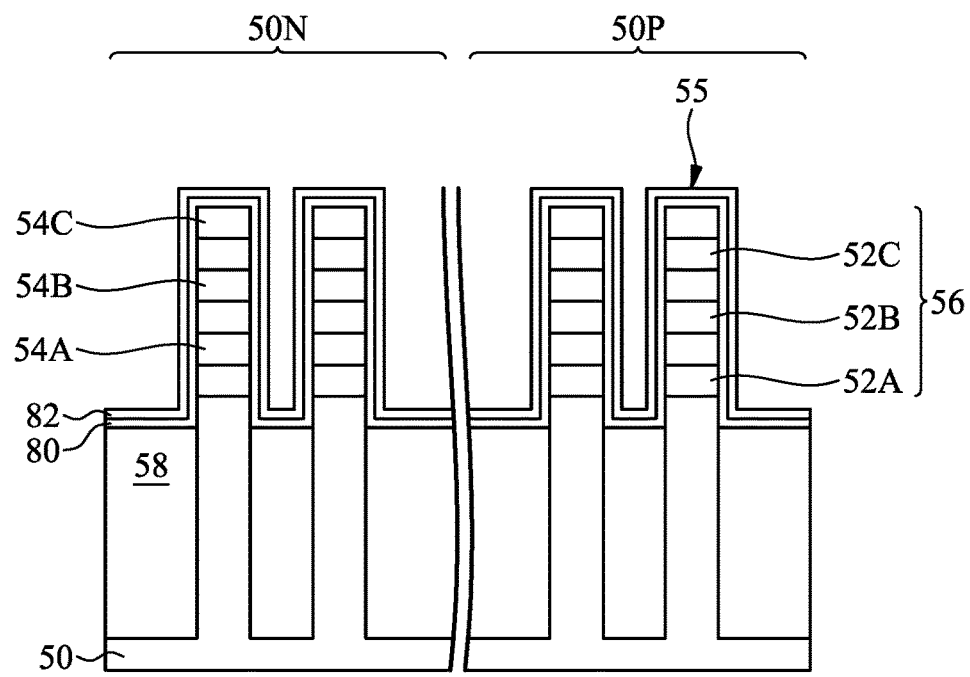
Figure 7B:
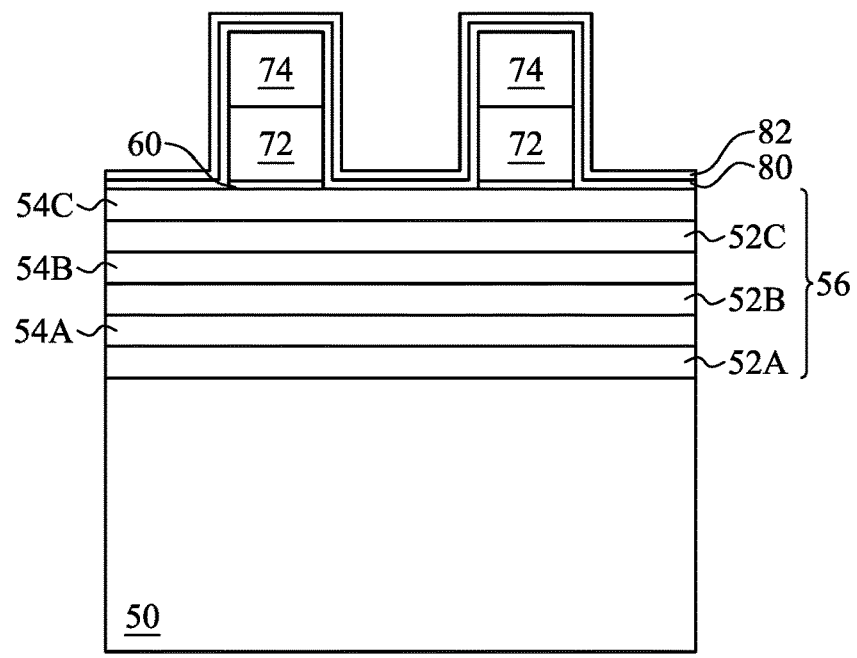
Figure 7C:
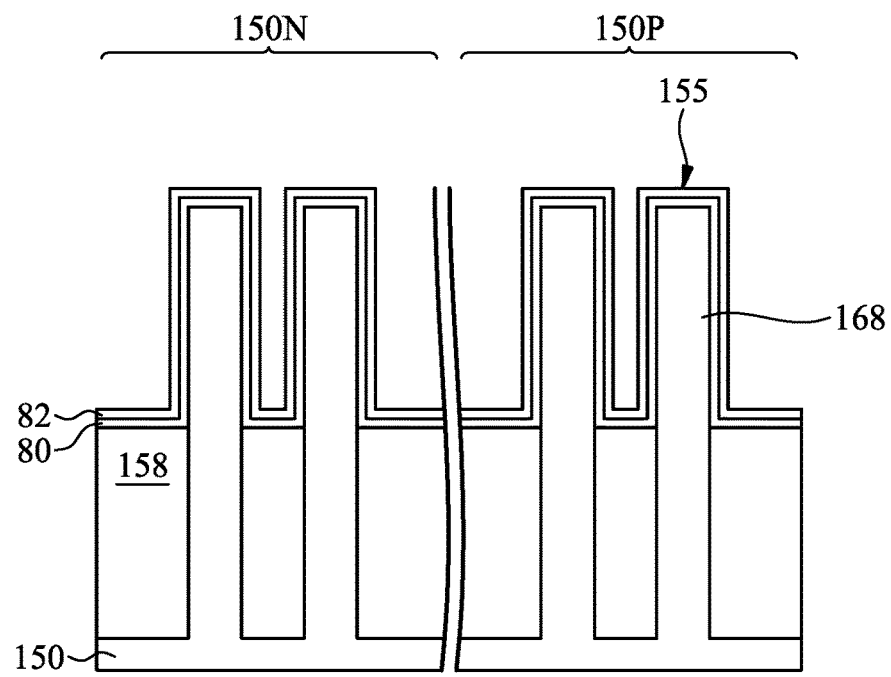
Figure 7D:
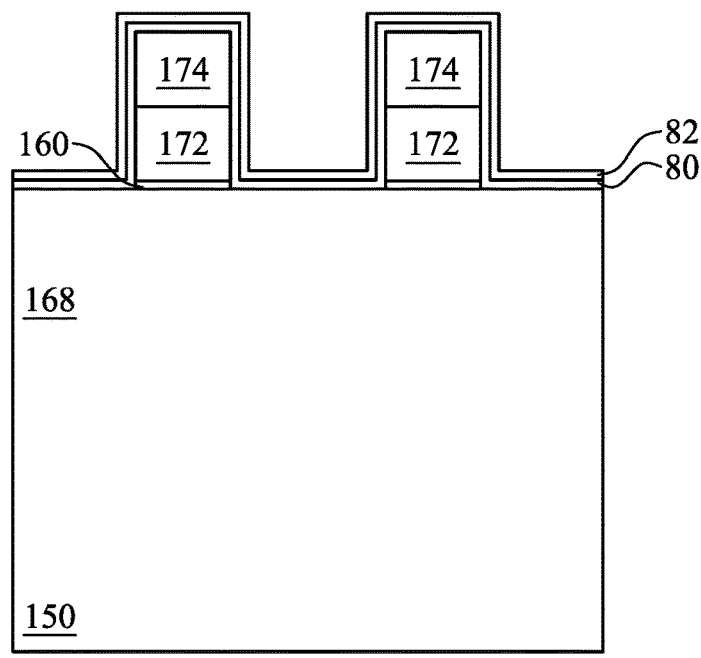

In FIGS. 7A-7D, a first spacer layer 80 and a second spacer layer 82 are formed over the structures illustrated in FIGS. 6A-6D. In FIGS. 7A and 7B, the first spacer layer 80 is formed on top surfaces of the STI regions 58, on top surfaces and sidewalls of the nanostructures 55 and the masks 74, and on sidewalls of the dummy gates 72 and the dummy dielectric layers 60 and the second spacer layer 82 is deposited over the first spacer layer 80. In FIGS. 7C and 7D, the first spacer layer 80 is formed on top surfaces of the STI regions 158, on top surfaces and sidewalls of the fins 155 and the masks 174, and on sidewalls of the dummy gates 172 and the dummy dielectric layers 160 and the second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 8A:
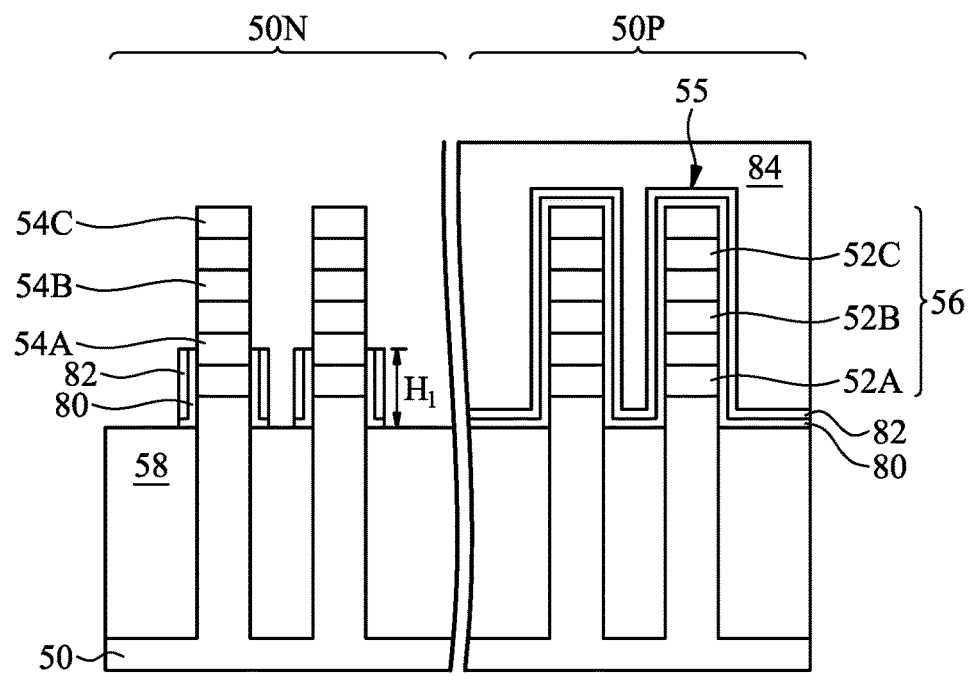
Figure 8B:
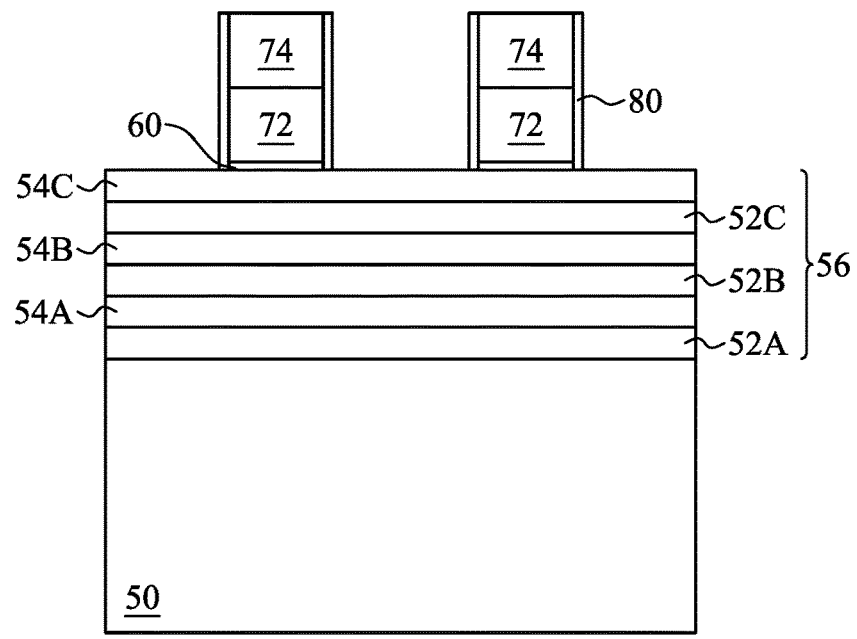
Figure 8C:
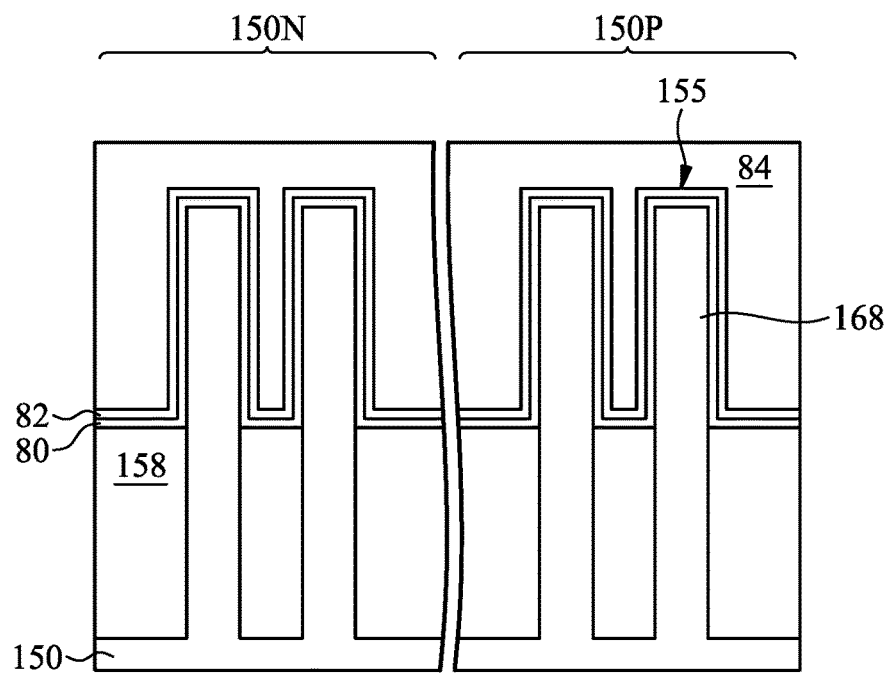

In FIGS. 8A-8C, a patterned mask, such as a first patterned photoresist 84 is formed over the regions 50P/150N/150P and the first spacer layer 80 and the second spacer layer 82 are etched in the region 50N. The first patterned photoresist 84 may be formed by depositing a photoresist layer over the structure illustrated in FIGS. 7A-7D using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the first patterned photoresist 84. The first spacer layer 80 and the second spacer layer 82 are then etched in the region 50N using a suitable etching process, such as isotropic etching (e.g., a wet etch process), anisotropic etching (e.g., a dry etch process), or the like. As illustrated in FIG. 8A, portions of the first spacer layer 80 and the second spacer layer 82 remaining on sidewalls of the nanostructures 55 in the region 50N may have a height $H_1$ from about 5 nm to about 15 nm, such as about 10 nm. As illustrated in FIG. 8B, the second spacer layer 82 may be removed from over the first spacer layer 80 adjacent the masks 74, the dummy gates 72, and the dummy dielectric layers 60.

After the first spacer layer 80 is etched, implants for lightly doped source/drain (LDD) regions (not separately illustrated) may be performed in the region 50N. Appropriate type impurities (e.g., n-type) may be implanted into the nanostructures 55 in the region 50N exposed by the first patterned photoresist 84. The n-type impurities may be any of the n-type impurities previously discussed. The lightly doped source/drain regions may have a concentration of impurities of from about $1\times10^{15}$ atoms/cm$^3$ to about $1\times10^{19}$ atoms/cm$^3$, such as about $5\times10^{18}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacer layer 8o may be etched prior to forming the second spacer layer 82, additional spacers may be formed and removed, and/or the like). Furthermore, the n-type and p-type devices may be formed using a different structures and steps.

Figure 9A:
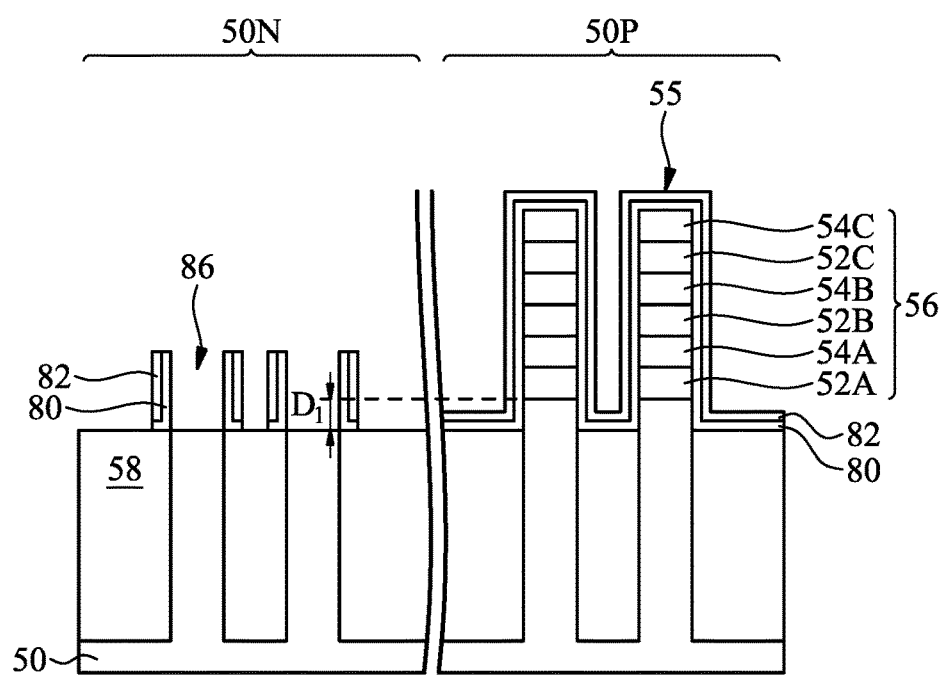
Figure 9B:
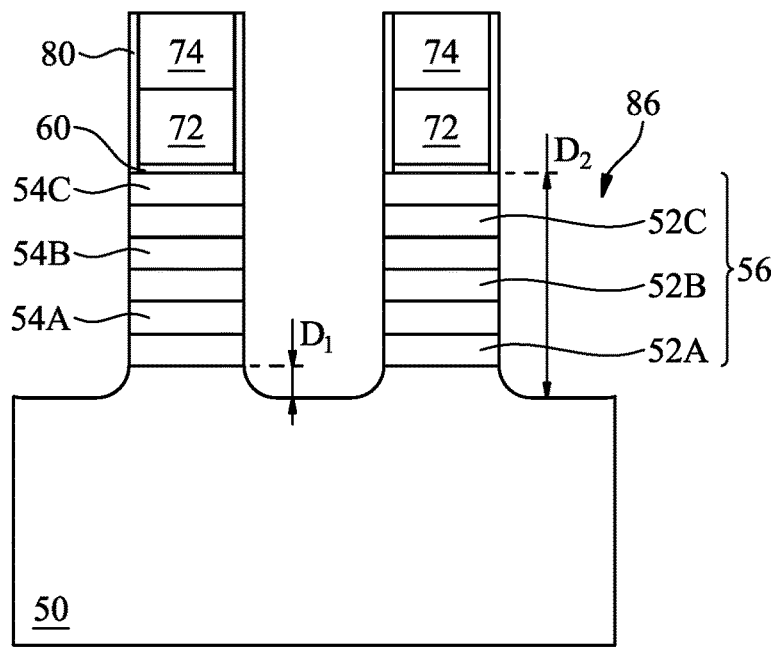

In FIGS. 9A and 9B, first recesses 86 are formed in the nanostructures 55 in the region 50N and the first patterned photoresist 84 is removed. The first patterned photoresist 84 may be removed by any acceptable process, such as an ashing process, a stripping process, the like, or a combination thereof and may be removed before or after forming the first recesses 86. The first recesses 86 in the region 50N may extend through the first semiconductor layers 52A-52C and the second semiconductor layers 54A-54C, and into the substrate 50. The first recesses 86 may extend a depth $D_1$ below a bottom surface of the first semiconductor layer 52A and into the substrate 50 from about 5 nm to about 20 nm, such as about 12.5 nm. The first recesses 86 may extend a depth $D_2$ below top surfaces of the second semiconductor layer 54C from about 51 nm to about 71 nm, such as about 61 nm. In further embodiments, the depth $D_2$ of the first recesses 86 may be from about 35 nm to about 45 nm, such as about 40 nm. As illustrated in FIG. 9A, top surfaces of the STI regions 58 may be level with a top surface of the substrate 50. The first recesses 86 may be formed by etching the nanostructures 55 using anisotropic etching processes, such as RIE, NBE, or the like. The first spacer layer 80, the second spacer layer 82, the masks 74, and/or the first patterned photoresist 84 mask the regions 50P/150N/150P and portions of the nanostructure 55 in the region 50N during the etching processes used to form the first recesses 86. A single etch process may be used to etch each layer of the multi-layer stack 56. In other embodiments, multiple etch processes may be used to etch the layers of the multi-layer stack 56. Timed etch processes may be used to stop the etching of the first recesses 86 after the first recesses 86 reach a desired depth.

Figure 10:
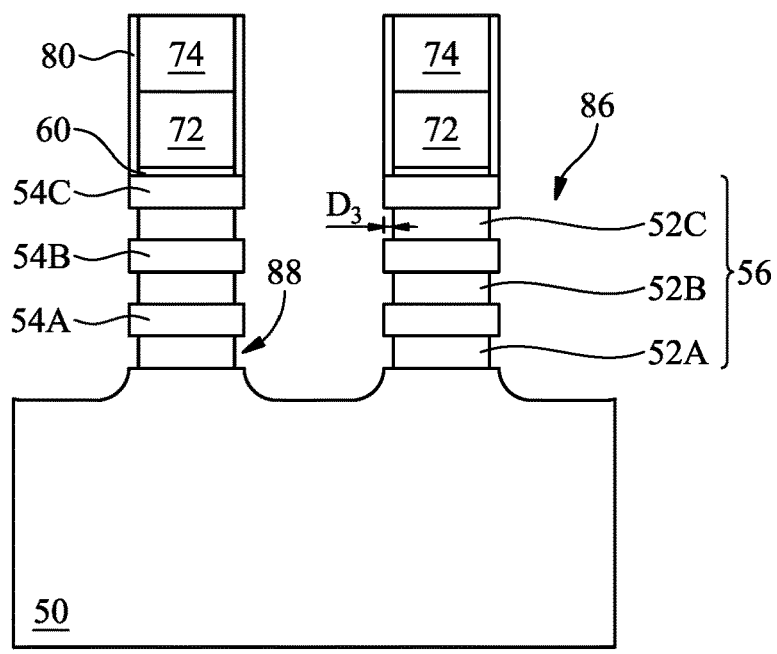

In FIG. 10, portions of the sidewalls of the layers of the multi-layer stack 56 formed of the second semiconductor materials (e.g., the first semiconductor layers 52A-52C) exposed by the first recesses 86 in the region 50N are etched to form sidewall recesses 88. The sidewalls may be etched using isotropic etching processes, such as wet etching or the like. The sidewall recesses 88 may be etched to have a depth $D_3$ from about 6 nm to about 10 nm, such as about 7.5 nm. The etchants used to etch the first semiconductor layers 52A-52C may be selective to the second semiconductor materials such that the second semiconductor layers 54A-54C and the substrate 50 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide ($NH_4OH$), or the like may be used to etch sidewalls of the multi-layer stack 56 in the region 50N. In further embodiments, the layers of the multi-layer stack 56 may be etched using a dry etching process. Hydrogen fluoride, another fluorine-based gas, or the like may be used to etch sidewalls of the multi-layer stack 56 in the region 50N.

Figure 11:
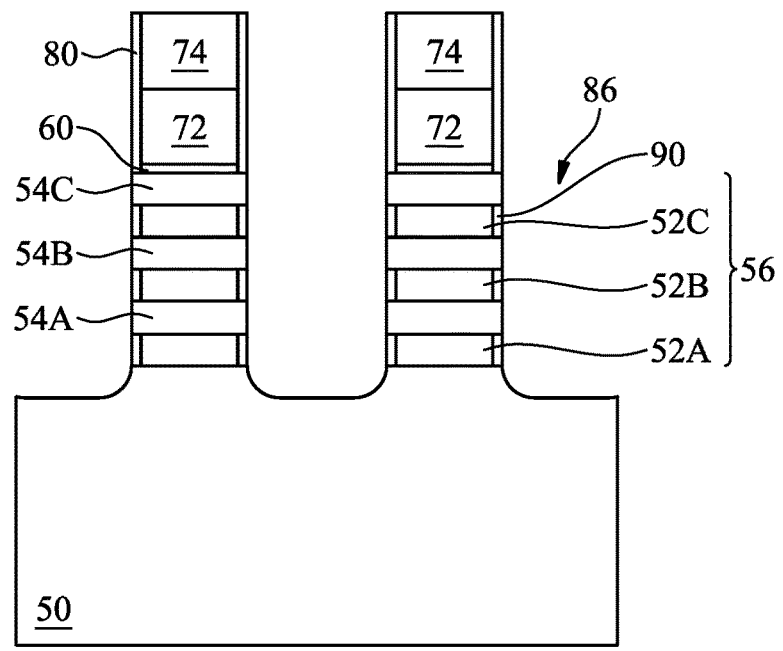

In FIG. 11, first inner spacers 90 are formed in the sidewall recesses 88. The first inner spacers 90 may be formed by depositing an inner spacer layer (not separately illustrated) over the structures illustrated in FIG. 10. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be etched to form the first inner spacers 90. The inner spacer layer may be etched by an anisotropic etching process, such as RIE, NBE, or the like. The first inner spacers 90 may be used to prevent damage to subsequently formed source/drain regions (such as the first epitaxial source/drain regions 92, discussed below with respect to FIGS. 14A and 14B) by subsequent etching processes.

Figure 12A:
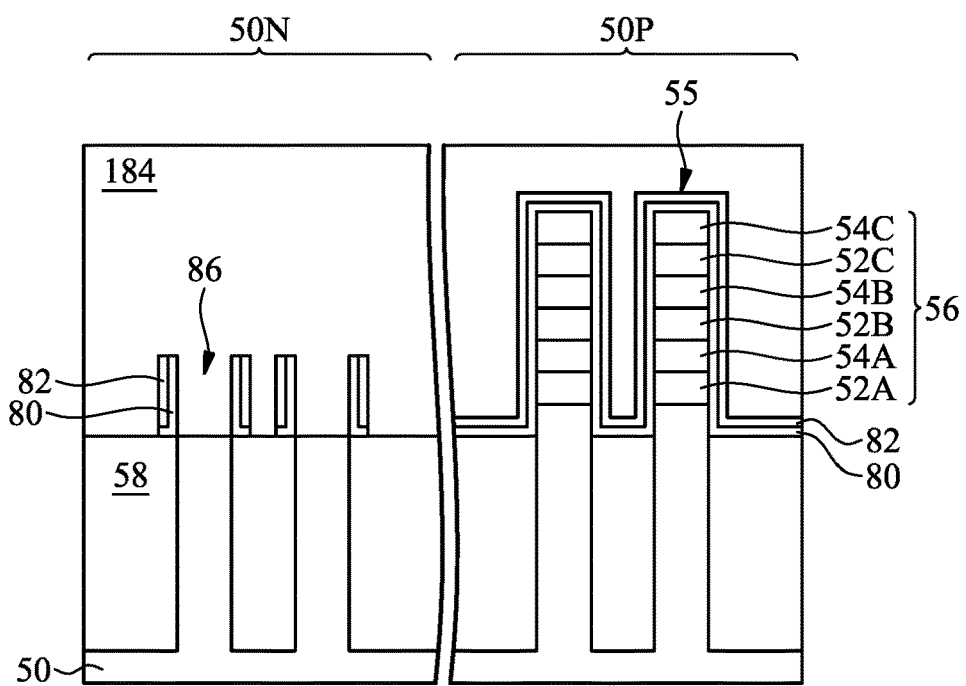
Figure 12B:
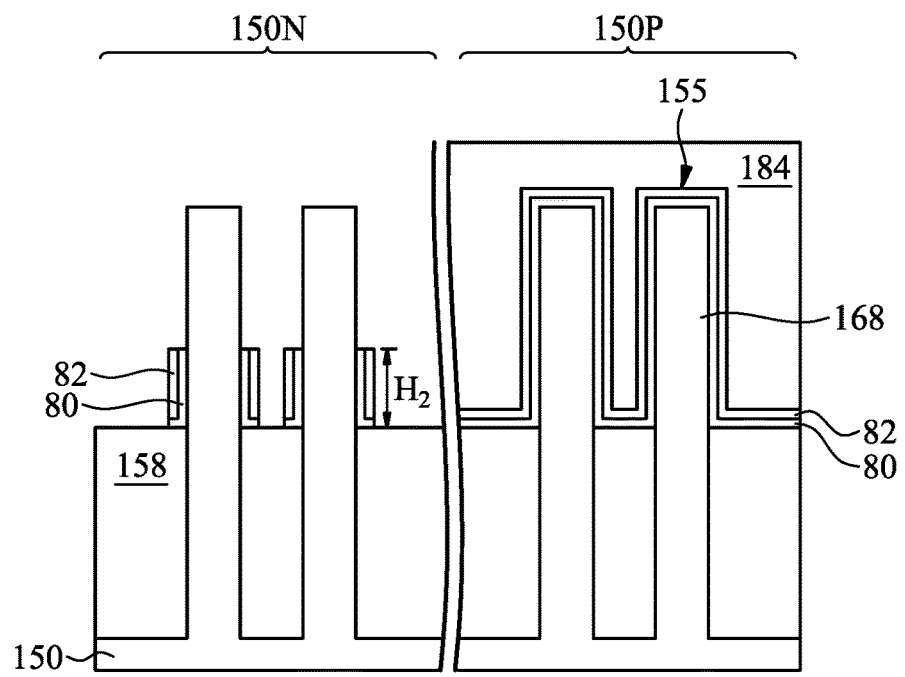
Figure 12C:
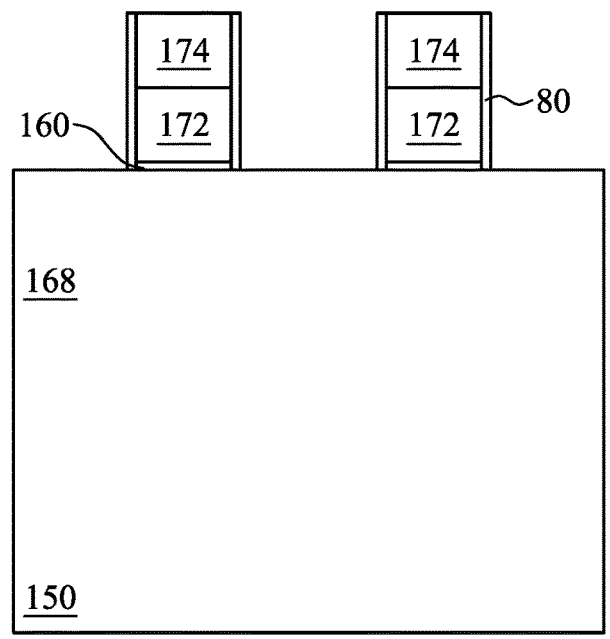

In FIGS. 12A-12C a patterned mask, such as a second patterned photoresist 184 is formed over the regions 50N/50P/150P and the first spacer layer 80 and the second spacer layer 82 are etched in the region 150N. The second patterned photoresist 184 may be formed by depositing a photoresist layer over the resulting structure using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the second patterned photoresist 184. The first spacer layer 80 and the second spacer layer 82 are then etched in the region 150N using a suitable etching process, such as isotropic etching (e.g., a wet etch process), anisotropic etching (e.g., a dry etch process), or the like. As illustrated in FIG. 12B, portions of the first spacer layer 80 and the second spacer layer 82 remaining on sidewalls of the fins 155 in the region 150N may have a height $H_2$ from about 20 nm to about 35 nm, such as about 27.5 nm. As illustrated in FIG. 12C, the second spacer layer 82 may be removed from over the first spacer layer 80 adjacent the masks 174, the dummy gates 172, and the dummy dielectric layers 160.

After the first spacer layer 80 is etched, implants for lightly doped source/drain (LDD) regions (not separately illustrated) may be performed in the region 150N. Appropriate type impurities (e.g., n-type) may be implanted into the fins 155 in the region 150N exposed by the second patterned photoresist 184. The n-type impurities may be any of the n-type impurities previously discussed. The lightly doped source/drain regions may have a concentration of impurities of from about $1\times10^{15}$ atoms/cm$^3$ to about $1\times10^{19}$ atoms/cm$^3$, such as about $5\times10^{18}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacer layer 8o may be etched prior to forming the second spacer layer 82, additional spacers may be formed and removed, and/or the like). Furthermore, the n-type and p-type devices may be formed using a different structures and steps.

Figure 13A:
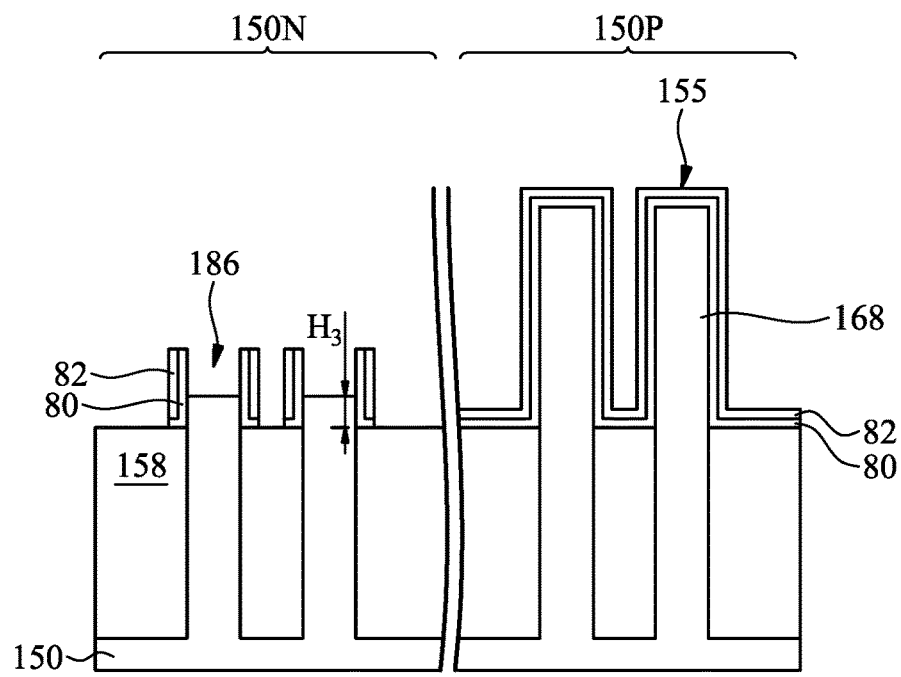
Figure 13B:
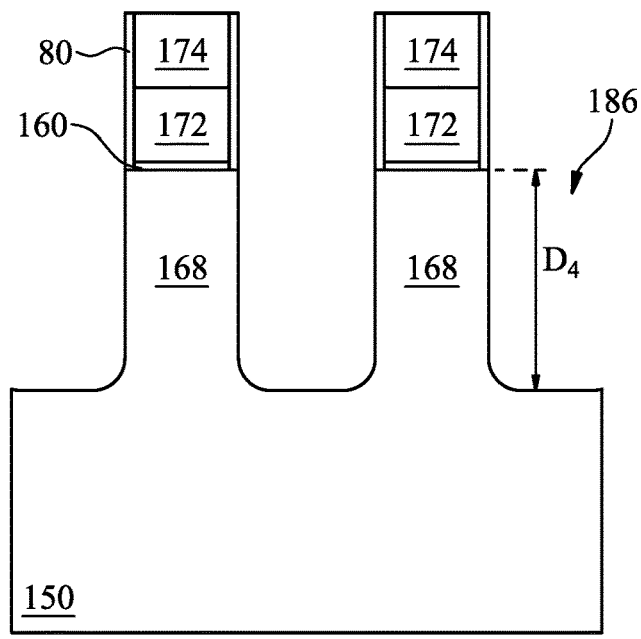

In FIGS. 13A and 13B, second recesses 186 are formed in the fins 155 in the region 150N and the second patterned photoresist 184 is removed. The second patterned photoresist 184 may be removed by any acceptable process, such as an ashing process, a stripping process, the like, or a combination thereof and may be removed before or after forming the second recesses 186. The second recesses 186 may extend a depth $D_4$ below top surfaces of portions of the fins 155 which are etched from about 30 nm to about 60 nm, such as about 40 nm. In further embodiments, the depth $D_4$ of the second recesses 186 may be from about 20 nm to about 35 nm, such as about 27.5 nm. Top surfaces of the fins 155 below the second recesses 186 may be disposed a height $H_3$ above top surfaces of the STI regions 58 from about 0 nm to about 30 nm, such as about 20 nm. The second recesses 186 may be formed by etching the fins 155 using anisotropic etching processes, such as RIE, NBE, or the like. The first spacer layer 80, the second spacer layer 82, the masks 174, and/or the second patterned photoresist 184 mask the regions 50N/50P/150P and portions of the fins 155 in the region 150N during the etching processes used to form the second recesses 186. A single etch process or multiple etch processes may be used to etch the fins 155. Timed etch processes may be used to stop the etching of the second recesses 186 after the second recesses 186 reach a desired depth.

The first recesses 86 may be etched to depths greater than the second recesses 186. Tiger tooth profiles (wherein portions of the recesses are etched deeper than the remainder of the recesses) may be more likely to develop in the regions 50N than the regions 150N and may cause problems in the resulting NSFETs. For example, if the first recesses 86 are not etched to a sufficient depth, tiger tooth profiles may be formed during the etching of the sidewall recesses 88, the sidewall recesses 88 may not be etched to a sufficient depth, and the first inner spacers 90 formed in the sidewall recesses 88 may have insufficient thicknesses. Etching the first recesses 86 to greater depths in the region 50N may prevent the tiger tooth profiles from being formed, which may improve device performance and decrease device defects.

Figure 14A:
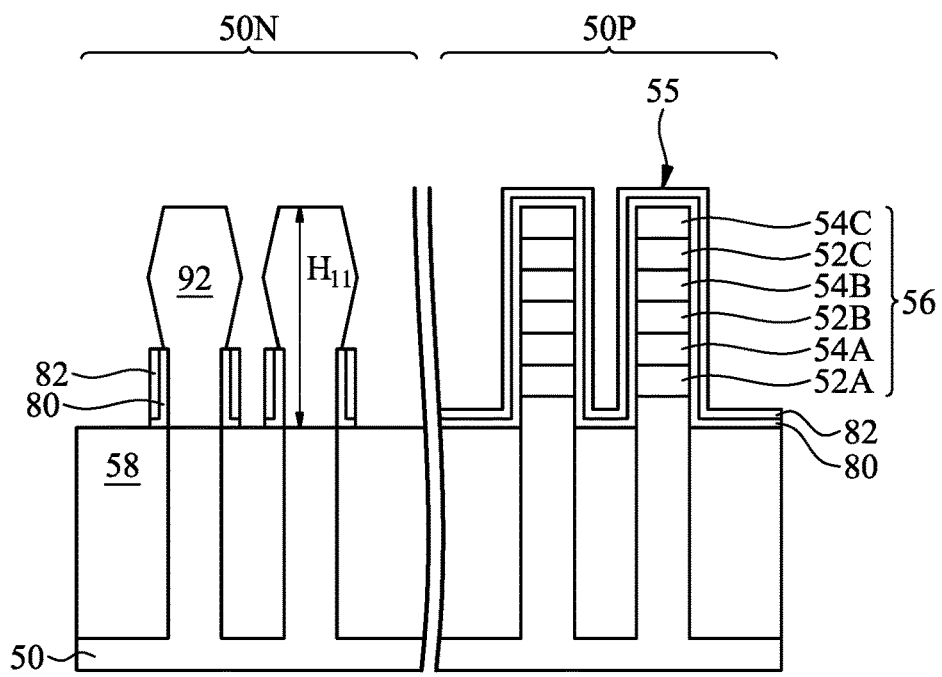
Figure 14B:
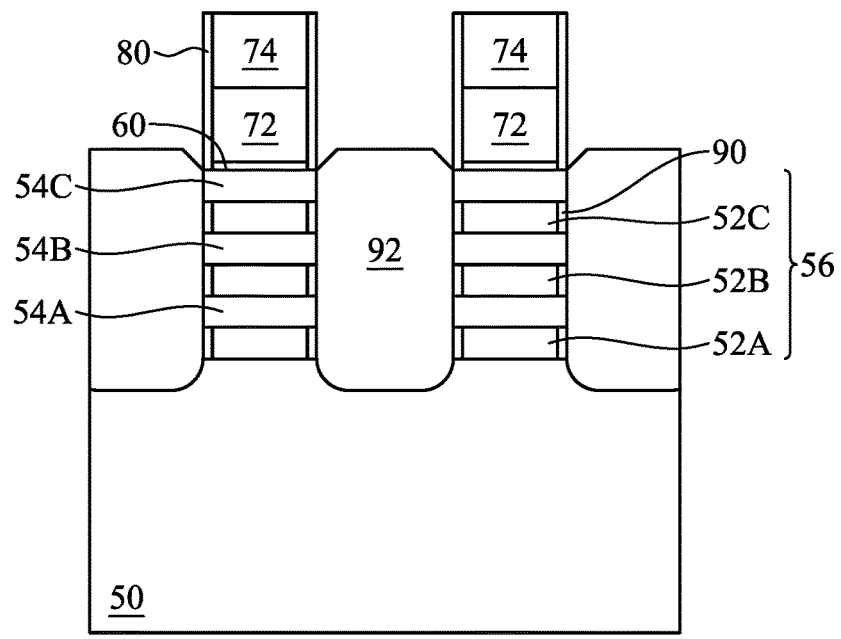
Figure 14C:
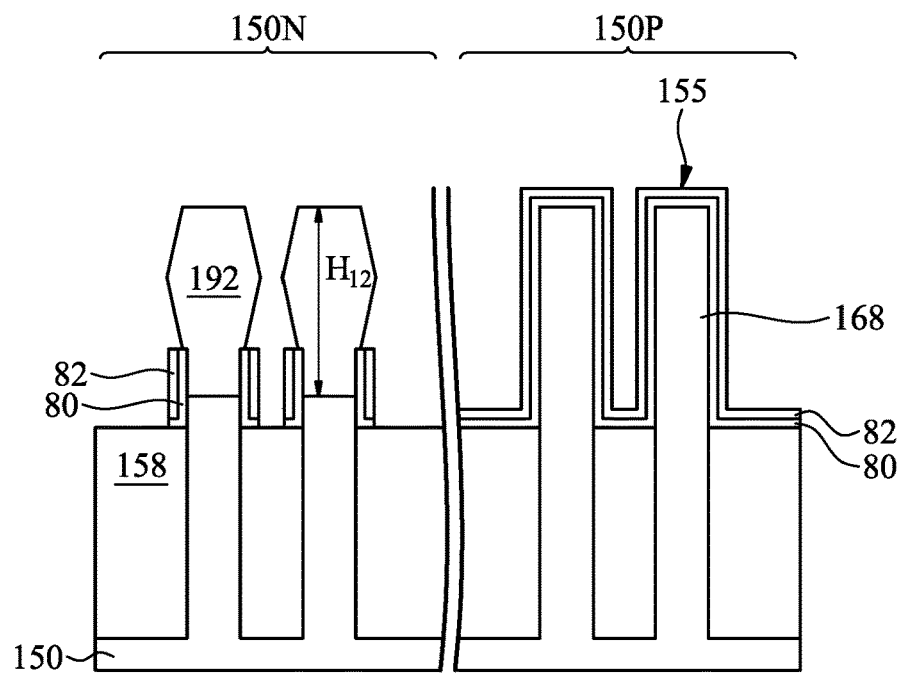
Figure 14D:
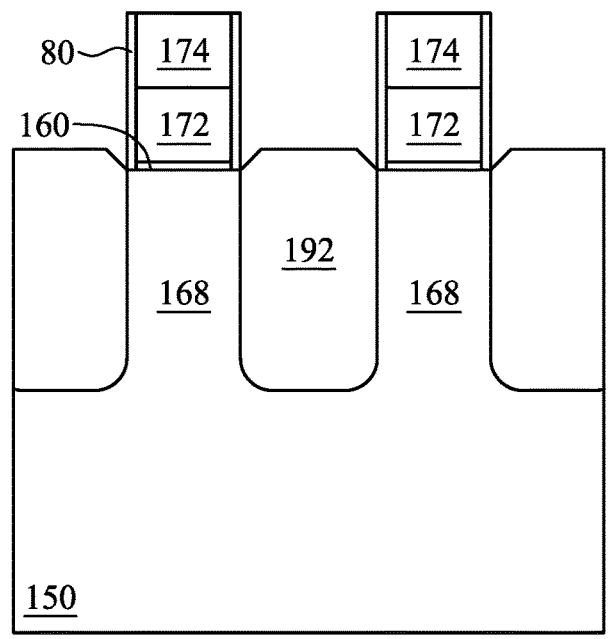

In FIGS. 14A-14D, first epitaxial source/drain regions 92 are formed in the first recesses 86 and second epitaxial source/drain regions 192 are formed in the second recesses 186 to exert stress on the second semiconductor layers 54A-54C of the nanostructures 55 and the channel regions 168 of the fins 155, respectively, thereby improving performance. The first epitaxial source/drain regions 92 may have heights $H_{11}$ from about 51 nm to about 59 nm, such as about 56 nm, while the second epitaxial source/drain regions 192 may have heights $H_{12}$ from about 31 nm to about 56 nm, such as about 41 nm. As illustrated in FIG. 14B, the first epitaxial source/drain regions 92 are formed in the first recesses 86 such that each dummy gate 72 is disposed between respective neighboring pairs of the first epitaxial source/drain regions 92. As illustrated in FIG. 14D, the second epitaxial source/drain regions 192 are formed in the second recesses 186 such that each dummy gate 172 is disposed between respective neighboring pairs of the second epitaxial source/drain regions 192.

In some embodiments, the first spacer layer 80 is used to offset the first epitaxial source/drain regions 92 and the second epitaxial source/drain regions 192 from the dummy gates 72/172 by an appropriate lateral distance so that the first epitaxial source/drain regions 92 and the second epitaxial source/drain regions 192 do not short out subsequently formed gates of the resulting NSFETs and FinFETs. The first inner spacers 90 may be used to separate the first epitaxial source/drain regions 92 from the first semiconductor layers 52A-52C to prevent shorts between the first epitaxial source/drain regions 92 and subsequently formed gate electrodes (such as the gate electrodes 102, discussed below with respect to FIGS. 26A and 26B) of the resulting NSFETs. As illustrated in FIGS. 14A and 14C, the second spacer layer 82 covers the regions 50P/150P. The second spacer layer 82 prevents deposition of the epitaxial source/drain regions in undesired areas, such as in the regions 50P/150P.

The first epitaxial source/drain regions 92 and the second epitaxial source/drain regions 192 in the regions 50N/150N, e.g., the NMOS regions, may be epitaxially grown in the first recesses 86 and the second recesses 186, respectively. The first epitaxial source/drain regions 92 and the second epitaxial source/drain regions 192 may include any acceptable material, such as appropriate for n-type NSFETs and FinFETs. For example, in an embodiment in which the second semiconductor layers 54A-54C and the channel regions 168 are formed of the second semiconductor materials (e.g., Si or SiC), the first epitaxial source/drain regions 92 and the second epitaxial source/drain regions 192 in the regions 50N/150N may include materials exerting a tensile strain on the second semiconductor layers 54A-54C and the channel regions 168, such as silicon, silicon carbide, phosphorous doped silicon carbide, silicon phosphide, or the like. The first epitaxial source/drain regions 92 and the second epitaxial source/drain regions 192 in the regions 50N/150N may have surfaces raised from respective surfaces of the nanostructures 55 and the fins 155 and may have facets.

The first epitaxial source/drain regions 92, the second epitaxial source/drain regions 192, the second semiconductor layers 54A-54C, and/or the channel regions 168 may be implanted with dopants to form source/drain regions, similar to the process previously discussed for forming lightly-doped source/drain regions, followed by an anneal. The source/drain regions may have an impurity concentration from about $1\times10^{19}$ atoms/cm$^3$ to about $1\times10^{21}$ atoms/cm$^3$, such as about $5.05\times10^{20}$ atoms/cm$^3$. The n-type and/or p-type impurities for source/drain regions may be any of the impurities previously discussed. In some embodiments, the first epitaxial source/drain regions 92 and the second epitaxial source/drain regions 192 may be in situ doped during growth.

In FIGS. 15A-15F, the second spacer layer 82 is removed and a third spacer layer 182 is deposited over the first spacer layer 80, the first epitaxial source/drain regions 92, the second epitaxial source/drain regions 192, the STI regions 58, and the masks 74/174. The second spacer layer 82 may be removed from the regions 50N/50P/150N/150P using a suitable etching process, such as isotropic etching (e.g., a wet etch process), anisotropic etching (e.g., a dry etch process), or the like. The third spacer layer 182 may be deposited by CVD, ALD, or the like. The third spacer layer 182 may be formed of silicon oxide, silicon nitride, silicon oxynitride, or the like.

Figure 15A:
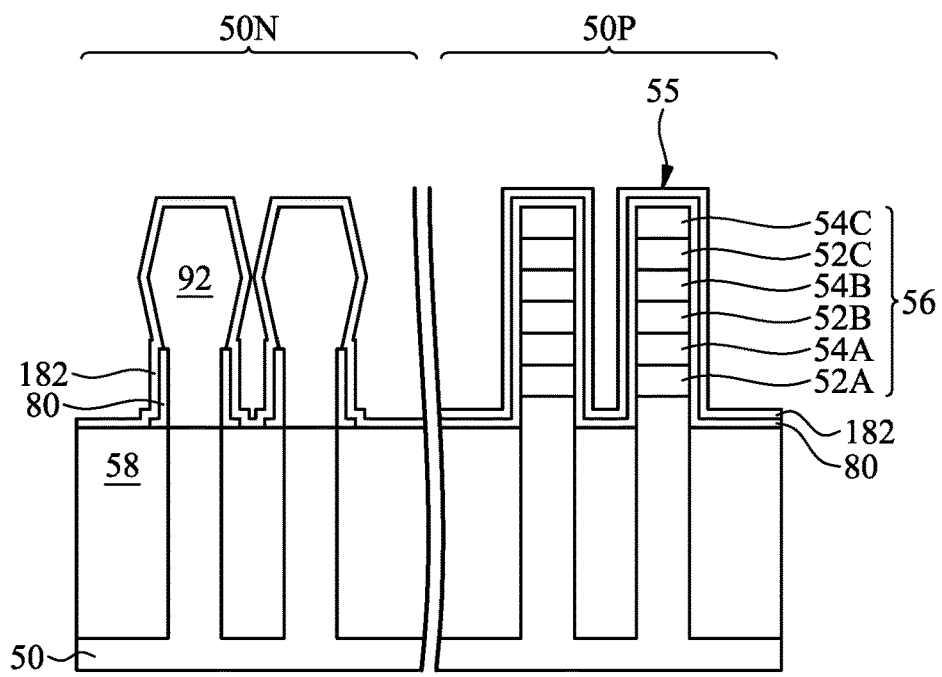
Figure 15B:
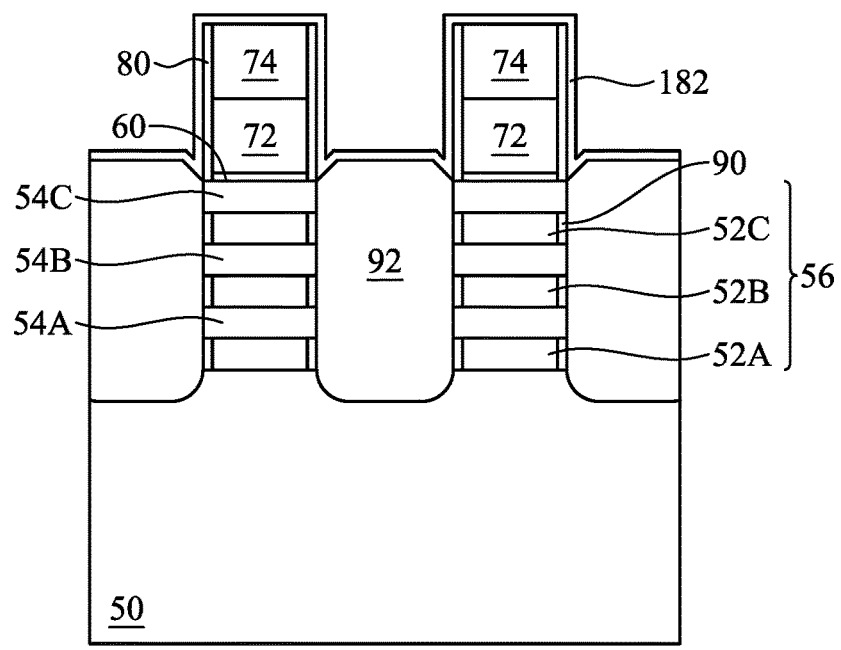
Figure 15C:
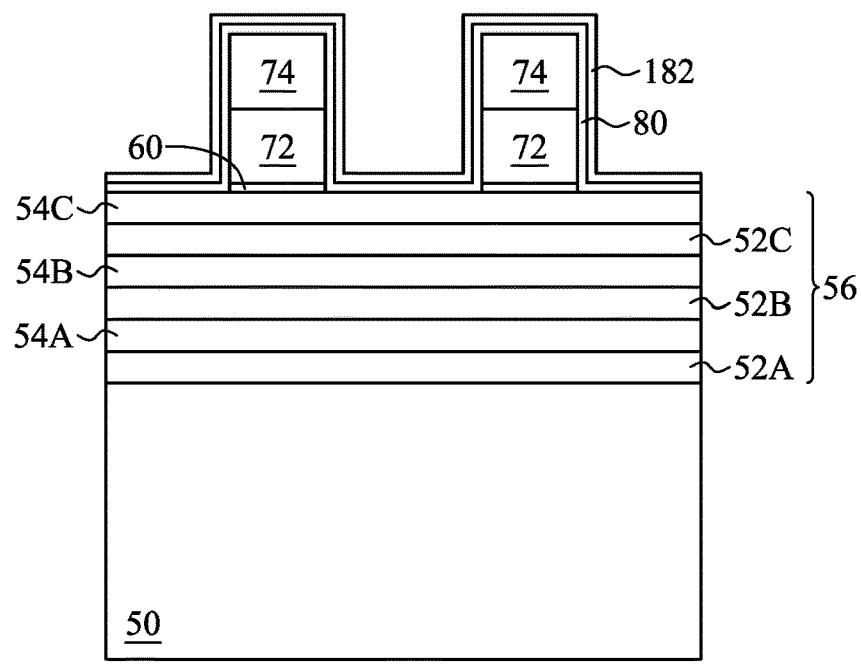
Figure 15D:
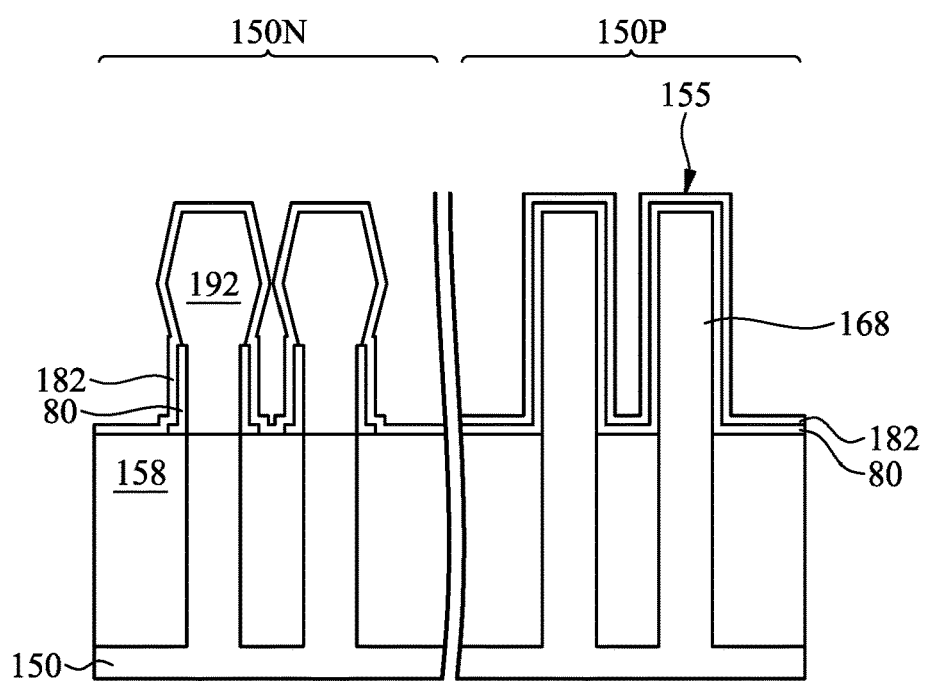
Figure 15E:
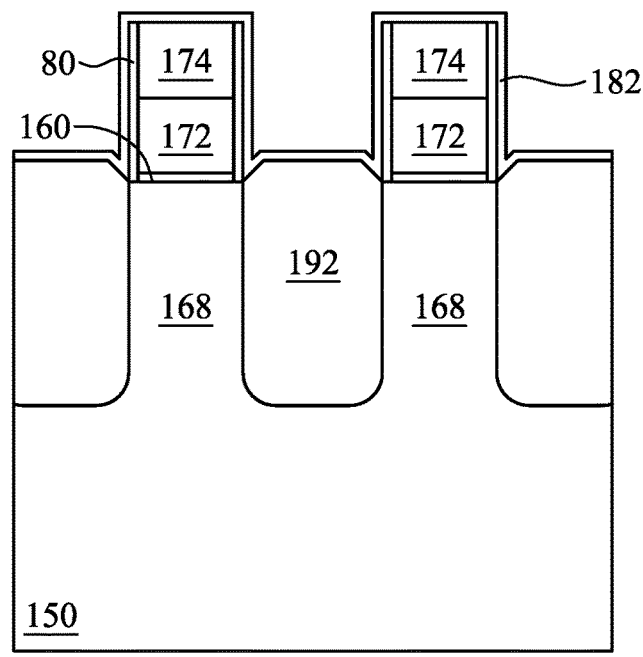
Figure 15F:
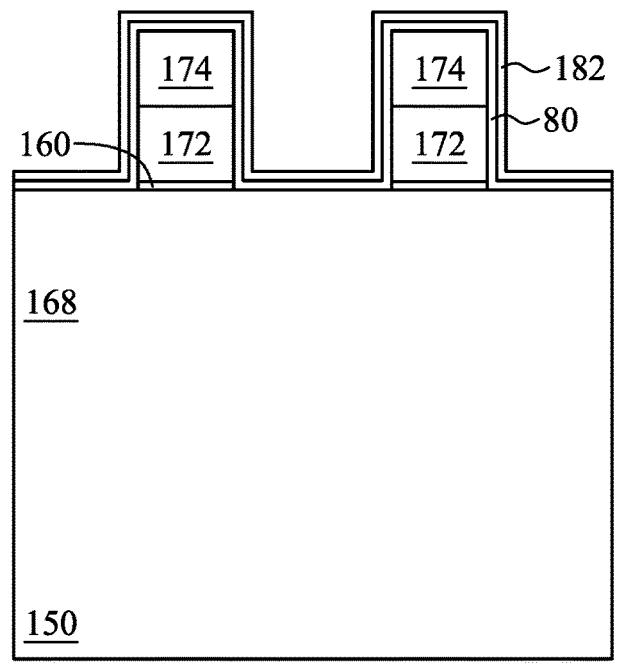
Figure 16A:
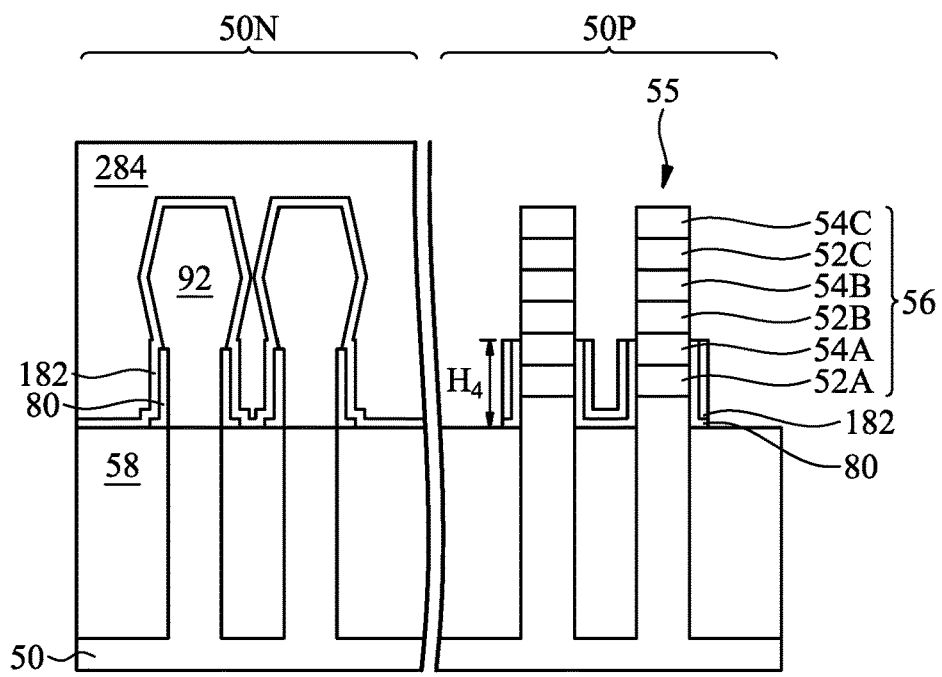
Figure 16B:
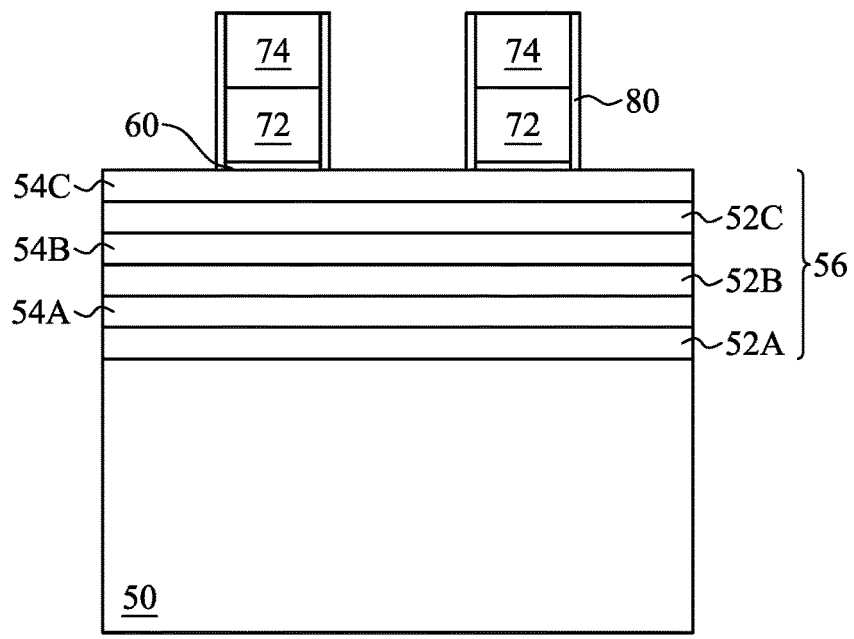
Figure 16C:
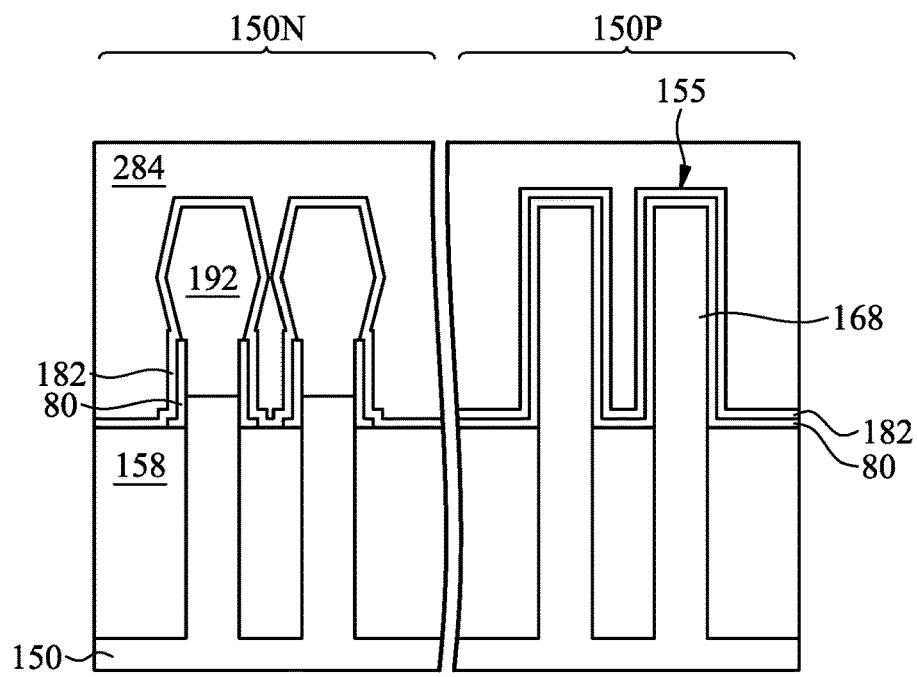

In FIGS. 16A-16C, a patterned mask, such as a third patterned photoresist 284 is formed over the regions 50N/150N/150P and the first spacer layer 80 and the third spacer layer 182 are etched in the region 50P. The third patterned photoresist 284 may be formed by depositing a photoresist layer over the structure illustrated in FIGS. 15A-15F using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the third patterned photoresist 284. The first spacer layer 80 and the third spacer layer 182 are then etched in the region 50P using a suitable etching process, such as isotropic etching (e.g., a wet etch process), anisotropic etching (e.g., a dry etch process), or the like. As illustrated in FIG. 16A, portions of the first spacer layer 80 and the third spacer layer 182 remaining on sidewalls of the nanostructures 55 in the region 50P may have a height $H_4$ from about 10 nm to about 20 nm, such as about 15 nm. As illustrated in FIG. 16B, the third spacer layer 182 may be removed from over the first spacer layer 80 adjacent the masks 74, the dummy gates 72, and the dummy dielectric layers 60. Although the portions of the first spacer layer 80 and the third spacer layer 182 remaining on sidewalls of the nanostructures 55 in the region 50P are illustrated as having heights $H_4$ greater than heights $H_1$ of the first spacer layer 80 and the second spacer layer 82 remaining on sidewalls of the nanostructures 55 in the region 50N (discussed above with respect to FIG. 8A), heights $H_4$ may be equal to or less than heights $H_1$.

After the first spacer layer 80 is etched, implants for lightly doped source/drain (LDD) regions (not separately illustrated) may be performed in the region 50P. Appropriate type impurities (e.g., p-type) may be implanted into the nanostructures 55 in the region 50P exposed by the third patterned photoresist 284. The p-type impurities may be any of the p-type impurities previously discussed. The lightly doped source/drain regions may have a concentration of impurities of from about $1\times10^{15}$ atoms/cm$^3$ to about $1\times10^{19}$ atoms/cm$^3$, such as about $5\times10^{18}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacer layer 8o may be etched prior to forming the third spacer layer 182, additional spacers may be formed and removed, and/or the like). Furthermore, the n-type and p-type devices may be formed using a different structures and steps.

Figure 17A:
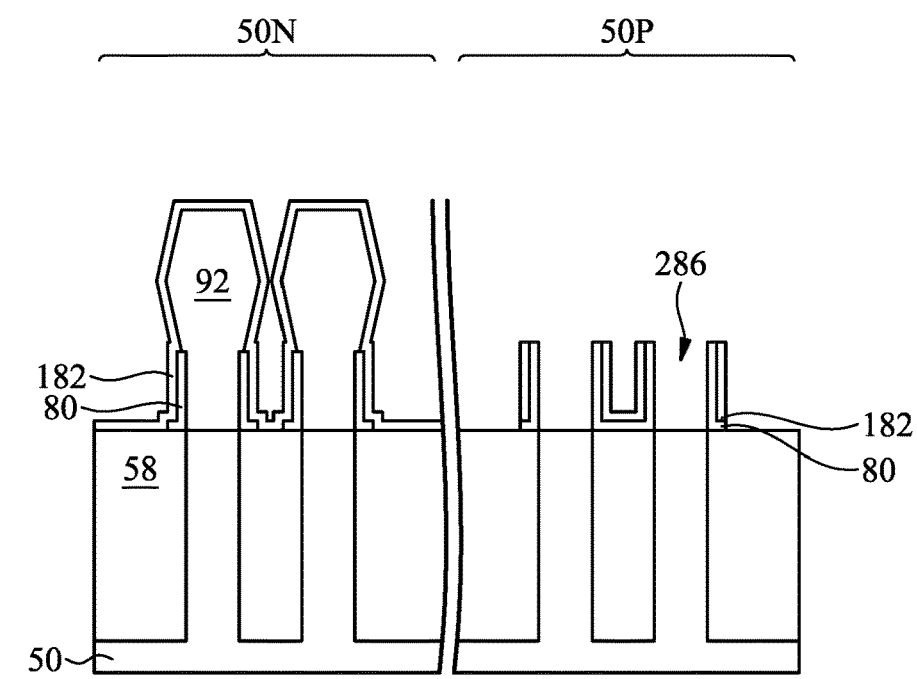
Figure 17B:
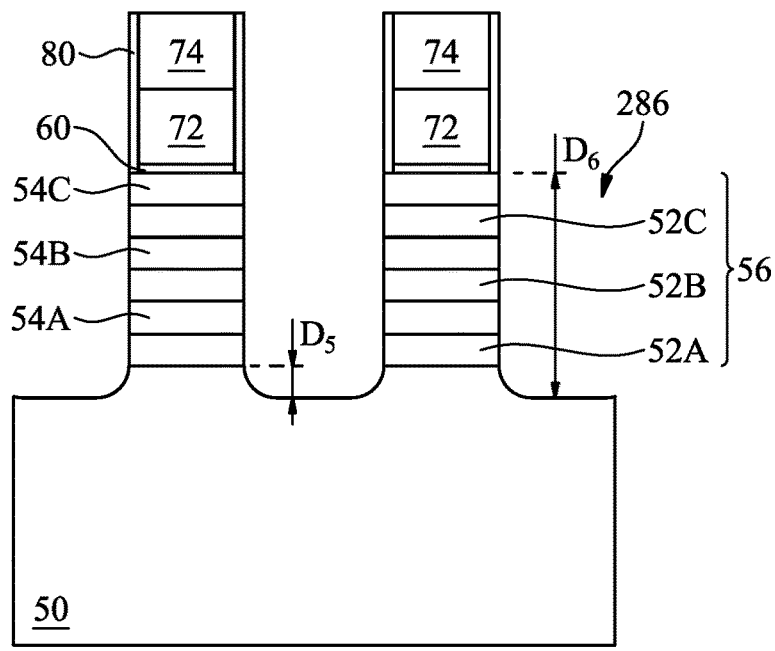

In FIGS. 17A and 17B, third recesses 286 are formed in the nanostructures 55 in the region 50P and the third patterned photoresist 284 is removed. The third patterned photoresist 284 may be removed by any acceptable process, such as an ashing process, a stripping process, the like, or a combination thereof and may be removed before or after forming the third recesses 286. The third recesses 286 in the region 50P may extend through the first semiconductor layers 52A-52C and the second semiconductor layers 54A-54C, and into the substrate 50. The third recesses 286 may extend a depth $D_5$ below a bottom surface of the first semiconductor layer 52A and into the substrate 50 from about 5 nm to about 20 nm, such as about 12.5 nm. The third recesses 286 may extend a depth $D_6$ below top surfaces of the second semiconductor layer 54C from about 51 nm to about 71 nm, such as about 61 nm. In further embodiments, the depth $D_6$ of the third recesses 286 may be from about 40 nm to about 50 nm, such as about 45 nm. As illustrated in FIG. 17A, top surfaces of the STI regions 58 may be level with a top surface of the substrate 50. The third recesses 286 may be formed by etching the nanostructures 55 using anisotropic etching processes, such as RIE, NBE, or the like. The first spacer layer 80, the third spacer layer 182, the masks 74, and/or the third patterned photoresist 284 mask the regions 50N/150N/150P and portions of the nanostructure 55 in the region 50P during the etching processes used to form the third recesses 286. A single etch process may be used to etch each layer of the multi-layer stack 56. In other embodiments, multiple etch processes may be used to etch the layers of the multi-layer stack 56. Timed etch processes may be used to stop the etching of the third recesses 286 after the third recesses 286 reach a desired depth.

Figure 18:
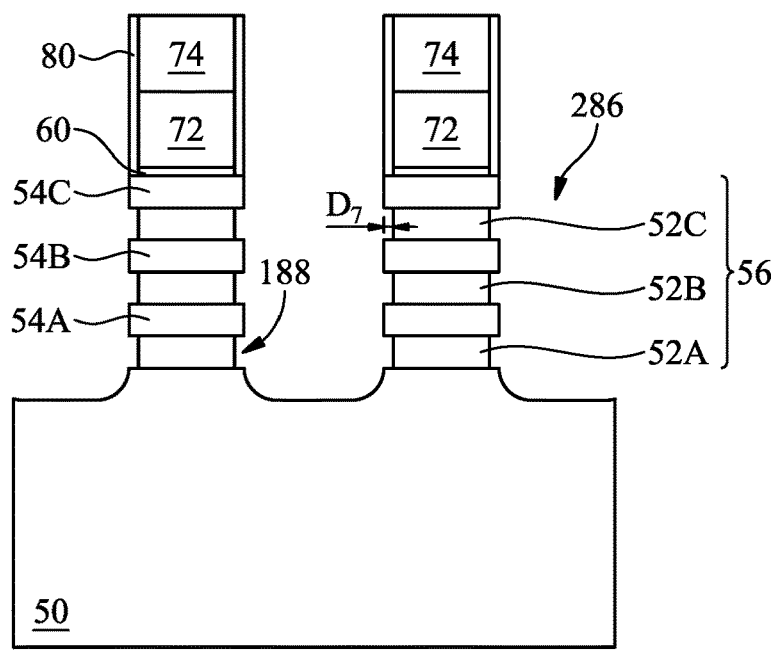

In FIG. 18, portions of the sidewalls of the layers of the multi-layer stack 56 formed of the second semiconductor materials (e.g., the first semiconductor layers 52A-52C) exposed by the third recesses 286 in the region 50P are etched to form sidewall recesses 188. The sidewalls may be etched using isotropic etching processes, such as wet etching or the like. The sidewall recesses 188 may be etched to have a depth $D_7$ from about 6 nm to about 10 nm, such as about 7.5 nm. The etchants used to etch the first semiconductor layers 52A-52C may be selective to the second semiconductor materials such that the second semiconductor layers 54A-54C and the substrate 50 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide (NH$_4$OH), or the like may be used to etch sidewalls of the multi-layer stack 56 in the region 50P. In further embodiments, the layers of the multi-layer stack 56 may be etched using a dry etching process. Hydrogen fluoride, another fluorine-based gas, or the like may be used to etch sidewalls of the multi-layer stack 56 in the region 50P.

Figure 19:
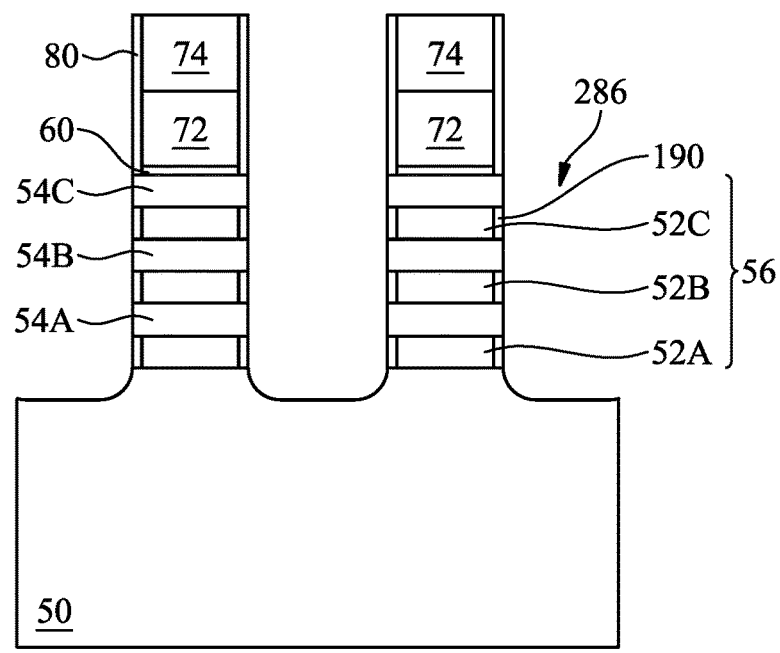

In FIG. 19, second inner spacers 190 are formed in the sidewall recess 188. The second inner spacers 190 may be formed by depositing an inner spacer layer (not separately illustrated) over the structures illustrated in FIG. 18. The inner spacer layer may be deposited by a conformal deposition process, such as CVD, ALD, or the like. The inner spacer layer may comprise a material such as silicon (Si), boron-doped silicon (Si:B), silicon nitride (SiN), silicon carbonitride (SiCN), silicon oxycarbide (SiOC), silicon oxycarbonitride (SiOCN), or the like, although any suitable material may be utilized. The inner spacer layer may then be etched to form the second inner spacers 190. The inner spacer layer may be etched by an anisotropic etching process, such as RIE, NBE, or the like. The second inner spacers 190 may be used to prevent damage to subsequently formed source/drain regions (such as the third epitaxial source/drain regions 292, discussed below with respect to FIGS. 22A and 22B) by subsequent etching processes.

Figure 22A:
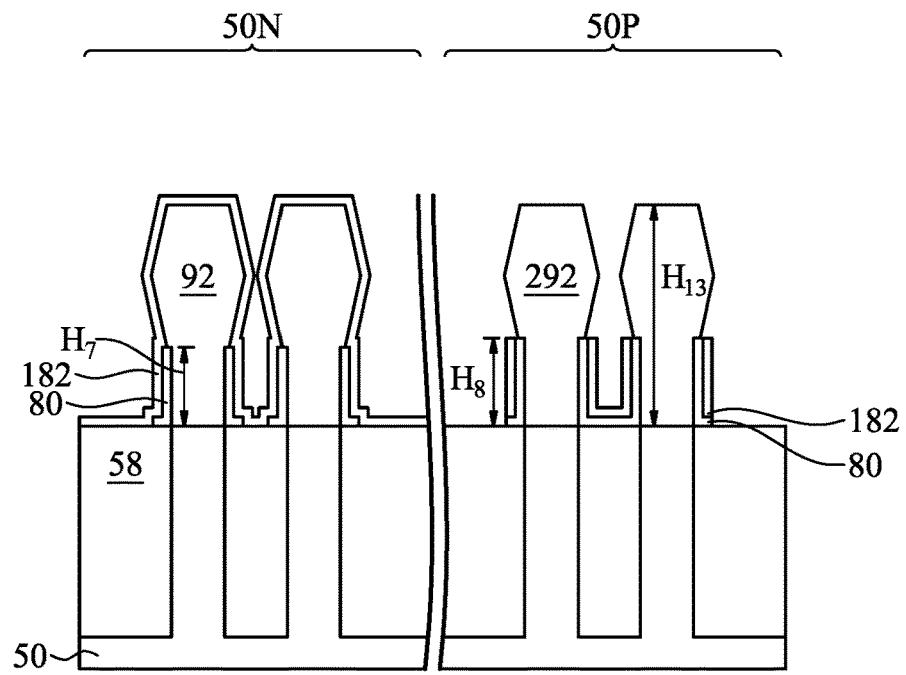

Epitaxial source/drain regions (such as the third epitaxial source/drain regions 292, discussed below with respect to FIGS. 22A and 22B) formed in the third recesses 286 may be formed of materials which are more difficult to deposit than the materials of the first epitaxial source/drain regions 92. As such, the second inner spacers 190 may be formed of a material which will facilitate the epitaxial growth of the epitaxial source/drain regions in the third recesses 286, such as silicon. The first inner spacers 90 may be formed of low-k materials to provide good insulation between the first epitaxial source/drain regions 92 and gate electrodes (such as the gate electrodes 102, discussed below with respect to FIGS. 26A and 26B) in order to prevent shorting between the first epitaxial source/drain regions 92 and the gate electrodes. The first inner spacers 90 may have a thickness from about 3 nm to about 8 nm, such as about 5 nm, while the second inner spacers 190 may have a thickness from about 2 nm to about 4 nm, such as about 3 nm. Providing relatively thicker inner spacers may further aid in the deposition of epitaxial source/drain regions. As such, the sidewall recesses 188 may have depths greater than the sidewall recesses 88, and the second inner spacers 190 may have thicknesses greater than thickness of the first inner spacers 90. As such, epitaxial source/drain regions may be formed in the third recesses 286 with high quality, reduced defects, and may provide improved strain and mobility to the second semiconductor layers 54A-54C.

Figure 20A:
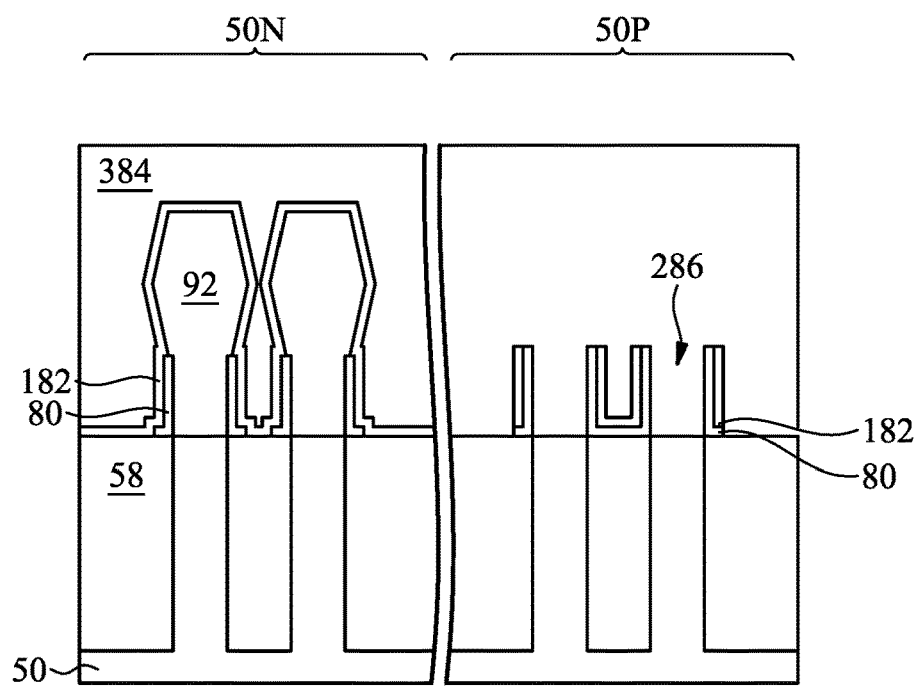
Figure 20B:
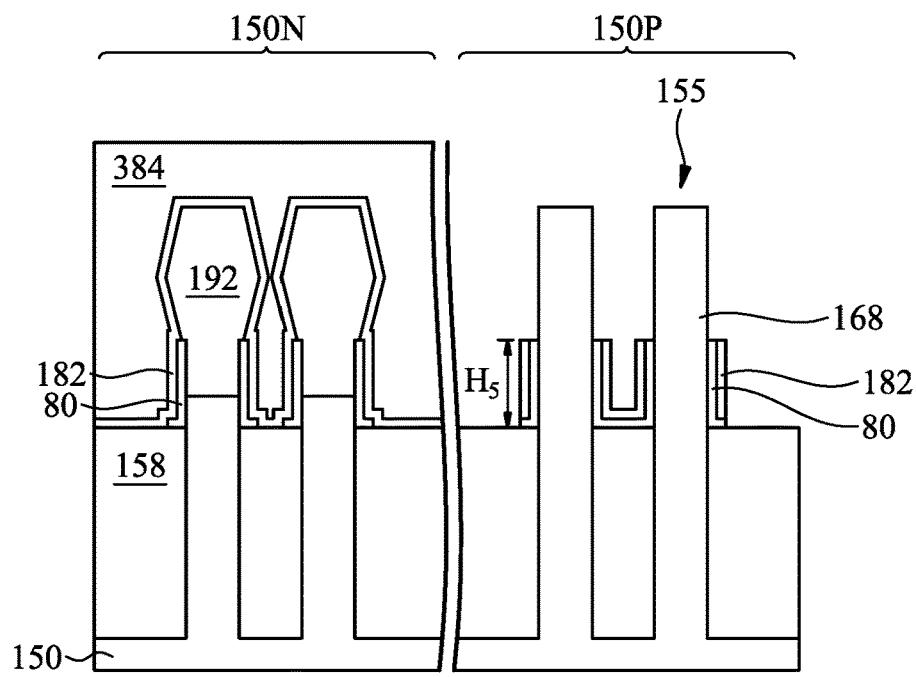
Figure 20C:
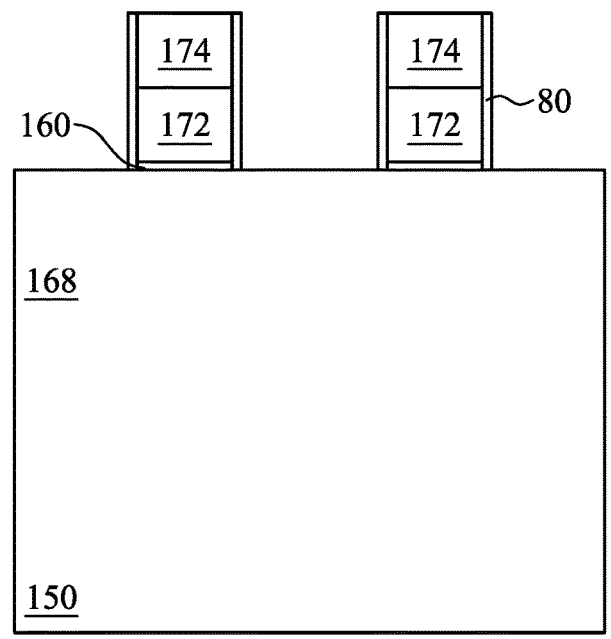

In FIGS. 20A-20C a patterned mask, such as a fourth patterned photoresist 384 is formed over the regions 50N/50P/150N and the first spacer layer 80 and the third spacer layer 182 are etched in the region 150P. The fourth patterned photoresist 384 may be formed by depositing a photoresist layer over the resulting structure using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the fourth patterned photoresist 384. The first spacer layer 80 and the third spacer layer 182 are then etched in the region 150P using a suitable etching process, such as isotropic etching (e.g., a wet etch process), anisotropic etching (e.g., a dry etch process), or the like. As illustrated in FIG. 20B, portions of the first spacer layer 80 and the third spacer layer 182 remaining on sidewalls of the fins 155 in the region 150P may have a height $H_5$ from about 20 nm to about 35 nm, such as about 27.5 nm. As illustrated in FIG. 20C, the third spacer layer 182 may be removed from over the first spacer layer 80 adjacent the masks 174, the dummy gates 172, and the dummy dielectric layers 160.

After the first spacer layer 80 is etched, implants for lightly doped source/drain (LDD) regions (not separately illustrated) may be performed in the region 150P. Appropriate type impurities (e.g., p-type) may be implanted into the fins 155 in the region 150P exposed by the fourth patterned photoresist 384. The p-type impurities may be any of the p-type impurities previously discussed. The lightly doped source/drain regions may have a concentration of impurities of from about $1 \times 10^{15}$ atoms/cm$^3$ to about $1 \times 10^{19}$ atoms/cm$^3$, such as about $5 \times 10^{18}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacer layer 8o may be etched prior to forming the third spacer layer 182, additional spacers may be formed and removed, and/or the like). Furthermore, the n-type and p-type devices may be formed using a different structures and steps.

Figure 21A:
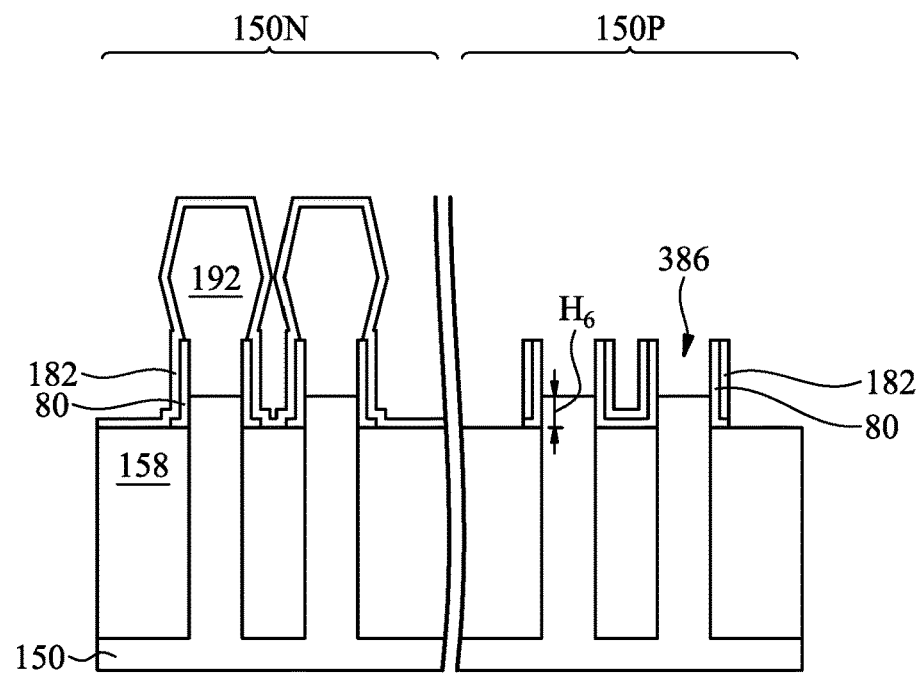
Figure 21B:
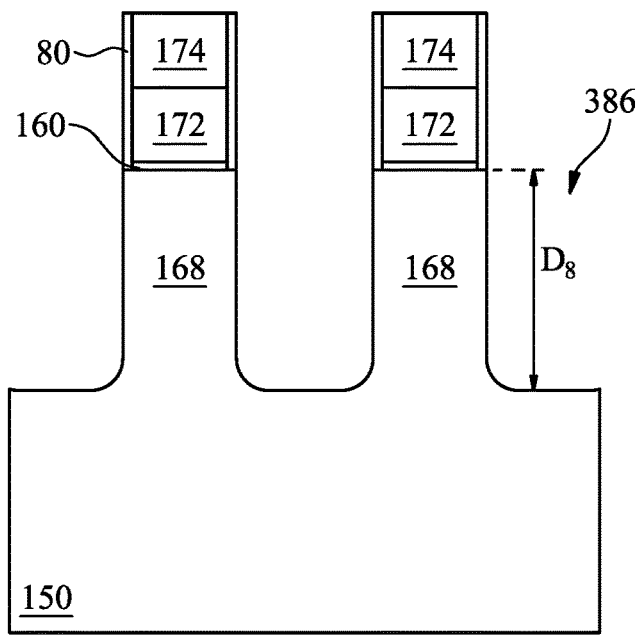

In FIGS. 21A and 21B, fourth recesses 386 are formed in the fins 155 in the region 150P and the fourth patterned photoresist 384 is removed. The fourth patterned photoresist 384 may be removed by any acceptable process, such as an ashing process, a stripping process, the like, or a combination thereof and may be removed before or after forming the fourth recesses 386. The fourth recesses 386 may extend a depth $D_8$ below top surfaces of portions of the fins 155 which are not etched from about 30 nm to about 60 nm, such as about 40 nm. In further embodiments, the depth $D_8$ of the fourth recesses 386 may be from about 20 nm to about 35 nm, such as about 27.5 nm. Top surfaces of the fins 155 below the fourth recesses 386 may be disposed a height $H_6$ above top surfaces of the STI regions 58 from about 0 nm to about 30 nm, such as about 20 nm. The fourth recesses 386 may be formed by etching the fins 155 using anisotropic etching processes, such as RIE, NBE, or the like. The first spacer layer 80, the third spacer layer 182, the masks 174, and/or the fourth patterned photoresist 384 mask the regions 50N/50P/150N and portions of the fins 155 in the region 150P during the etching processes used to form the fourth recesses 386. A single etch process or multiple etch processes may be used to etch the fins 155. Timed etch processes may be used to stop the etching of the fourth recesses 386 after the fourth recesses 386 reach a desired depth.

The third recesses 286 may be etched to depths greater than the fourth recesses 386. Tiger tooth profiles may be more likely to develop in the regions 50P than the regions 150P and may cause problems in the resulting NSFETs. For example, if the third recesses 286 are not etched to a sufficient depth, tiger tooth profiles may be formed during the etching of the sidewall recesses 188, the sidewall recesses 188 may not be etched to a sufficient depth, and the second inner spacers 190 formed in the sidewall recesses 188 may have insufficient thicknesses. Etching the third recesses 286 to greater depths in the region 50P may prevent the tiger tooth profiles from being formed, which may improve device performance and decrease device defects.

Figure 22B:
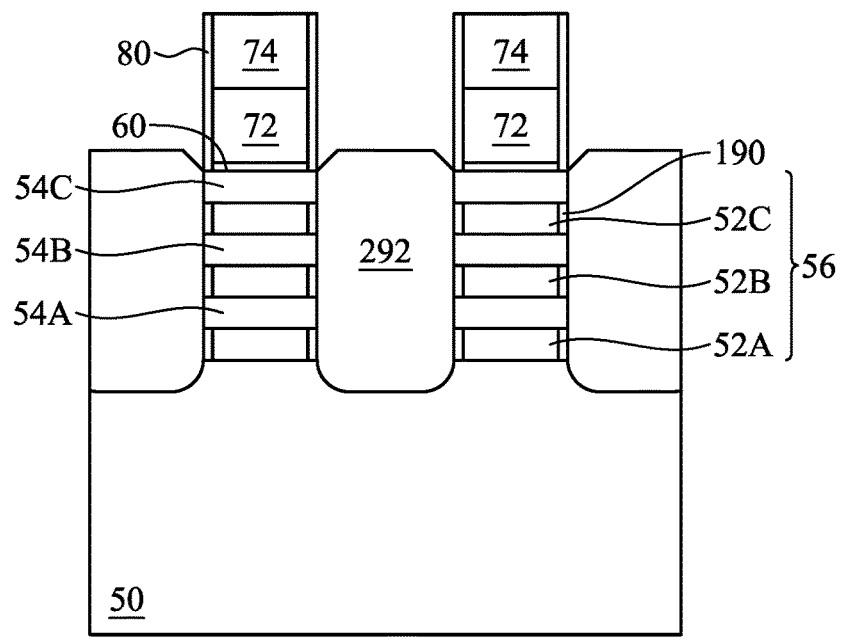
Figure 22C:
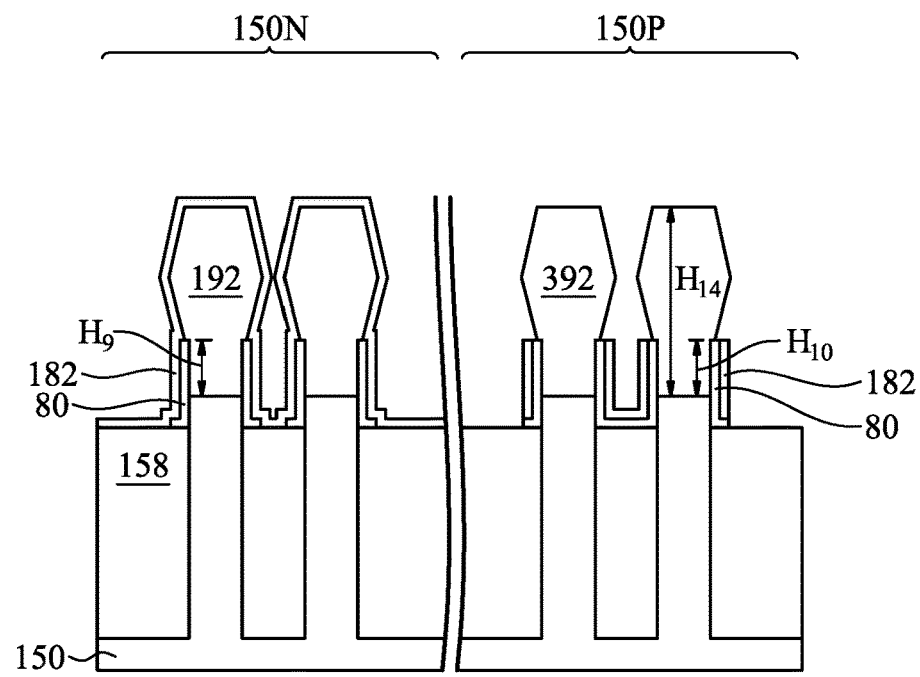
Figure 22D:
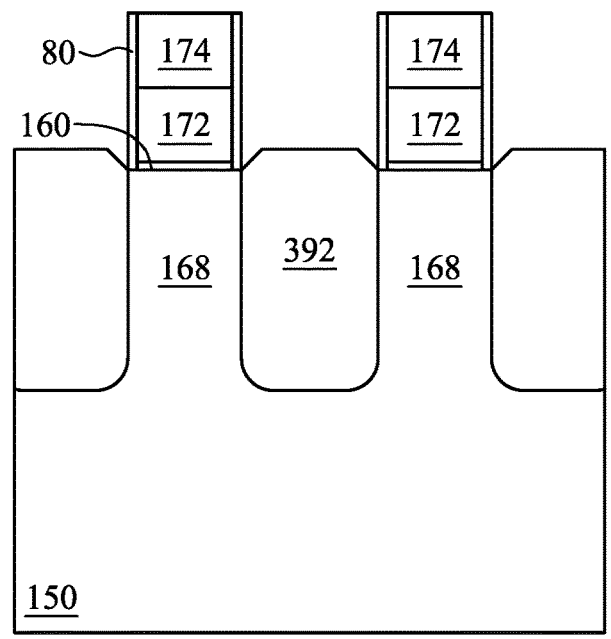
Figure 23B:
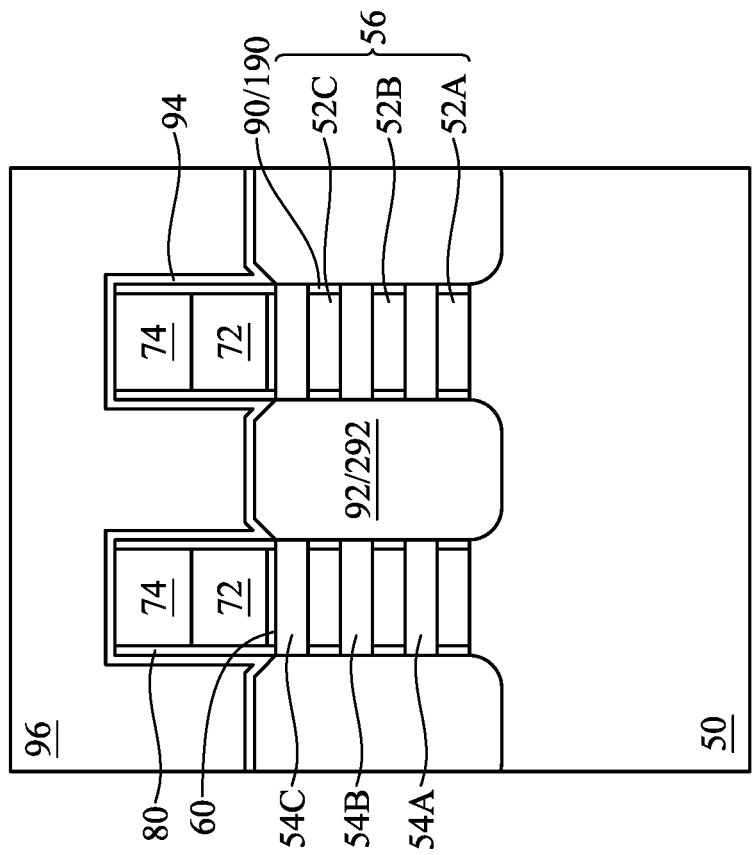
Figure 23A:
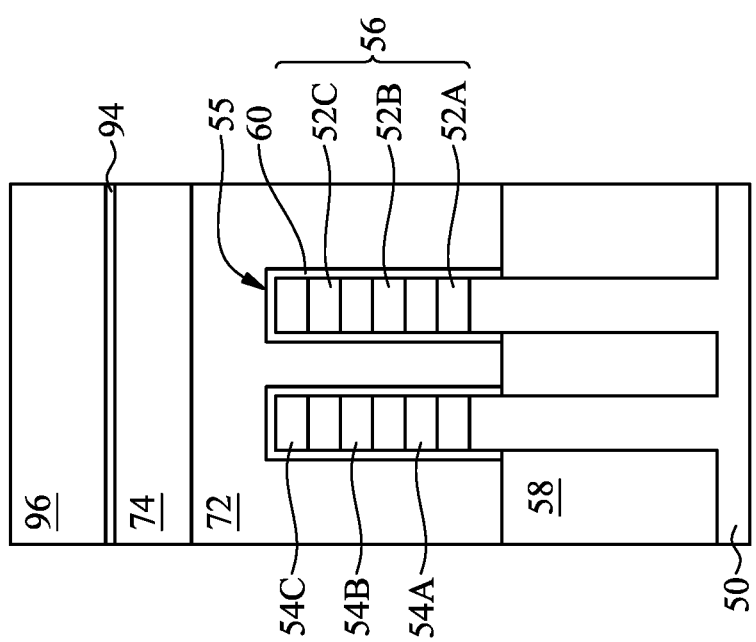
Figure 23D:
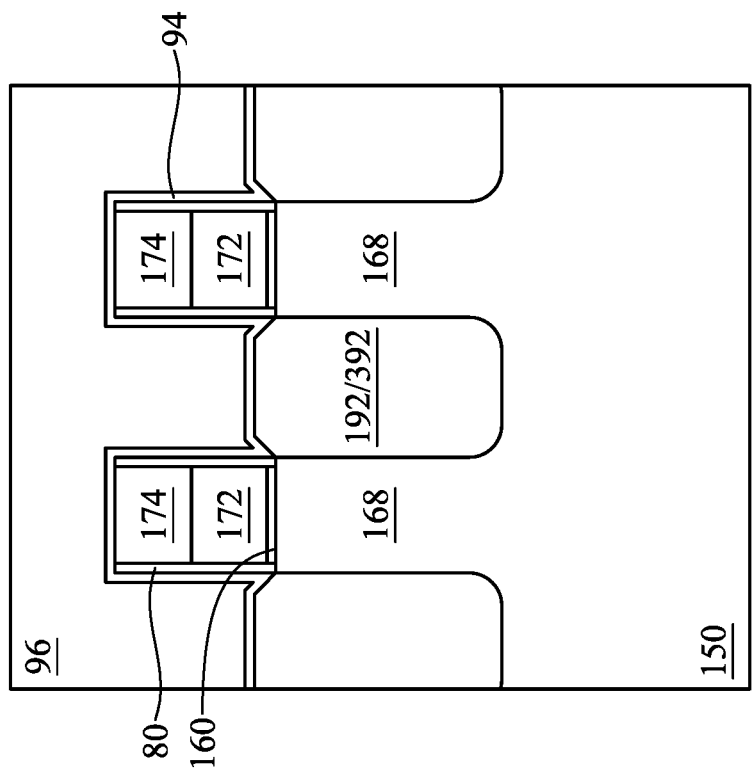
Figure 23C:
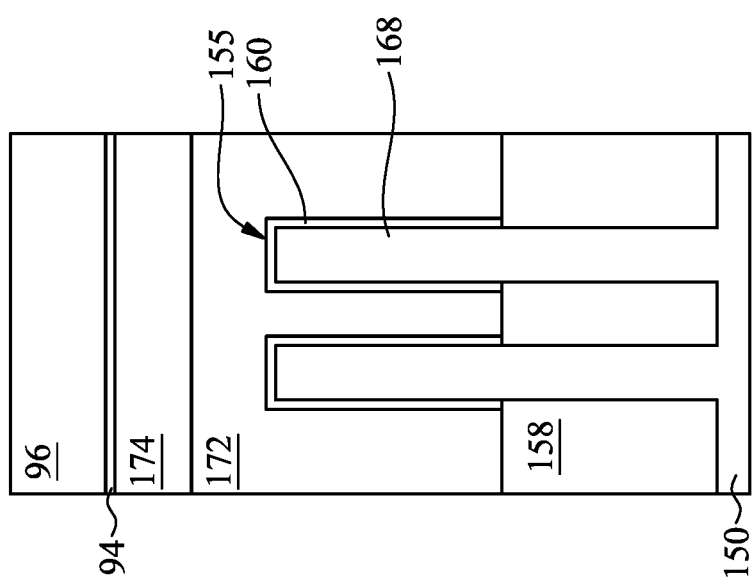
Figure 24B:
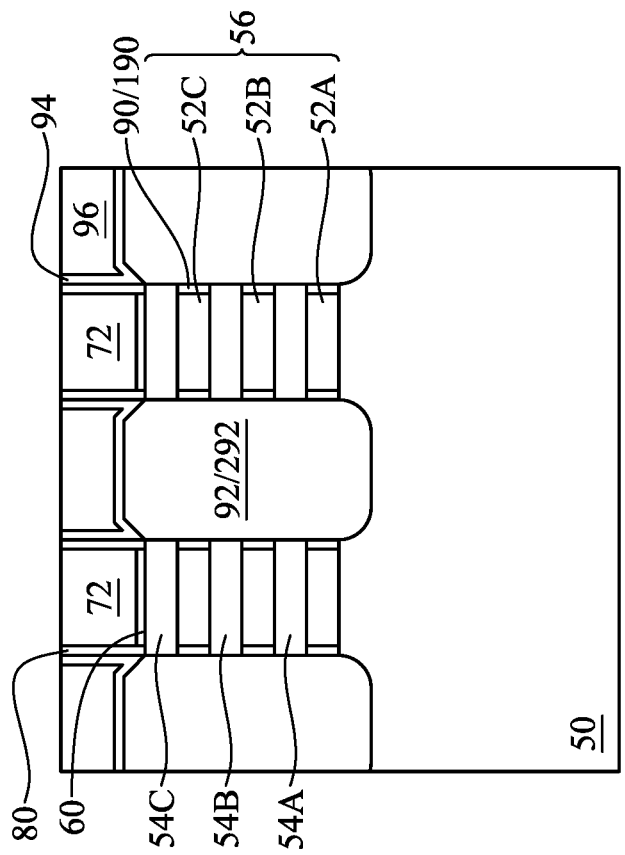
Figure 24A:
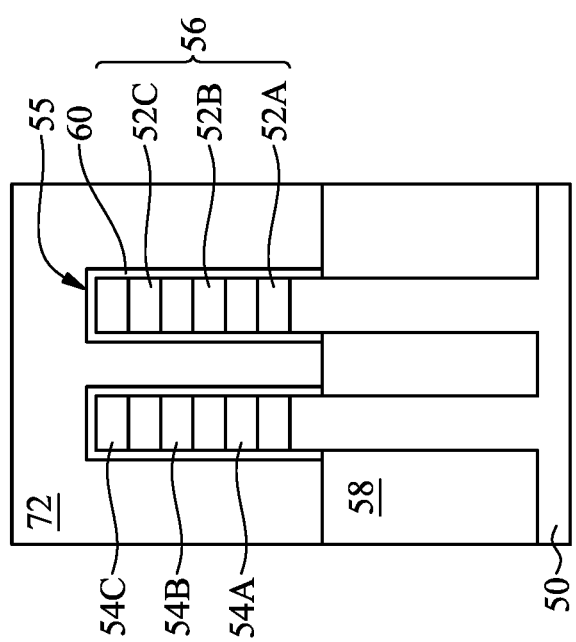
Figure 24D:
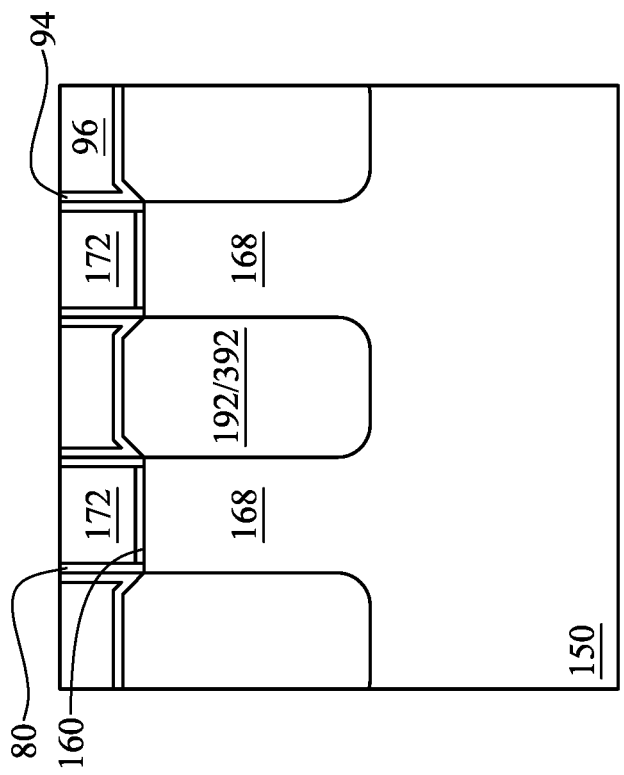
Figure 24C:
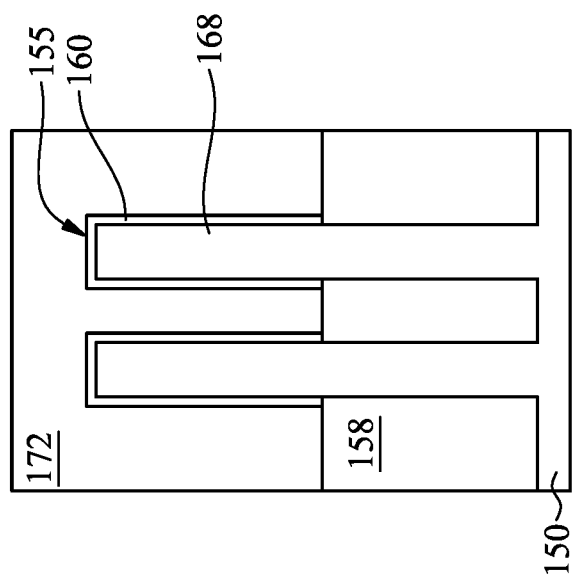

In FIGS. 22A-22D, third epitaxial source/drain regions 292 are formed in the third recesses 286 and fourth epitaxial source/drain regions 392 are formed in the fourth recesses 386 to exert stress on the second semiconductor layers 54A-54C of the nanostructures 55 and the channel regions 168 of the fins 155, respectively, thereby improving performance. The third epitaxial source/drain regions 292 may have heights $H_{13}$ from about 50 nm to about 60 nm, such as about 55 nm, while the fourth epitaxial source/drain regions 392 may have heights $H_{14}$ from about 5 nm to about 25 nm, such as about 15 nm. As illustrated in FIG. 22B, the third epitaxial source/drain regions 292 are formed in the third recesses 286 such that each dummy gate 72 is disposed between respective neighboring pairs of the third epitaxial source/drain regions 292. As illustrated in FIG. 22D, the fourth epitaxial source/drain regions 392 are formed in the fourth recesses 386 such that each dummy gate 172 is disposed between respective neighboring pairs of the fourth epitaxial source/drain regions 392.

In some embodiments, the first spacer layer 80 is used to offset the third epitaxial source/drain regions 292 and the fourth epitaxial source/drain regions 392 from the dummy gates 72/172 by an appropriate lateral distance so that the third epitaxial source/drain regions 292 and the fourth epitaxial source/drain regions 392 do not short out subsequently formed gates of the resulting NSFETs and FinFETs. The second inner spacers 190 may be used to separate the third epitaxial source/drain regions 292 from the first semiconductor layers 52A-52C to prevent shorts between the third epitaxial source/drain regions 292 and subsequently formed gate electrodes (such as the gate electrodes 102, discussed below with respect to FIGS. 26A and 26B) of the resulting NSFETs. As illustrated in FIGS. 22A and 22C, the third spacer layer 182 covers the regions 50N/150N. The third spacer layer 182 prevents deposition of the epitaxial source/drain regions in undesired areas, such as in the regions 50N/150N.

The third epitaxial source/drain regions 292 and the fourth epitaxial source/drain regions 392 in the regions 50P/150P, e.g., the PMOS regions, may be epitaxially grown in the third recesses 286 and the fourth recesses 386, respectively. The third epitaxial source/drain regions 292 and the fourth epitaxial source/drain regions 392 may include any acceptable material, such as appropriate for p-type NSFETs and FinFETs. For example, in an embodiment in which the second semiconductor layers 54A-54C and the channel regions 168 are formed of the second semiconductor materials (e.g., Si or SiC), the third epitaxial source/drain regions 292 and the fourth epitaxial source/drain regions 392 in the regions 50P/150P may comprise materials exerting a compressive strain on the second semiconductor layers 54A-54C and the channel regions 168, such as silicon-germanium, boron-doped silicon-germanium, germanium, germanium tin, or the like. The third epitaxial source/drain regions 292 and the fourth epitaxial source/drain regions 392 in the regions 50P/150P may also have surfaces raised from respective surfaces of the nanostructures 55 and the fins 155 and may have facets.

The first epitaxial source/drain regions 92, the second epitaxial source/drain regions 192, the third epitaxial source/drain regions 292, and the fourth epitaxial source/drain regions 392 may have different sidewall heights. The fins 155 in the regions 150N/150P may be spaced closer together than the nanostructures 55 in the regions 50N/50P. For example, adjacent fins 155 in the regions 150N/150P may be spaced from about 10 nm to about 20 nm, such as about 15 nm, apart from one another, while adjacent nanostructures 55 in the regions 50N/50P may be spaced from about 20 nm to about 40 nm, such as about 30 nm, apart from one another. Lateral growth of the epitaxial source/drain regions during deposition may be controlled by controlling the sidewall heights of the epitaxial source/drain regions, which may be used to prevent bridging between adjacent epitaxial source/drain regions. Because the fins 155 in the regions 150N/150P are spaced closer together than the nanostructures 55 in the regions 50N/50P, the second epitaxial source/drain regions 192 and the fourth epitaxial source/drain regions 392 formed in the fins 155 may be formed with sidewall heights greater than the first epitaxial source/drain regions 92 and the third epitaxial source/drain regions 292 formed in the nanostructures 55, such that bridging between adjacent epitaxial source/drain regions is prevented. The sidewall heights of the first epitaxial source/drain regions 92, the second epitaxial source/drain regions 192, the third epitaxial source/drain regions 292, and the fourth epitaxial source/drain regions 392 may be controlled by controlling the heights $H_1$, $H_2$, $H_4$, and $H_5$ of the first spacer layer 80 and second spacer layer 82/third spacer layer 182 adjacent the first recesses 86, the second recesses 186, the third recesses 286, and the fourth recesses 386 in which the first epitaxial source/drain regions 92, the second epitaxial source/drain regions 192, the third epitaxial source/drain regions 292, and the fourth epitaxial source/drain regions 392 are formed. The first epitaxial source/drain regions 92 may have sidewall heights $H_7$ from about 5 nm to about 15 nm, such as about 10 nm, the second epitaxial source/drain regions 192 may have sidewall heights $H_9$ from about 20 nm to about 35 nm, such as about 27.5 nm, the third epitaxial source/drain regions 292 may have sidewall heights $H_8$ from about 10 nm to about 20 nm, such as about 15 nm, and the fourth epitaxial source/drain regions 392 may have sidewall heights $H_{10}$ from about 20 nm to about 35 nm, such as about 27.5 nm. Providing epitaxial source/drain regions with larger volumes improves device performance; using different sidewall heights for the epitaxial source/drain regions allows for bridging to be prevented while performance is maximized.

The third epitaxial source/drain regions 292 in the region 50P may also have sidewall heights different from the first epitaxial source/drain regions 92 in the region 50N. The third epitaxial source/drain regions 292 may be formed of materials which have greater lateral growth during deposition than the materials of the first epitaxial source/drain regions 92. As such, the third epitaxial source/drain regions 292 may have sidewall heights greater than the first epitaxial source/drain regions 92 to prevent bridging between adjacent third epitaxial source/drain regions 292 and first epitaxial source/drain regions 92. Specifically, the first epitaxial source/drain regions 92 may have sidewall heights $H_7$ from about 5 nm to about 15 nm, such as about 10 nm and the third epitaxial source/drain regions 292 may have sidewall heights $H_8$ from about 10 nm to about 20 nm, such as about 15 nm. Providing epitaxial source/drain regions with larger volumes improves device performance; using different sidewall heights for the epitaxial source/drain regions allows for bridging to be prevented while performance is maximized.

The third epitaxial source/drain regions 292, the fourth epitaxial source/drain regions 392, the second semiconductor layers 54A-54C, and/or the channel regions 168 may be implanted with dopants to form source/drain regions, similar to the process previously discussed for forming lightly-doped source/drain regions, followed by an anneal. The source/drain regions may have an impurity concentration from about $1 \times 10^{19}$ atoms/cm$^3$ to about $1 \times 10^{21}$ atoms/cm$^3$, such as about $5.05 \times 10^{20}$ atoms/cm$^3$. The n-type and/or p-type impurities for source/drain regions may be any of the impurities previously discussed. In some embodiments, the third epitaxial source/drain regions 292 and the fourth epitaxial source/drain regions 392 may be in situ doped during growth.

FIGS. 23A through 28B illustrate various additional steps in the manufacturing of embodiment devices. FIGS. 23A, 23B, 24A, 24B, 25A, 25B, 26A, 26B, 27A, 27B, 28A, and 28B illustrate features in either of the region 50N and the region 50P and FIGS. 23C, 23D, 24C, 24D, 25C, 25D, 26C, 26D, 27C, 27D, 28C, and 28D illustrate features in either of the region 150N and the region 150P. For example, the structures illustrated in FIGS. 23A, 23B, 24A, 24B, 25A, 25B, 26A, 26B, 27A, 27B, 28A, and 28B may be applicable to both the region 50N and the region 50P and the structures illustrated in FIGS. 23C, 23D, 24C, 24D, 25C, 25D, 26C, 26D, 27C, 27D, 28C, and 28D may be applicable to both the region 150N and the region 150P. Differences (if any) in the structures of the region 50N and the region 50P or the region 150N and the region 150P are described in the text accompanying each figure.

In FIGS. 23A-23D, the third spacer layer 182 is removed and a first interlayer dielectric (ILD) 96 is deposited over the structure illustrated in FIGS. 6A, 15B/22B, 6C, and 15E/22D (the processes of FIGS. 7A-22D do not alter the cross-sections illustrated in FIGS. 6A and 6C and the processes of FIGS. 16A-22D do not alter the cross-sections illustrated in FIGS. 15B and 15E). The third spacer layer 182 may be removed from the regions 50N/50P/150N/150P using a suitable etching process, such as isotropic etching (e.g., a wet etch process), anisotropic etching (e.g., a dry etch process), or the like. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the first epitaxial source/drain regions 92, the second epitaxial source/drain regions 192, the third epitaxial source/drain regions 292, the fourth epitaxial source/drain regions 392, the masks 74/174, and the first spacer layer 80. The CESL 94 may comprise a dielectric material, such as, silicon nitride, silicon oxide, silicon oxynitride, or the like, having a different etch rate than the material of the overlying first ILD 96.

In FIGS. 24A-24D, a planarization process, such as a CMP, may be performed to level the top surface of the first ILD 96 with the top surfaces of the dummy gates 72/172 or the masks 74/174. The planarization process may also remove the masks 74/174 on the dummy gates 72/172, and portions of the first spacer layer 80 along sidewalls of the masks 74/174. After the planarization process, top surfaces of the dummy gates 72/172, the first spacer layer 80, and the first ILD 96 are level. Accordingly, the top surfaces of the dummy gates 72/172 are exposed through the first ILD 96. In some embodiments, the masks 74/174 may remain, in which case the planarization process levels the top surface of the first ILD 96 with top surface of the masks 72/172 and the first spacer layer 80.

In FIGS. 25A-25D, the dummy gates 72/172, and the masks 74/174 if present, are removed in an etching step(s), so that fifth recesses 486 are formed. Portions of the dummy dielectric layers 60/160 in the fifth recesses 486 may also be removed. In some embodiments, only the dummy gates 72/172 are removed and the dummy dielectric layers 60/160 remain and are exposed by the fifth recesses 486. In some embodiments, the dummy dielectric layers 60/160 is removed from fifth recesses 486 in a first region of a die (e.g., a core logic region) and remain in fifth recesses 486 in a second region of the die (e.g., an input/output region). In some embodiments, the dummy gates 72/172 are removed by an anisotropic dry etch process. For example, the etching process may include a dry etch process using reaction gas(es) that selectively etch the dummy gates 72/172 at a faster rate than the first ILD 96 or the first spacer layer 80. Each fifth recess 486 exposes and/or overlies the multi-layer stacks 56 or the fins 155, which act as channel regions in subsequently completed NSFETs and FinFETs. Portions of the multi-layer stacks 56 or the fins 155 which act as the channel regions are disposed between neighboring pairs of the first epitaxial source/drain regions 92, the second epitaxial source/drain regions 192, the third epitaxial source/drain regions 292, or the fourth epitaxial source/drain regions 392. During the removal, the dummy dielectric layers 60/160 may be used as etch stop layers when the dummy gates 72/172 are etched. The dummy dielectric layers 60/160 may then be optionally removed after the removal of the dummy gates 72/172.

Figure 25B:
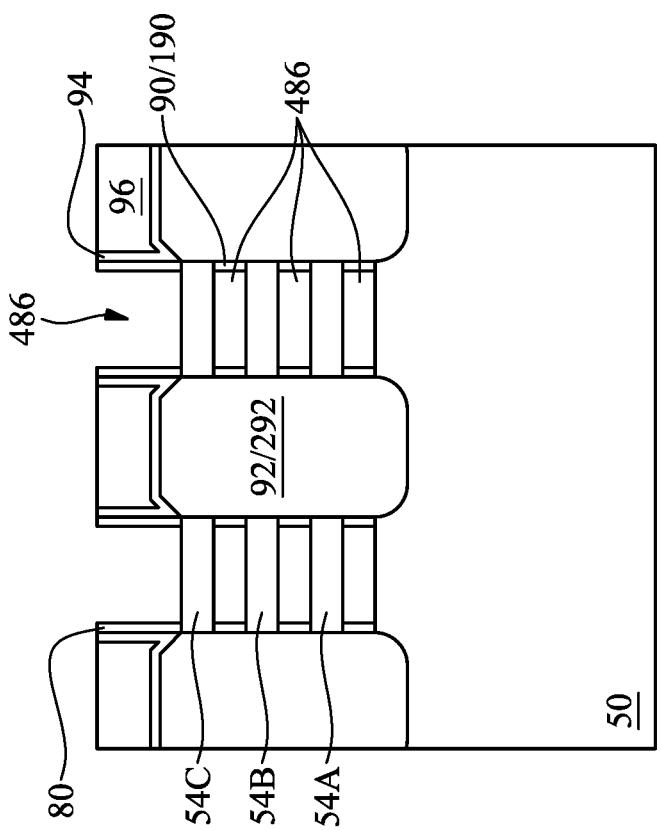
Figure 25A:
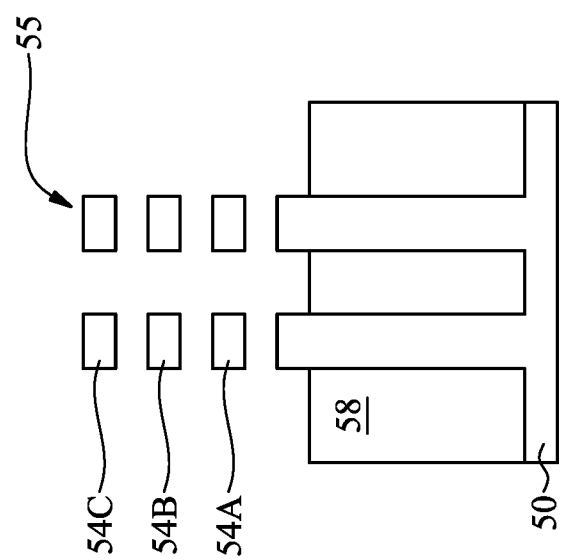
Figure 25D:
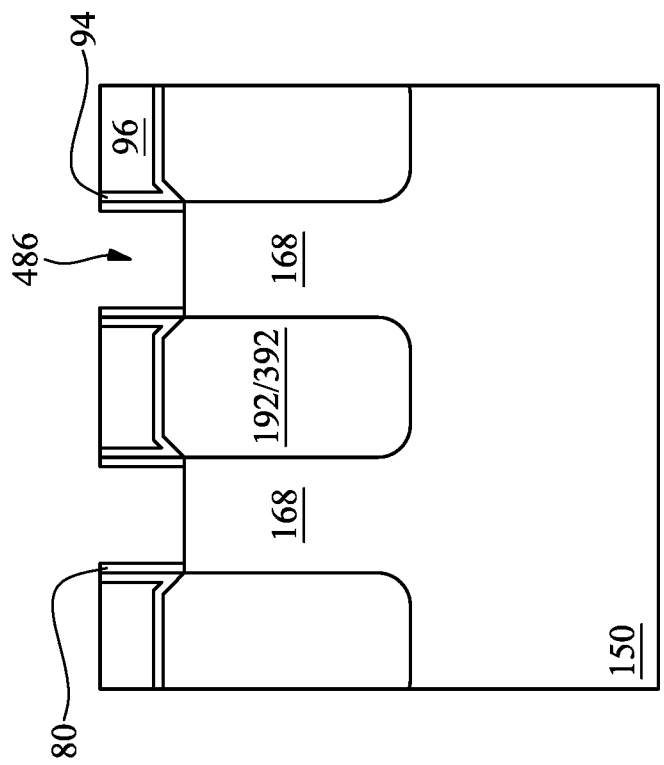
Figure 25C:
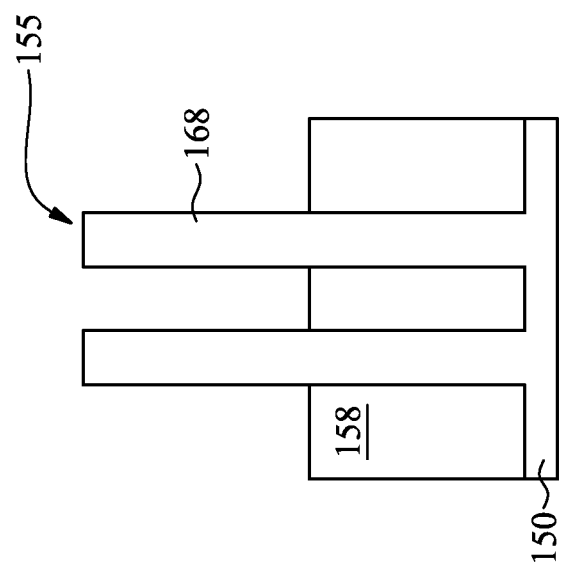
Figure 26B:
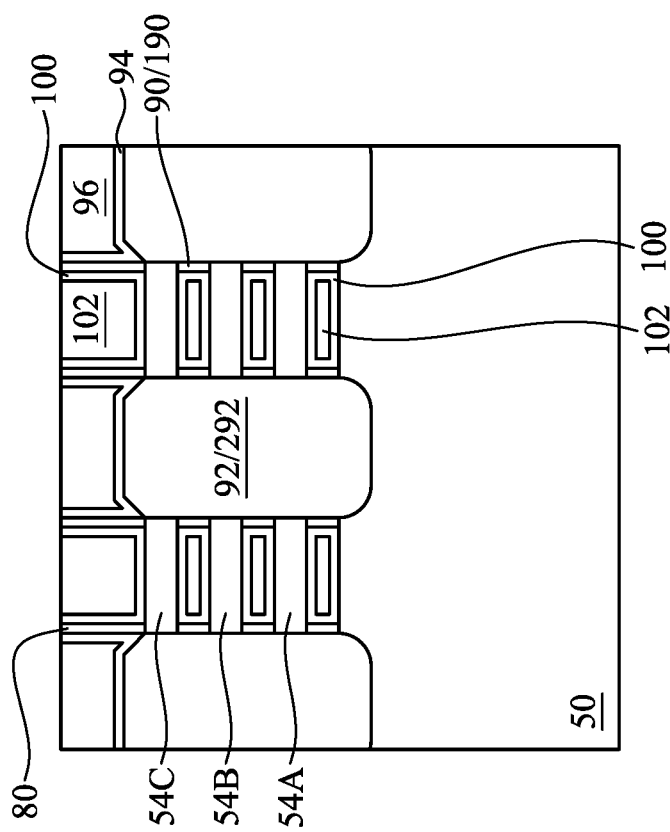
Figure 26A:
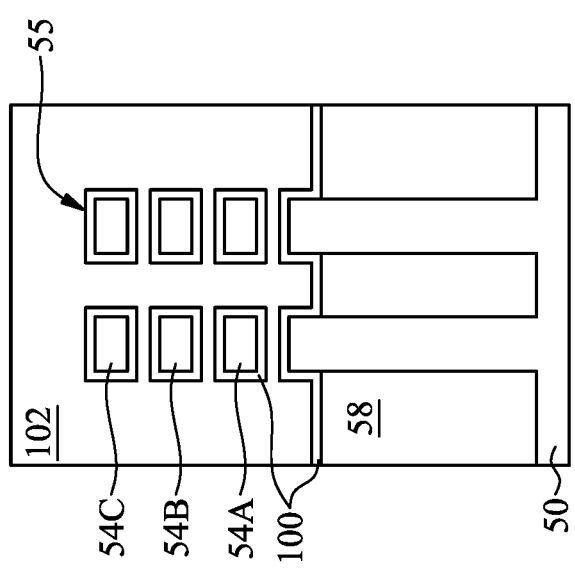
Figure 26D:
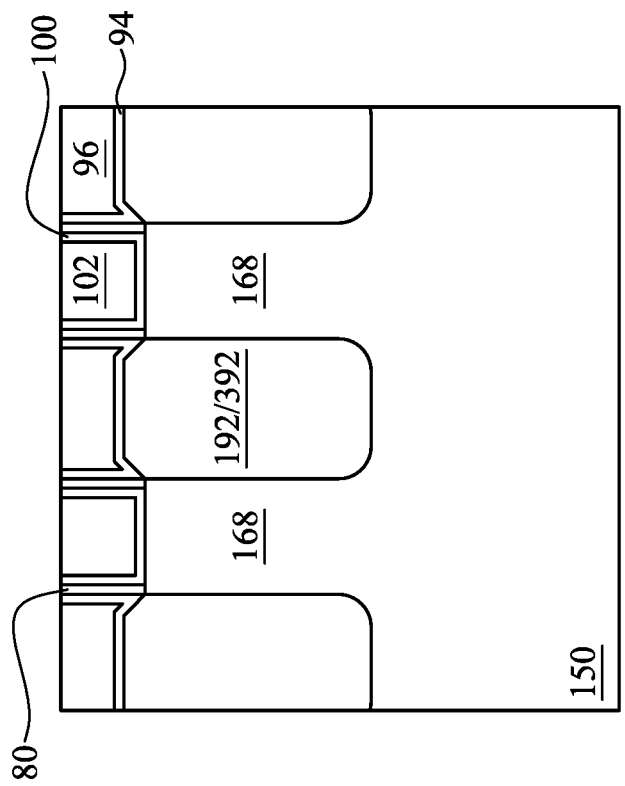
Figure 26C:
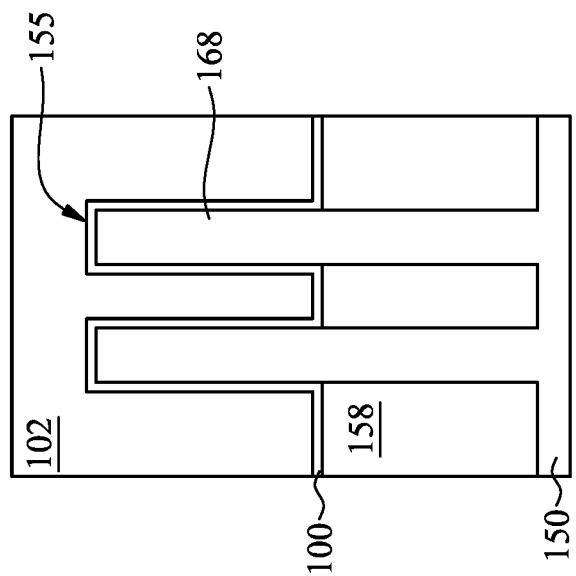
Figure 27B:
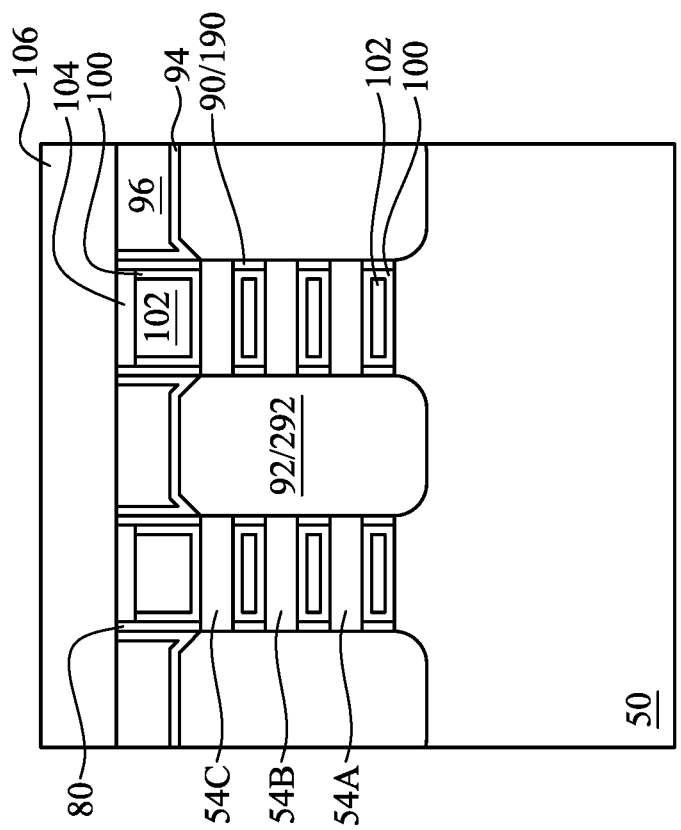
Figure 27A:
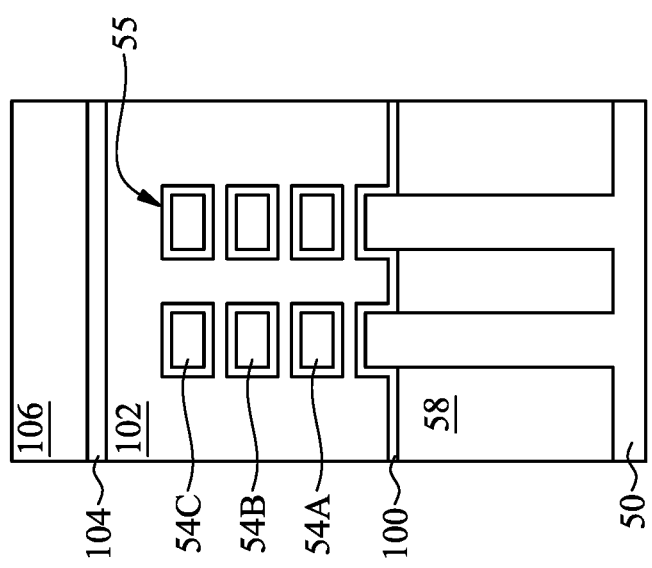
Figure 27D:
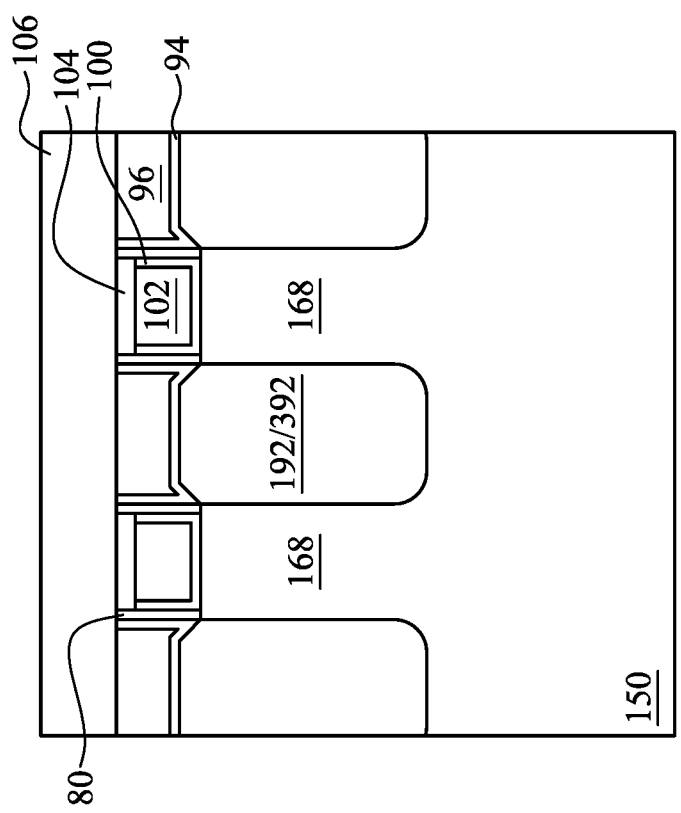
Figure 27C:
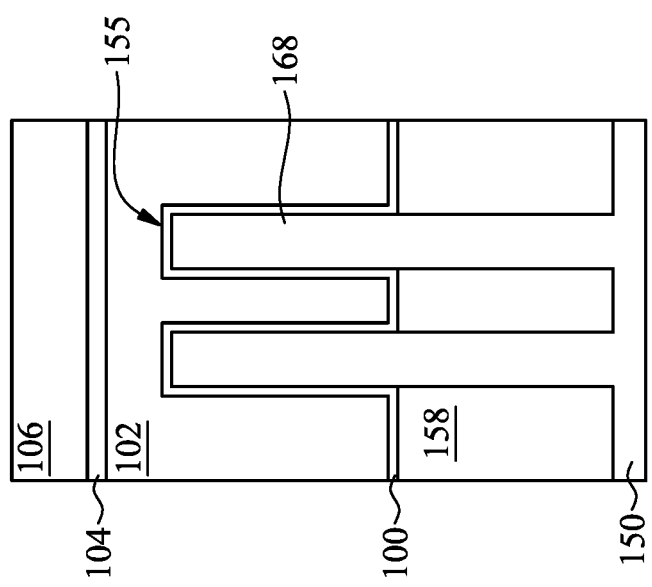
Figure 28B:
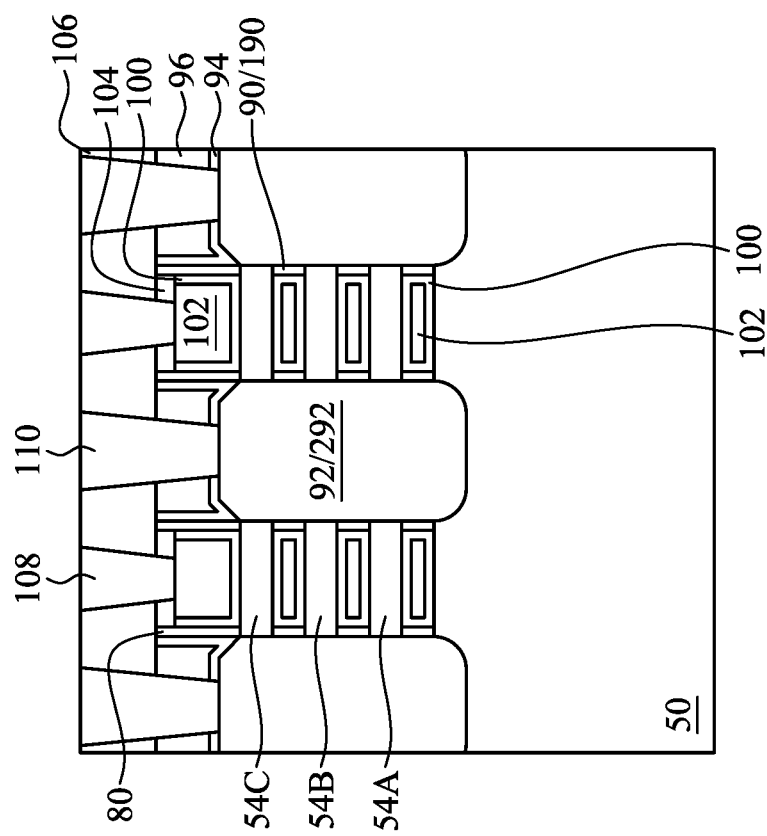
Figure 28A:
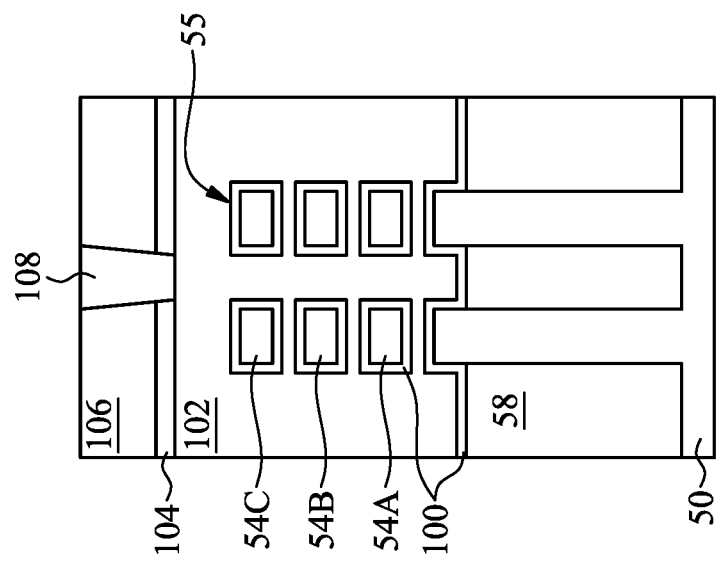
Figure 28D:
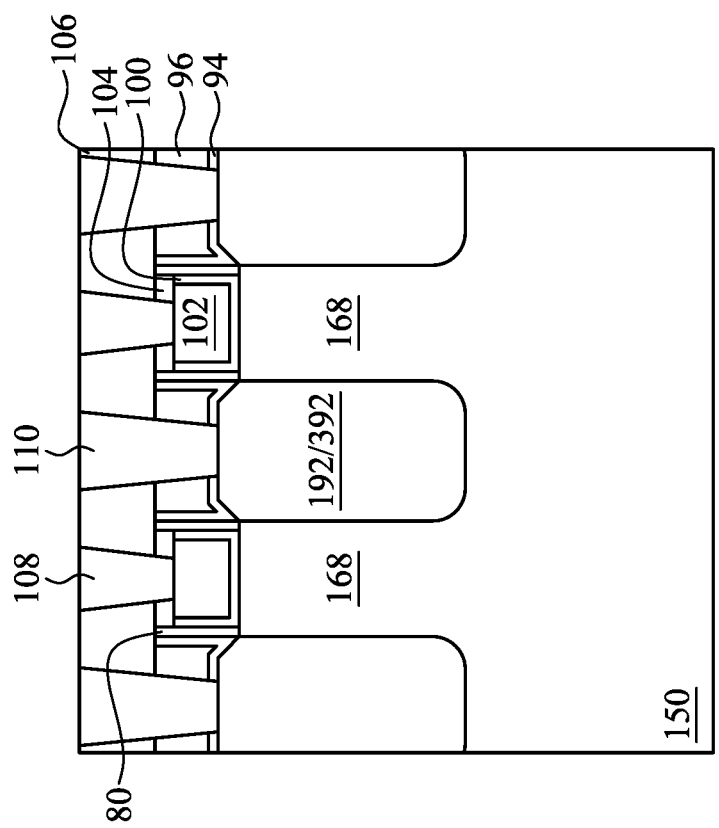
Figure 28C:
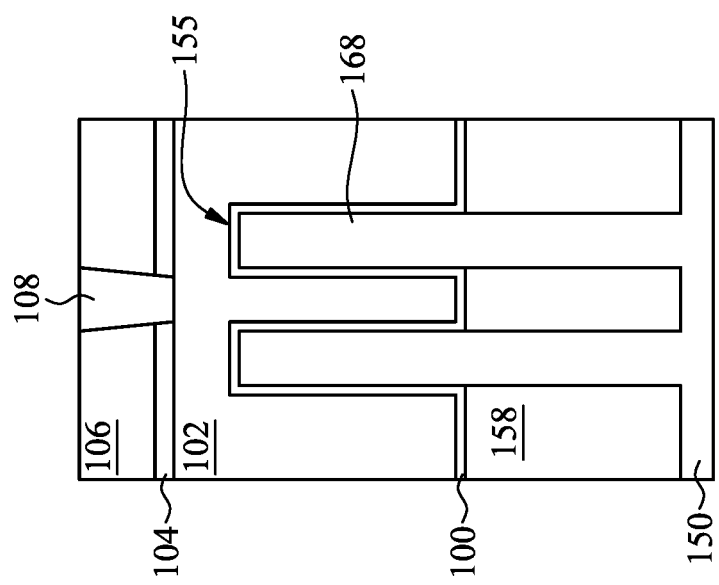

Further in FIGS. 25A and 25B, the first semiconductor layers 52A-52C are removed from the regions 50N/150N, extending the fifth recesses 486 in the regions 50N/150N. The first semiconductor layers 52A-52C may be removed by an isotropic etching process such as wet etching or the like. The first semiconductor layers 52A-52C may be removed using etchants which are selective to the materials of the first semiconductor layers 52A-52C, while the second semiconductor layers 54A-54C and the fins 155 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide ($NH_4OH$), or the like may be used to remove the first semiconductor layers 52A-52C.

In FIGS. 26A-26D, gate dielectric layers 100 and gate electrodes 102 are formed for replacement gates. The gate dielectric layers 100 are deposited conformally in the fifth recesses 486, such as on top surfaces and sidewalls of the nanostructures 55 and the fins 155 and on top surfaces, sidewalls, and bottom surfaces of the second semiconductor layers 54A-54C. The gate dielectric layers 100 may also be deposited on top surfaces of the first ILD 96, the CESL 94, the first spacer layer 80, and the STI regions 58. In accordance with some embodiments, the gate dielectric layers 100 comprise silicon oxide, silicon nitride, or multilayers thereof. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the fifth recesses 486. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 26A-26D, the gate electrodes 102 may comprise any number of liner layers, any number of work function tuning layers, and a fill material. After the filling of the fifth recesses 486, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gates of the resulting NSFETs and FinFETs. The gate electrodes 102 and the gate dielectric layers 100 may be collectively referred to as a "gate stack."

The formation of the gate dielectric layers 100 in the regions 50N/50P/150N/150P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials, and/or the gate electrodes 102 in each region may be formed by distinct processes, such that the gate electrodes 102 may be different materials. Various masking steps may be used to mask and expose appropriate regions when using distinct processes.

In FIGS. 27A-27D, a second ILD 106 is deposited over the first ILD 96. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In accordance with some embodiments, before the formation of the second ILD 106, the gate stack (including the gate dielectric layers 100 and the corresponding overlying gate electrodes 102) is recessed, so that a recess is formed directly over the gate stack and between opposing portions of first spacer layer 80. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 108, discussed below with respect to FIGS. 28A-28D) penetrate through the gate mask 104 to contact the top surface of the recessed gate electrodes 102.

In FIGS. 28A-28D, gate contacts 108 and source/drain contacts 110 are formed. Openings for the source/drain contacts 110 are formed through the second ILD 106 and the first ILD 96, and openings for the gate contacts 108 are formed through the second ILD 106 and the gate mask 104. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the source/drain contacts 110 and gate contacts 108 in the openings. Anneal processes may be performed to form silicides at interfaces between the source/drain contacts 110 and the first epitaxial source/drain regions 92, the second epitaxial source/drain regions 192, the third epitaxial source/drain regions 292, and the fourth epitaxial source/drain regions 392. The source/drain contacts 110 are physically and electrically coupled to the first epitaxial source/drain regions 92, the second epitaxial source/drain regions 192, the third epitaxial source/drain regions 292, and the fourth epitaxial source/drain regions 392, and the gate contacts 108 are physically and electrically coupled to the gate electrodes 102. The source/drain contacts 110 and the gate contacts 108 may be formed in different processes, or may be formed in the same process. Although shown as being formed in the same cross-sections, it should be appreciated that each of the source/drain contacts 110 and the gate contacts 108 may be formed in different cross-sections, which may avoid shorting of the contacts.

As discussed previously, the first inner spacers 90 and the second inner spacers 190 may be formed having different thicknesses and may be formed of different materials. This improves device performance and reduces device defects. The first epitaxial source/drain regions 92, the second epitaxial source/drain regions 192, the third epitaxial source/drain regions 292, and the fourth epitaxial source/drain regions 392 may be formed with different fin sidewall heights, which may prevent bridging between adjacent epitaxial source/drain regions while. This also improves device performance and reduces device defects. Furthermore, etching the first recesses 86 and the third recesses 286 to depths greater than the second recesses 186 and the fourth recesses 386 prevents tiger tooth profiles from being formed in the first epitaxial source/drain regions 92 and the third epitaxial source/drain regions 292, which further improves device performance and reduces device defects.

FIGS. 29A-35C illustrate embodiments in which first epitaxial source/drain regions 92' are deposited separately from second epitaxial source/drain regions 192' and third epitaxial source/drain regions 292' are deposited separately from fourth epitaxial source/drain regions 392'. The steps leading up to FIG. 29A may be the same as or similar to those illustrated in FIGS. 2A-11; therefore, these steps and intermediate structures are not separately illustrated for the additional embodiments.

Figure 29A:
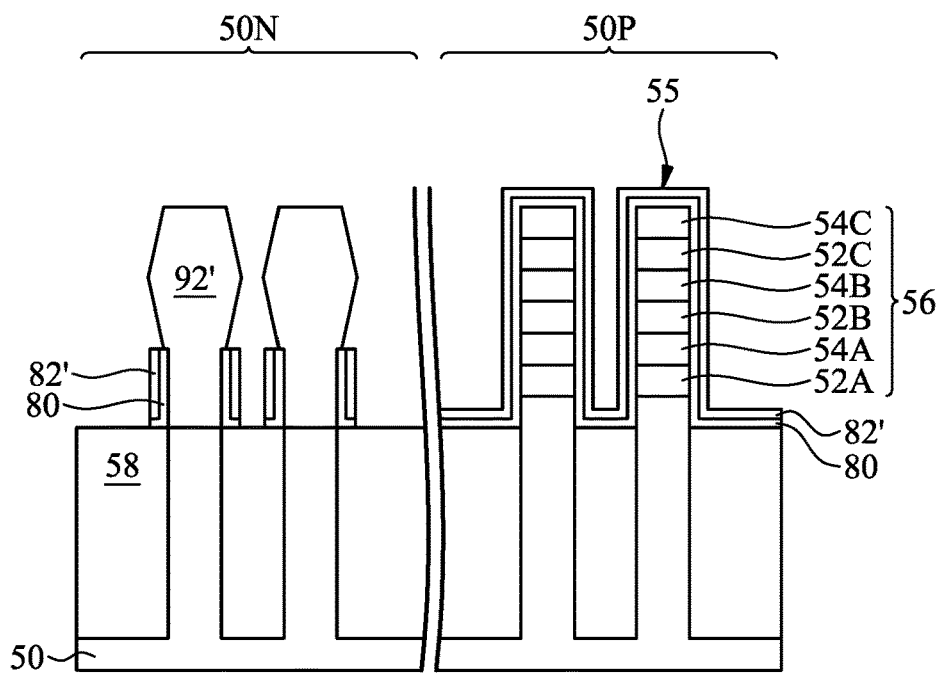
Figure 29B:
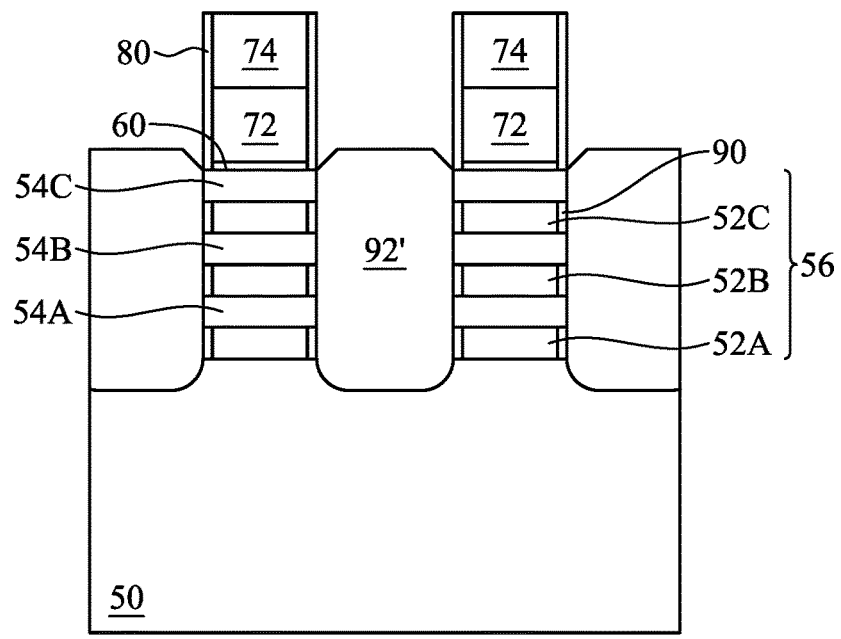
Figure 29C:
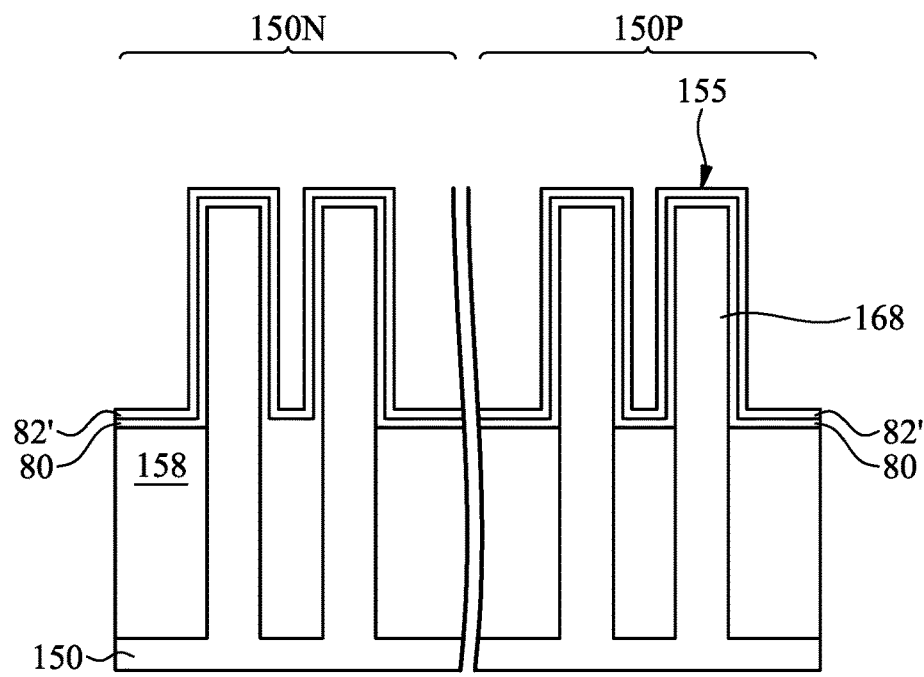

In FIGS. 29A-29C first epitaxial source/drain regions 92' are formed in the first recesses 86 to exert stress on the second semiconductor layers 54A-54C of the nanostructures 55 in the region 50N, thereby improving performance. As illustrated in FIGS. 29A and 29C, a second spacer layer 82' covers the regions 50P/150N/150P. The second spacer layer 82' prevents deposition of the first epitaxial source/drain regions 92' in undesired areas, such as in the regions 50P/150N/150P. As illustrated in FIGS. 29A and 29B, the first epitaxial source/drain regions 92' may be deposited in the region 50N. The first epitaxial source/drain regions 92' may be formed of the same or similar materials and by the same or similar methods as the first epitaxial source/drain regions 92, discussed above in reference to FIGS. 14A and 14B.

Figure 30A:
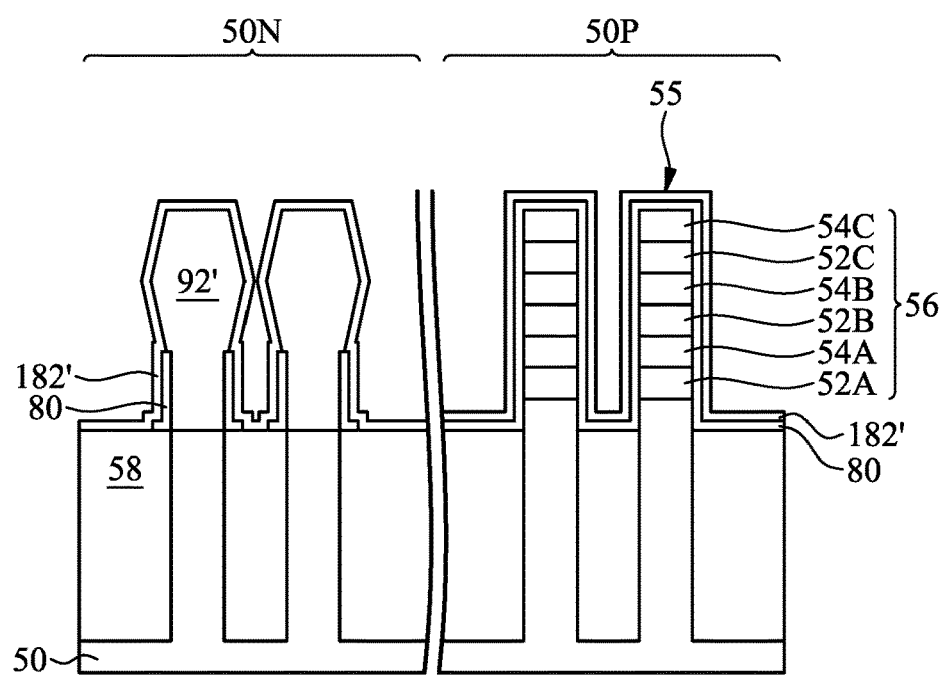
Figure 30B:
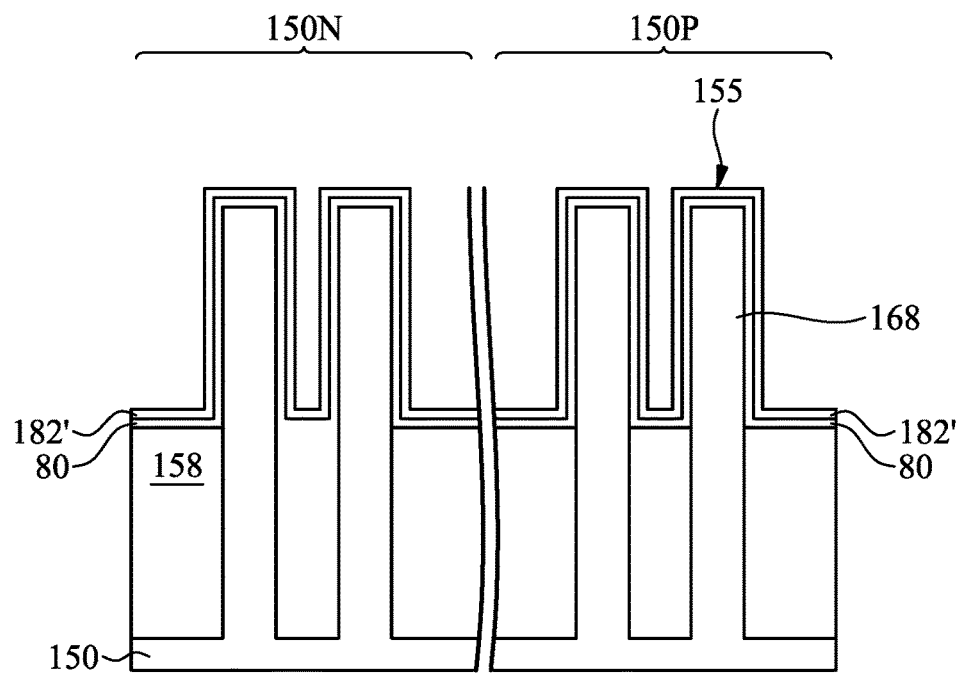

In FIGS. 30A and 30B, the second spacer layer 82' is removed and a third spacer layer 182' is deposited over the first spacer layer 80, the first epitaxial source/drain regions 92', and the STI regions 58. The second spacer layer 82' may be removed using a suitable etching process, such as isotropic etching (e.g., a wet etch process), anisotropic etching (e.g., a dry etch process), or the like. The third spacer layer 182' may be deposited by CVD, ALD, or the like. The third spacer layer 182' may be formed of silicon oxide, silicon nitride, silicon oxynitride, or the like. After the third spacer layer 182' is deposited, steps the same as or similar to those illustrated in FIGS. 12A-13B are performed.

Figure 31A:
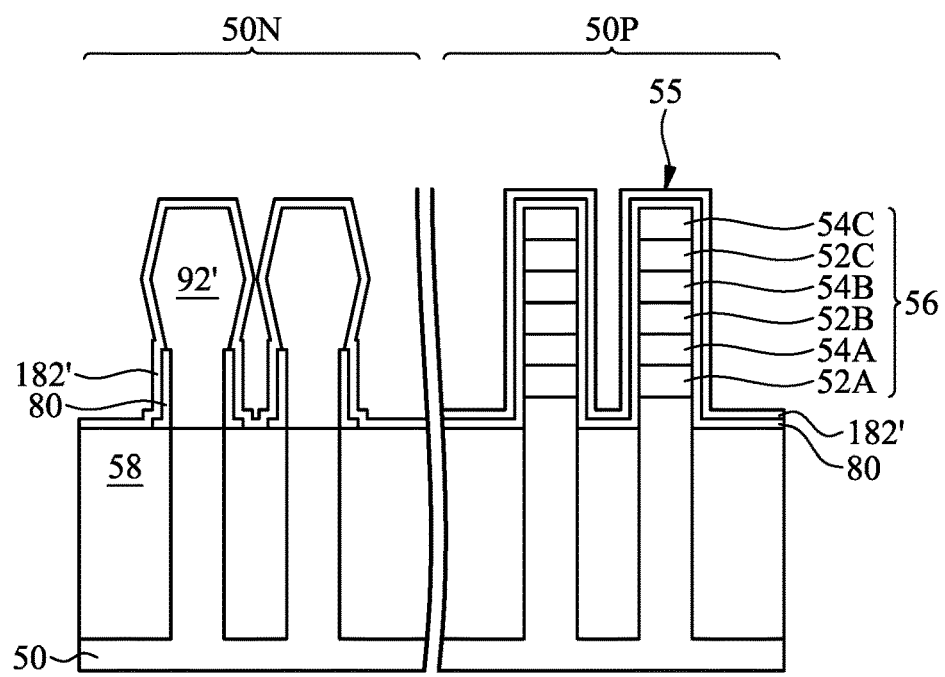
Figure 31B:
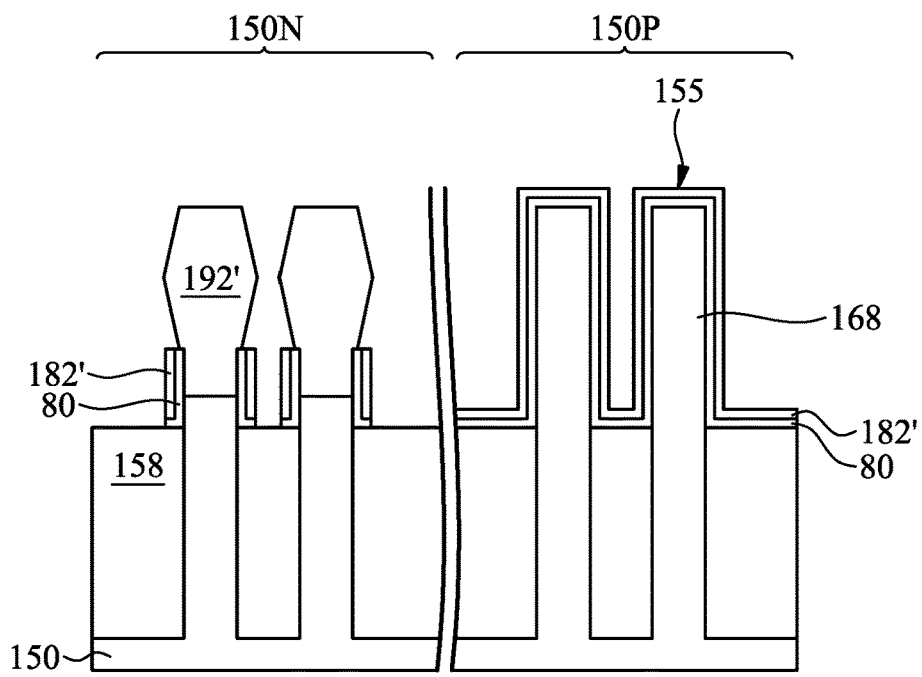
Figure 31C:
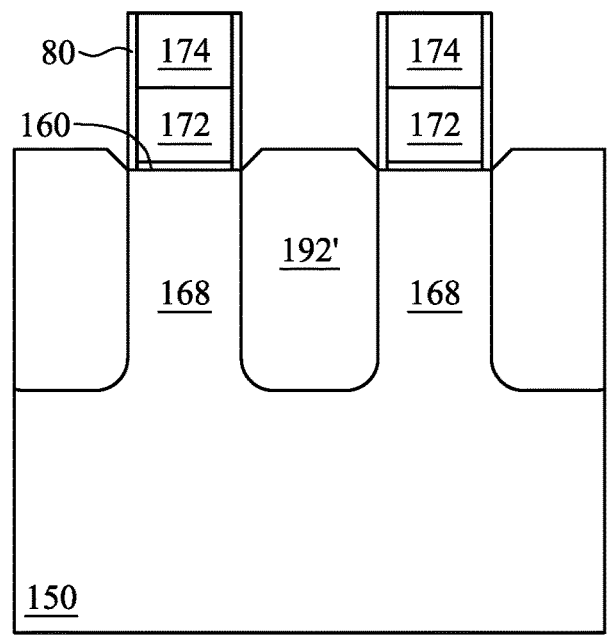

In FIGS. 31A-31C second epitaxial source/drain regions 192' are formed in the second recesses 186 to exert stress on the channel regions 168 of the fins 155 in the region 150N, thereby improving performance. As illustrated in FIGS. 31A and 31B, the third spacer layer 182' covers the regions 50N/50P/150P. The third spacer layer 182' prevents deposition of the second epitaxial source/drain regions 192' in undesired areas, such as in the regions 50N/50P/150P. As illustrated in FIGS. 31B and 31C, the second epitaxial source/drain regions 192' may be deposited in the region 150N. The second epitaxial source/drain regions 192' may be formed of the same or similar materials and by the same or similar methods as the second epitaxial source/drain regions 192, discussed above in reference to FIGS. 14C and 14D.

Figure 32A:
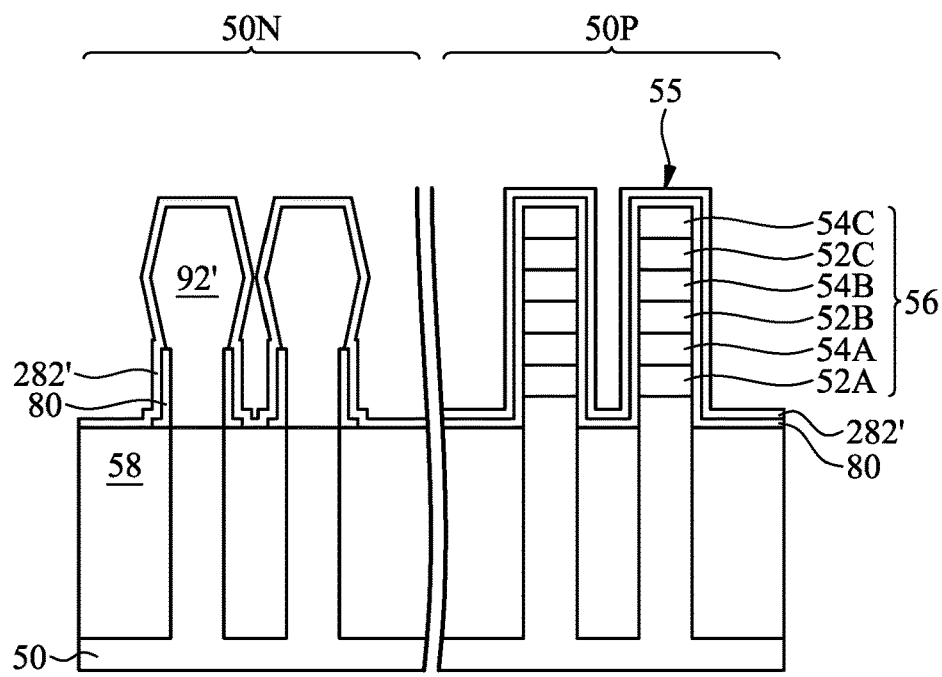
Figure 32B:
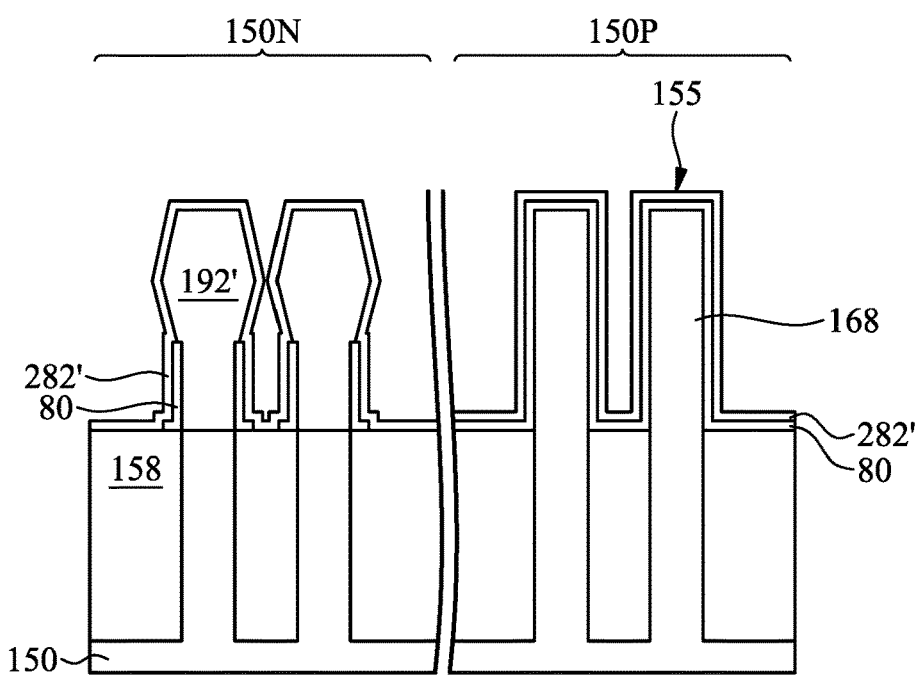

In FIGS. 32A and 32B, the third spacer layer 182' is removed and a fourth spacer layer 282' is deposited over the first spacer layer 80, the first epitaxial source/drain regions 92', the second epitaxial source/drain regions 192', and the STI regions 58. The third spacer layer 182' may be removed using a suitable etching process, such as isotropic etching (e.g., a wet etch process), anisotropic etching (e.g., a dry etch process), or the like. The fourth spacer layer 282' may be deposited by CVD, ALD, or the like. The fourth spacer layer 282' may be formed of silicon oxide, silicon nitride, silicon oxynitride, or the like. After the fourth spacer layer 282' is deposited, steps the same as or similar to those illustrated in FIGS. 15A-19 are performed.

Figure 33A:
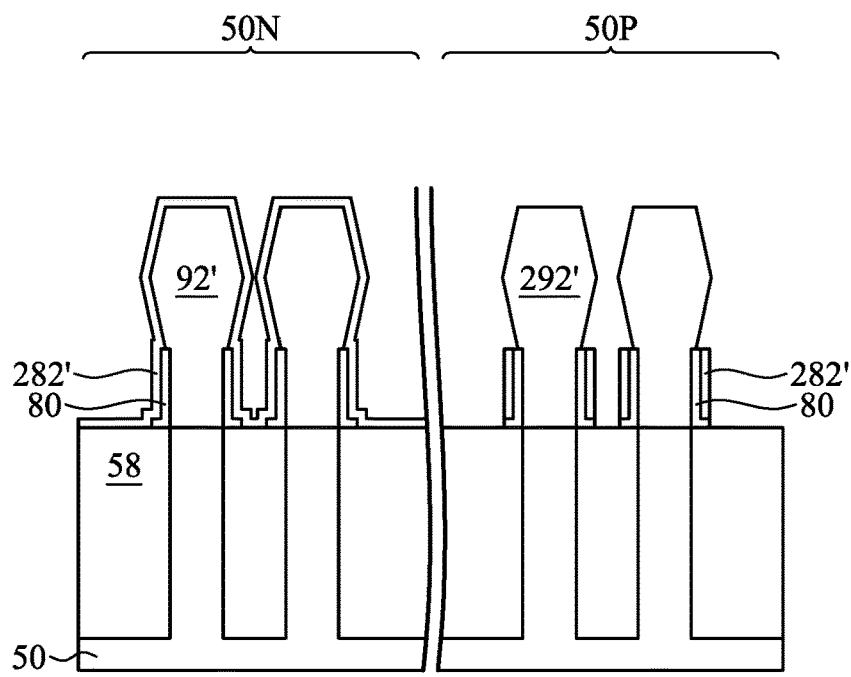
Figure 33B:
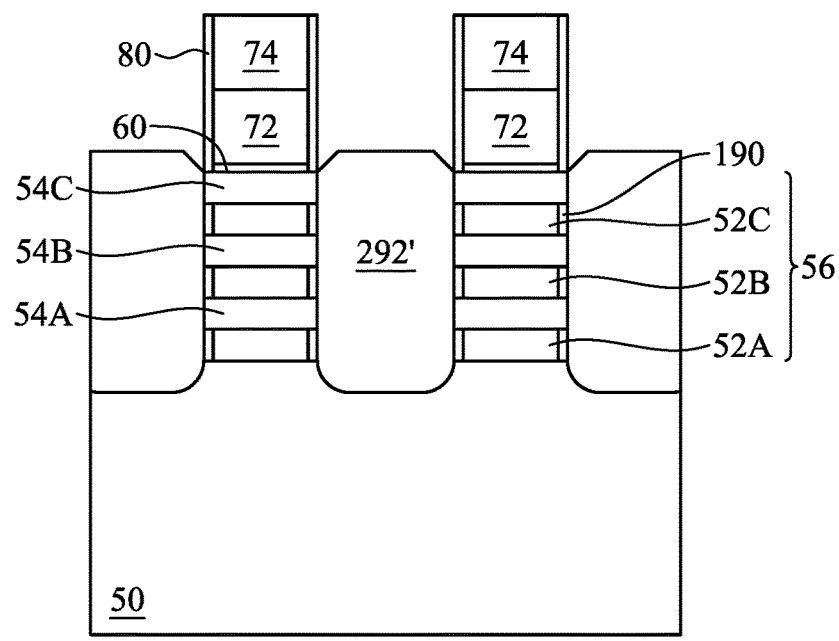
Figure 33C:
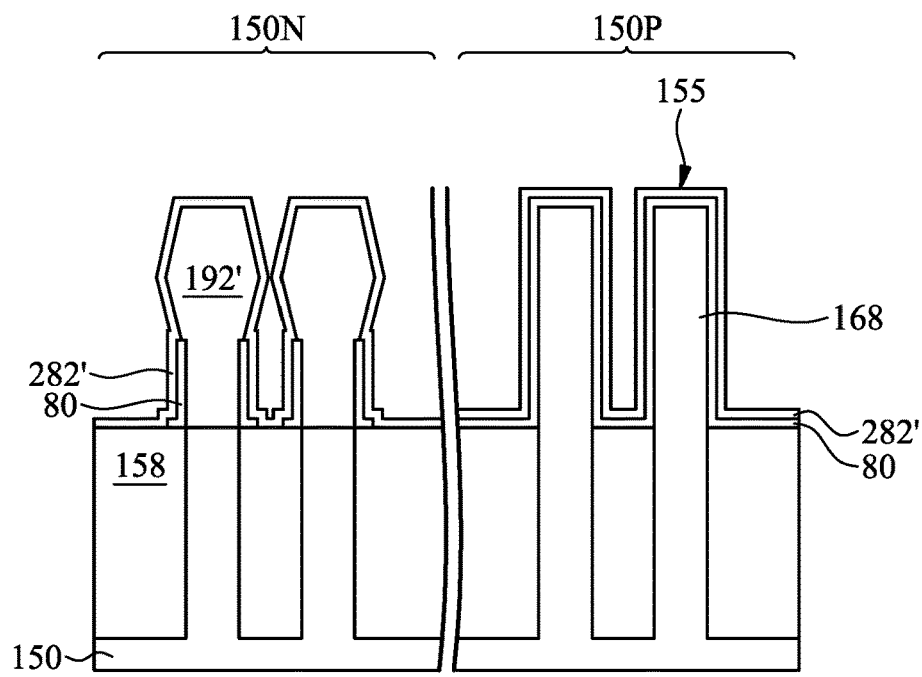

In FIGS. 33A-33C third epitaxial source/drain regions 292' are formed in the third recesses 286 to exert stress on the second semiconductor layers 54A-54C of the nanostructures 55 in the region 50P, thereby improving performance. As illustrated in FIGS. 33A and 33C, the fourth spacer layer 282' covers the regions 50N/150P/150N. The fourth spacer layer 282' prevents deposition of the third epitaxial source/drain regions 292' in undesired areas, such as in the regions 50N/150P/150N. As illustrated in FIGS. 33A and 33B, the third epitaxial source/drain regions 292' may be deposited in the region 50P. The third epitaxial source/drain regions 292' may be formed of the same or similar materials and by the same or similar methods as the third epitaxial source/drain regions 292, discussed above in reference to FIGS. 22A and 22B.

Figure 34A:
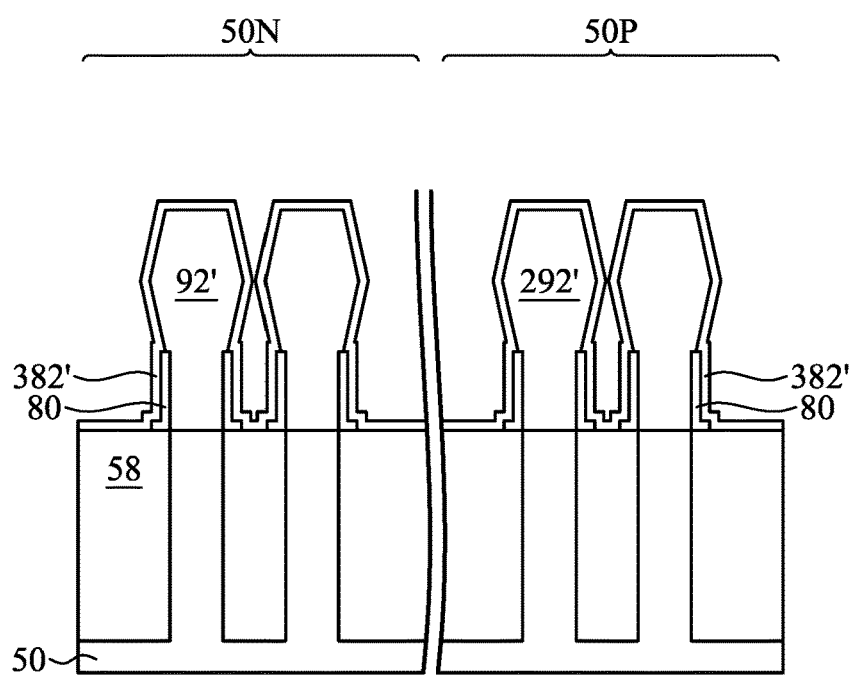
Figure 34B:
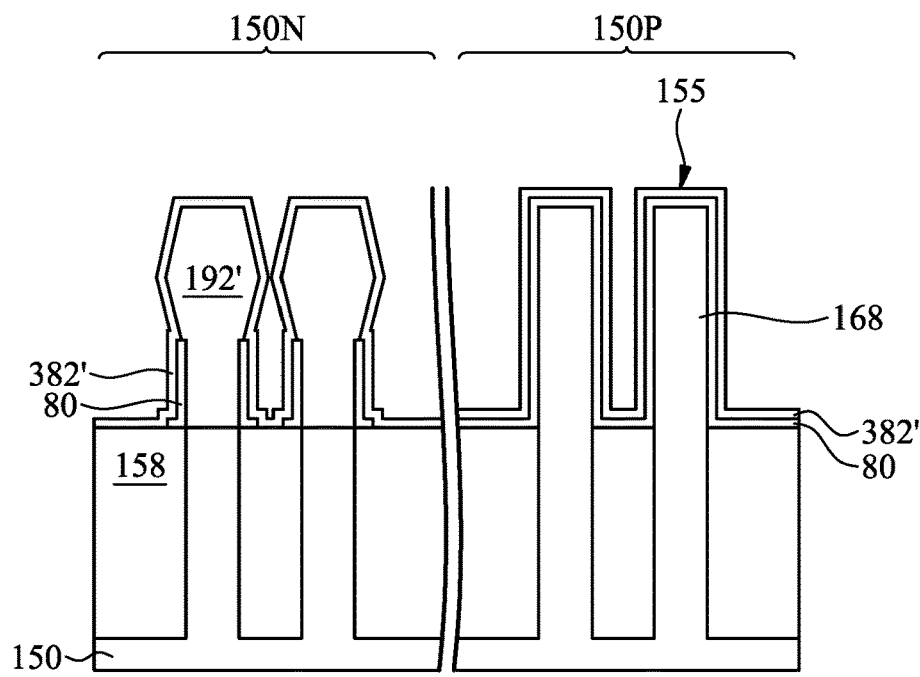

In FIGS. 34A and 34B, the fourth spacer layer 282' is removed and a fifth spacer layer 382' is deposited over the first spacer layer 80, the first epitaxial source/drain regions 92', the second epitaxial source/drain regions 192', the third epitaxial source/drain regions 292', and the STI regions 58. The fourth spacer layer 282' may be removed using a suitable etching process, such as isotropic etching (e.g., a wet etch process), anisotropic etching (e.g., a dry etch process), or the like. The fifth spacer layer 382' may be deposited by CVD, ALD, or the like. The fifth spacer layer 382' may be formed of silicon oxide, silicon nitride, silicon oxynitride, or the like. After the fifth spacer layer 382' is deposited, steps the same as or similar to those illustrated in FIGS. 20A-21B are performed.

Figure 35A:
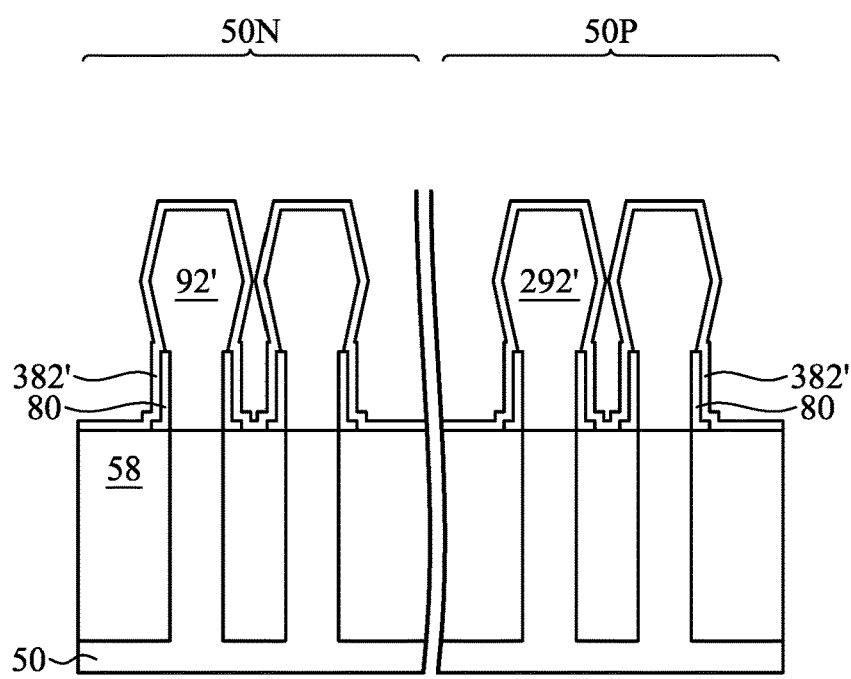
Figure 35B:
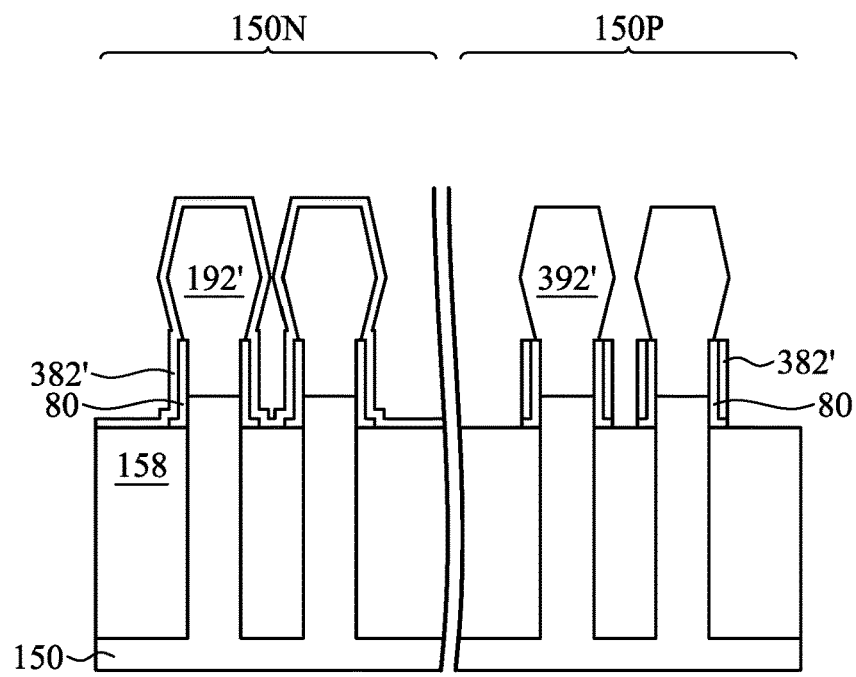
Figure 35C:
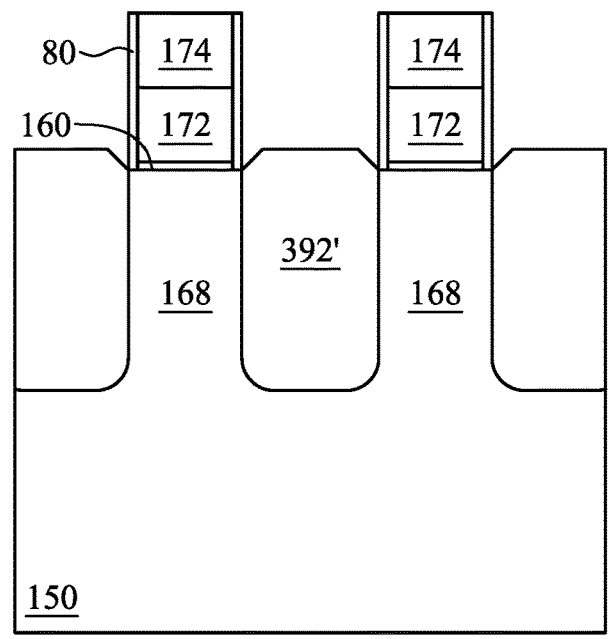

In FIGS. 35A-35C, fourth epitaxial source/drain regions 392' are formed in the fourth recesses 386 to exert stress on the channel regions 168 of the fins 155 in the region 150P, thereby improving performance. As illustrated in FIGS. 35A and 35B, the fifth spacer layer 382' covers the regions 50N/50P/150N. The fifth spacer layer 382' prevents deposition of the fourth epitaxial source/drain regions 392' in undesired areas, such as in the regions 50N/50P/150N. As illustrated in FIGS. 35B and 35C, the fourth epitaxial source/drain regions 392' may be deposited in the region 150P. The fourth epitaxial source/drain regions 392' may be formed of the same or similar materials and by the same or similar methods as the fourth epitaxial source/drain regions 392, discussed above in reference to FIGS. 22C and 22D.

After the fourth epitaxial source/drain regions 392' are deposited, steps the same as or similar to those illustrated in FIGS. 23A-28D are performed. Although FIGS. 29A-35C describe the first epitaxial source/drain regions 92', the second epitaxial source/drain regions 192', the third epitaxial source/drain regions 292', and the fourth epitaxial source/drain regions 392' being formed in order, a person of skill in the art will understand that the first epitaxial source/drain regions 92', the second epitaxial source/drain regions 192', the third epitaxial source/drain regions 292', and the fourth epitaxial source/drain regions 392' may be formed in any order.

FIGS. 36A-39B illustrate detailed views of first epitaxial source/drain regions 92, second epitaxial source/drain regions 192, third epitaxial source/drain regions 292, and fourth epitaxial source/drain regions 392, in accordance with various embodiments. The first epitaxial source/drain regions 92, the second epitaxial source/drain regions 192, the third epitaxial source/drain regions 292, and the fourth epitaxial source/drain regions 392 may each comprise multiple layers of semiconductor materials. The first epitaxial source/drain regions 92, the second epitaxial source/drain regions 192, the third epitaxial source/drain regions 292, and the fourth epitaxial source/drain regions 392 may be formed using any of the above-described embodiments and may have any of the corresponding structures illustrated in FIGS. 36A-39B.

Figure 36A:
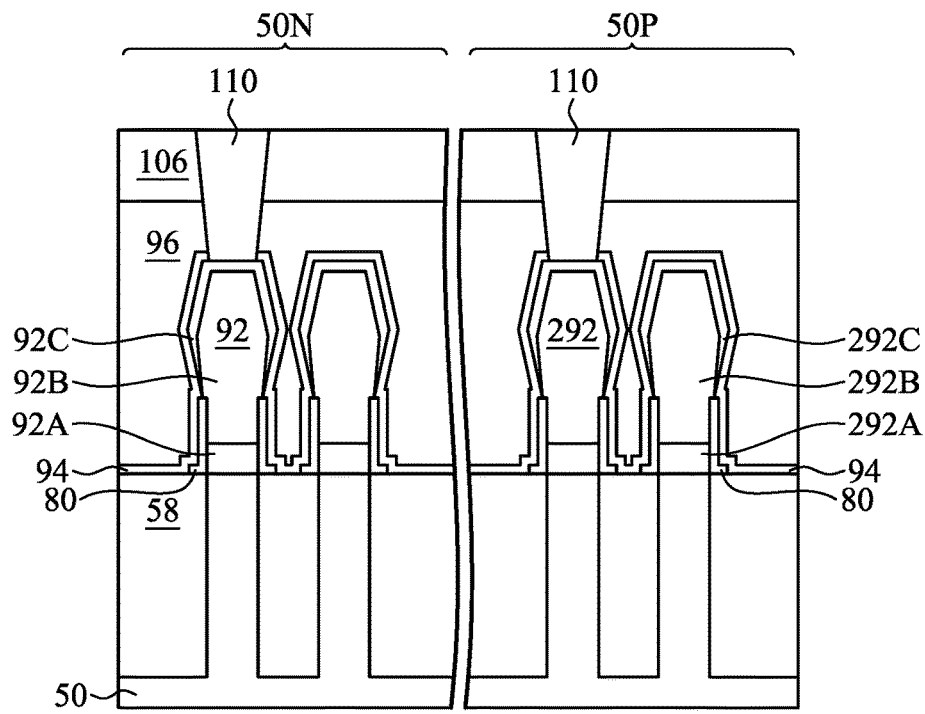
Figure 36B:
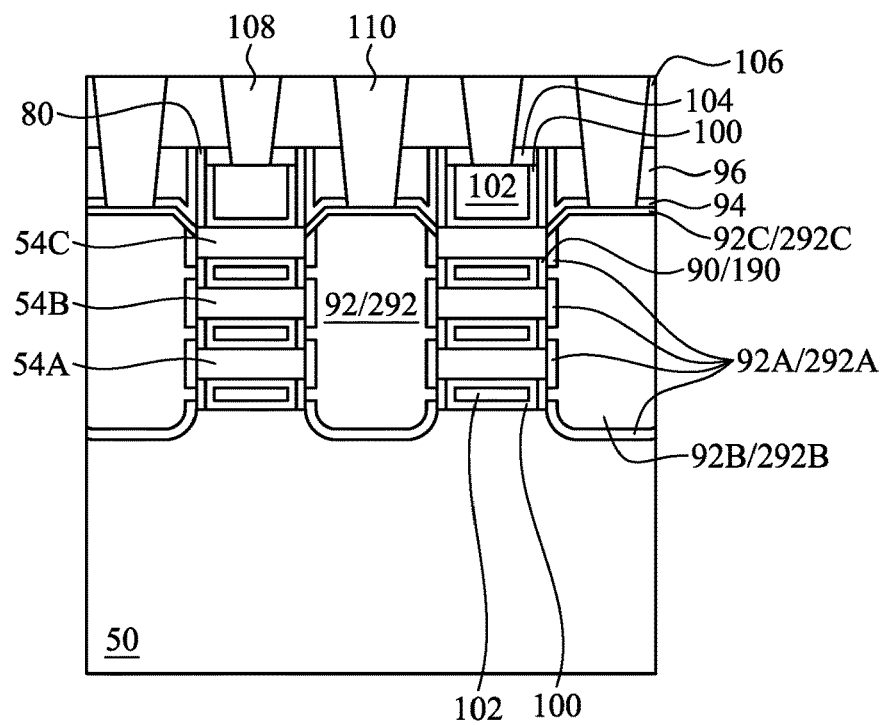

In FIGS. 36A and 36B, first epitaxial source/drain regions 92 may comprise a first semiconductor material layer 92A, a second semiconductor material layer 92B over the first semiconductor material layer 92A, and a third semiconductor material layer 92C over the second semiconductor material layer 92B. Each of the first semiconductor material layer 92A, the second semiconductor material layer 92B, and the third semiconductor material layer 92C may be epitaxially grown. The first semiconductor material layer 92A may comprise a doped semiconductor material, such as silicon doped with carbon, arsenic, phosphide, or the like. The first semiconductor material layer 92A may have a dopant concentration (e.g., a concentration of carbon [C], phosphide [P], or arsenic [As]) from about $1\times10^{19}$ atoms/cm$^3$ to about $1\times10^{21}$ atoms/cm$^3$, such as about $5\times10^{20}$ atoms/cm$^3$. The second semiconductor material layer 92B may comprise a doped semiconductor material, such as silicon doped with phosphide or the like. The second semiconductor material layer 92B may have a dopant concentration greater than the first semiconductor material layer 92A. For example, the second semiconductor material layer 92B may have a dopant concentration from about from about $1\times10^{21}$ atoms/cm$^3$ to about $5\times10^{21}$ atoms/cm$^3$, such as about $3\times10^{21}$ atoms/cm$^3$. The third semiconductor material layer 92C may comprise a doped semiconductor material, such as silicon doped with phosphide or the like. The third semiconductor material layer 92C may have a dopant concentration less than the first semiconductor material layer 92A. For example, the third semiconductor material layer 92C may have a dopant concentration from about from about $1\times10^{19}$ atoms/cm$^3$ to about $5\times10^{20}$ atoms/cm$^3$, such as about $3\times10^{20}$ atoms/cm$^3$. The first semiconductor material layer 92A may be selectively grown from second semiconductor layers 54A-54C and the substrate 50. As illustrated in FIG. 36B, portions of the first semiconductor material layer 92A grown from separate second semiconductor layers 54A-54C and the substrate may not merge with one another. The first semiconductor material layer 92A may have a thickness from about 1 nm to about 5 nm, such as about 3 nm. An unmerged first semiconductor material layer 92A may be used to improve the quality of the first epitaxial source/drain regions 92, improving device performance and reducing device defects.

The third epitaxial source/drain regions 292 may comprise a first semiconductor material layer 292A, a second semiconductor material layer 292B over the first semiconductor material layer 292A, and a third semiconductor material layer 292C over the second semiconductor material layer 292B. Each of the first semiconductor material layer 292A, the second semiconductor material layer 292B, and the third semiconductor material layer 292C may be epitaxially grown. The first semiconductor material layer 292A may comprise a semiconductor material such as silicon, a doped semiconductor material, such as silicon doped with boron or silicon germanium doped with boron, or the like. The first semiconductor material layer 292A may have a dopant concentration (e.g., a concentration of boron [B] or the like) from about $1\times10^{20}$ atoms/cm$^3$ to about $1.5\times10^{21}$ atoms/cm$^3$, such as about $5\times10^{20}$ atoms/cm$^3$. In embodiments in which the first semiconductor material layer 292A comprises silicon germanium, the first semiconductor material layer 292A may have an atomic concentration of germanium less than about 30 percent, such as about 15 percent. The second semiconductor material layer 292B may comprise a doped semiconductor material, such as silicon germanium doped with boron or the like. The second semiconductor material layer 292B may have a dopant concentration from about $1\times10^{20}$ atoms/cm$^3$ to about $1.5\times10^{21}$ atoms/cm$^3$, such as about $5\times10^{20}$ atoms/cm$^3$. The second semiconductor material layer 292B may have a germanium concentration greater than the first semiconductor material layer 292A. For example, the second semiconductor material layer 292B may have an atomic concentration of germanium from about 30 percent to about 60 percent, such as about 55 percent. The second semiconductor material layer 292B may have a gradient concentration both germanium and boron. The third semiconductor material layer 292C may comprise a semiconductor material such as silicon, silicon germanium, or the like. The third semiconductor material layer 292C may have a lower germanium concentration than the first semiconductor material layer 292A. For example, the third semiconductor material layer 292C may have an atomic concentration of germanium less than about 20 percent, such as about 10 percent. The first semiconductor material layer 292A may be selectively grown from second semiconductor layers 54A-54C and the substrate 50. As illustrated in FIG. 36B, portions of the first semiconductor material layer 292A grown from separate second semiconductor layers 54A-54C and the substrate 50 may not merge with one another. The first semiconductor material layer 292A may have a thickness from about 2 nm to about 5 nm, such as about 4 nm. An unmerged first semiconductor material layer 292A may be used to improve the quality of the third epitaxial source/drain regions 292, improving device performance and reducing device defects.

Figure 37A:
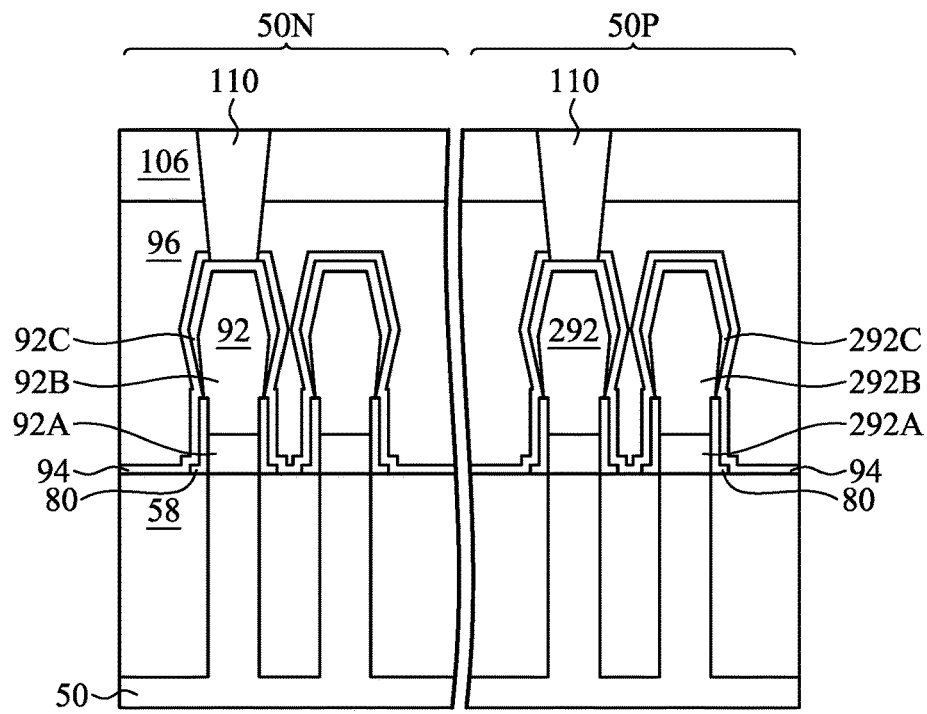
Figure 37B:
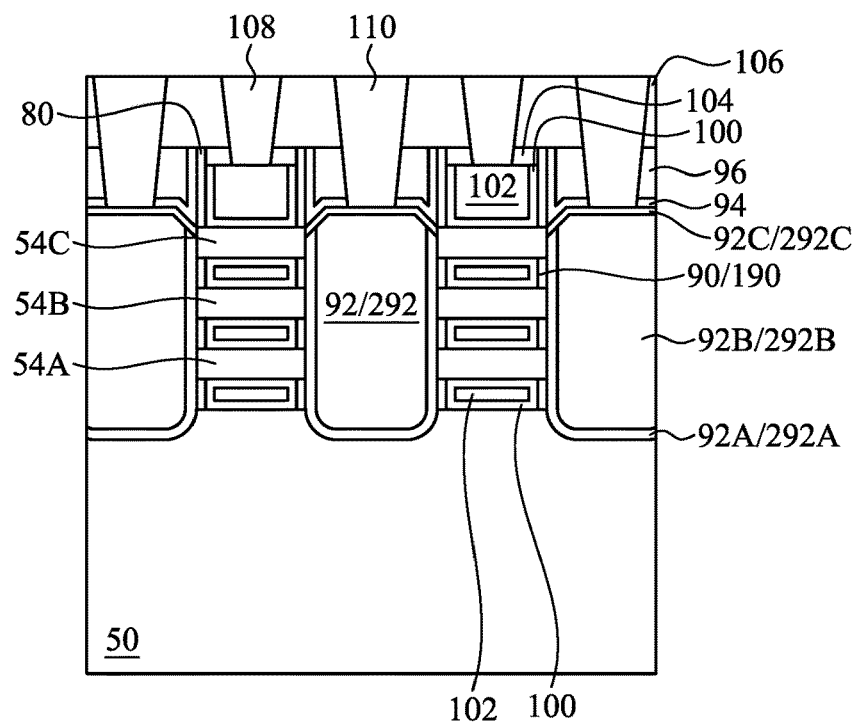

In FIGS. 37A and 37B, first epitaxial source/drain regions 92 may be formed with a first semiconductor material layer 92A having a greater thickness than the first semiconductor material layer 92A illustrated in FIGS. 36A and 36B. For example, the first semiconductor material layer 92A may have a thickness from about 2 nm to about 8 nm, such as about 6 nm. Because of the increased thickness of the first semiconductor material layer 92A, portions of the first semiconductor material layer 92A selectively grown from separate second semiconductor layers 54A-54C and the substrate 50 may merge, as illustrated in FIG. 37B.

Further in FIGS. 37A and 37B, third epitaxial source/drain regions 292 may be formed with a first semiconductor material layer 292A having a greater thickness than the first semiconductor material layer 292A illustrated in FIGS. 36A and 36B. For example, the first semiconductor material layer 292A may have a thickness from about 4 nm to about 8 nm, such as about 6 nm. Because of the increased thickness of the first semiconductor material layer 292A, portions of the first semiconductor material layer 292A selectively grown from separate second semiconductor layers 54A-54C and the substrate 50 may merge, as illustrated in FIG. 37B.

Figure 38A:
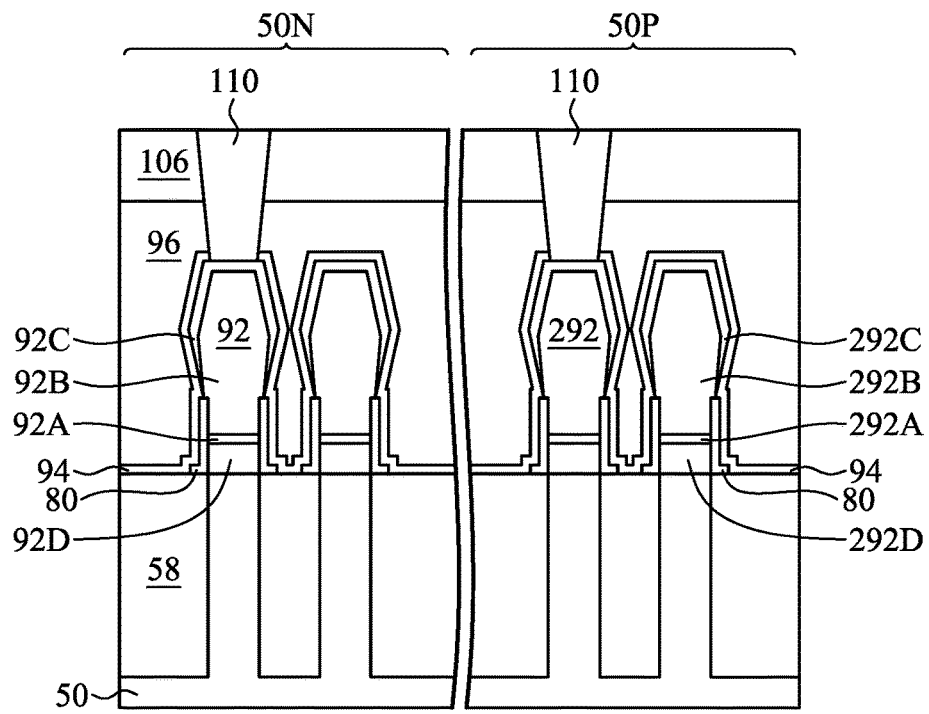
Figure 38B:
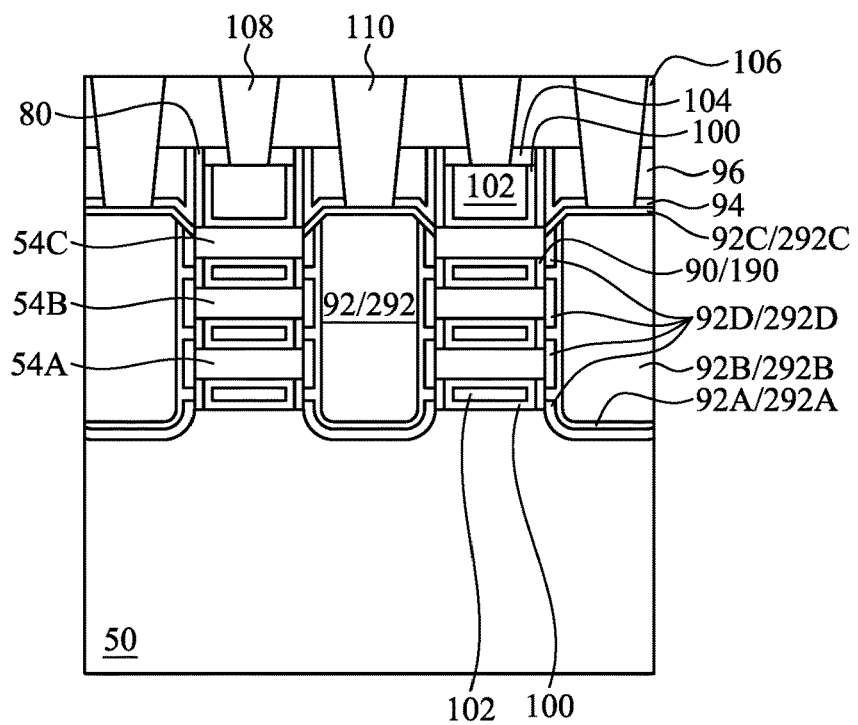

In FIGS. 38A and 38B, a fourth semiconductor material layer 92D is epitaxially grown on the second semiconductor layers 54A-54C and the substrate 50 and the first semiconductor material layer 92A is then epitaxially grown on the fourth semiconductor material layer 92D. The fourth semiconductor material layer 92D may comprise a semiconductor material, such as silicon, a doped semiconductor material, such as arsenic-doped silicon, or the like. The fourth semiconductor material layer 92D may have a dopant concentration (e.g., a concentration of arsenic [As] or the like) from about $1\times10^{20}$ atoms/cm$^3$ to about $2\times10^{21}$ atoms/cm$^3$, such as about $5\times10^{20}$ atoms/cm$^3$. The fourth semiconductor material layer 92D may have a thickness less than about 5 nm, such as about 2 nm. The first semiconductor material layer 92A may have a thickness from about 1 nm to about 5 nm, such as about 3 nm. Although various portions of the fourth semiconductor material layer 92D are illustrated as being unmerged, in some embodiments, the various portions of the fourth semiconductor material layer 92D may be merged, similar to the first semiconductor material layer 92A illustrated in FIG. 37B.

Further in FIGS. 38A and 38B, a fourth semiconductor material layer 292D is epitaxially grown on the second semiconductor layers 54A-54C and the substrate 50 and the first semiconductor material layer 292A is then epitaxially grown on the fourth semiconductor material layer 292D. The fourth semiconductor material layer 292D may comprise a semiconductor material, such as silicon, a doped semiconductor material, such as boron-doped silicon, or the like. The fourth semiconductor material layer 292D may have a dopant concentration (e.g., a concentration of boron [B] or the like) from about $1\times10^{20}$ atoms/cm$^3$ to about $2\times10^{21}$ atoms/cm$^3$, such as about $5\times10^{20}$ atoms/cm$^3$. The fourth semiconductor material layer 292D may have a thickness less than about 5 nm, such as about 2 nm. The first semiconductor material layer 292A may have a thickness from about 2 nm to about 5 nm, such as about 4 nm. Although various portions of the fourth semiconductor material layer 292D are illustrated as being unmerged, in some embodiments, the various portions of the fourth semiconductor material layer 292D may be merged, similar to the first semiconductor material layer 292A illustrated in FIG. 37B.

The fourth semiconductor material layer 92D and the fourth semiconductor material layer 292D may be included in order to increase merge windows for the first semiconductor material layer 92A and the first semiconductor material layer 292A. This provides that the first semiconductor material layer 92A and the first semiconductor material layer 292A merge with smaller thicknesses and provides improved device performance and reduced device defects.

Figure 39A:
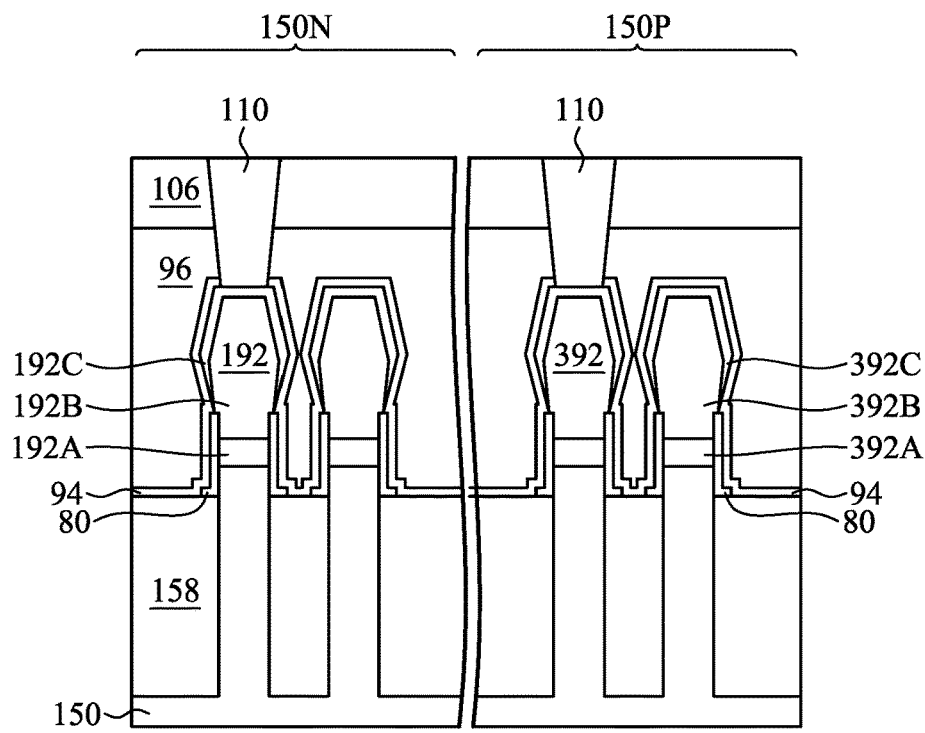
Figure 39B:
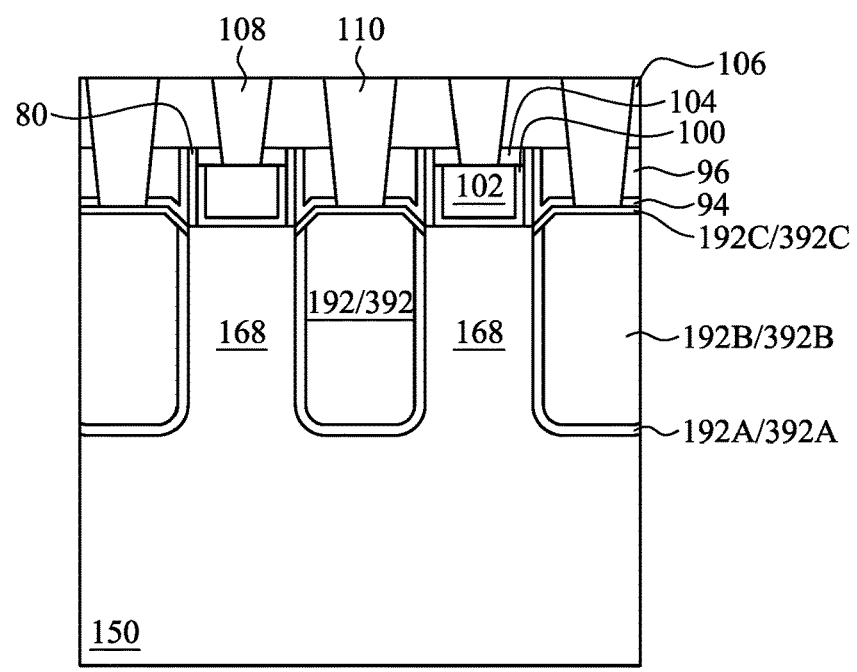

In FIGS. 39A and 39B, second epitaxial source/drain regions 192 may comprise a first semiconductor material layer 192A, a second semiconductor material layer 192B over the first semiconductor material layer 192A, and a third semiconductor material layer 192C over the second semiconductor material layer 192B. Each of the first semiconductor material layer 192A, the second semiconductor material layer 192B, and the third semiconductor material layer 192C may be epitaxially grown. The first semiconductor material layer 192A may comprise a doped semiconductor material, such as silicon doped with carbon, arsenic, phosphide, or the like. The first semiconductor material layer 192A may have a dopant concentration (e.g., a concentration of carbon [C], phosphide [P], or arsenic [As]) from about $1\times10^{19}$ atoms/cm$^3$ to about $1\times10^{21}$ atoms/cm$^3$, such as about $5\times10^{20}$ atoms/cm$^3$. The second semiconductor material 192B may comprise a doped semiconductor material, such as silicon doped with phosphide or the like. The second semiconductor material layer 192B may have a dopant concentration greater than the first semiconductor material layer 192A. For example, the second semiconductor material layer 192B may have a dopant concentration from about from about $1\times10^{21}$ atoms/cm$^3$ to about $5\times10^{21}$ atoms/cm$^3$, such as about $3\times10^{21}$ atoms/cm$^3$. The third semiconductor material layer 192C may comprise a doped semiconductor material, such as silicon doped with phosphide or the like. The third semiconductor material layer 192C may have a dopant concentration less than the first semiconductor material layer 192A. For example, the third semiconductor material layer 192C may have a dopant concentration from about from about $1\times10^{19}$ atoms/cm$^3$ to about $5\times10^{20}$ atoms/cm$^3$, such as about $3\times10^{20}$ atoms/cm$^3$. The first semiconductor material layer 192A may be selectively grown from channel regions 168 over the substrate 150. The first semiconductor material layer 192A may have a thickness from about 1 nm to about 5 nm, such as about 3 nm.

The fourth epitaxial source/drain regions 392 may comprise a first semiconductor material layer 392A, a second semiconductor material layer 392B over the first semiconductor material layer 392A, and a third semiconductor material layer 392C over the second semiconductor material layer 392B. Each of the first semiconductor material layer 392A, the second semiconductor material layer 392B, and the third semiconductor material layer 392C may be epitaxially grown. The first semiconductor material layer 392A may comprise a semiconductor material such as silicon, a doped semiconductor material, such as silicon doped with boron or silicon germanium doped with boron, or the like. The first semiconductor material layer 392A may have a dopant concentration (e.g., a concentration of boron [B] or the like) from about $1\times10^{20}$ atoms/cm$^3$ to about $4\times10^{21}$ atoms/cm$^3$, such as about $5\times10^{20}$ atoms/cm$^3$. In embodiments in which the first semiconductor material layer 392A comprises silicon germanium, the first semiconductor material layer 392A may have an atomic concentration of germanium less than about 30 percent, such as about 15 percent. The second semiconductor material layer 392B may comprise a doped semiconductor material, such as silicon germanium doped with boron or the like. The second semiconductor material layer 392B may have a dopant concentration from about $1\times10^{20}$ atoms/cm$^3$ to about $4\times10^{21}$ atoms/cm$^3$, such as about $5\times10^{20}$ atoms/cm$^3$. The second semiconductor material layer 392B may have a germanium concentration greater than the first semiconductor material layer 392A. For example, the second semiconductor material layer 392B may have an atomic concentration of germanium from about 30 percent to about 60 percent, such as about 55 percent. The second semiconductor material layer 292B may have a gradient concentration both germanium and boron. The third semiconductor material layer 392C may comprise a semiconductor material such as silicon, silicon germanium, or the like. The third semiconductor material layer 392C may have a lower germanium concentration than the first semiconductor material layer 392A. For example, the third semiconductor material layer 392C may have an atomic concentration of germanium less than about 20 percent, such as about 10 percent. The first semiconductor material layer 392A may be selectively grown from channel regions 168 over the substrate 150. The first semiconductor material layer 392A may have a thickness from about 2 nm to about 5 nm, such as about 4 nm.

The steps discussed above with respect to FIGS. 29A-35C may be used to independently form first epitaxial source/drain regions 92', second epitaxial source/drain regions 192', third epitaxial source/drain regions 292', and fourth epitaxial source/drain regions 392'. The epitaxial source/drain regions may thereby be formed having any of the semiconductor material layers discussed above with respect to FIGS. 36A-39B. Forming each of the epitaxial source/drain regions independently allows for each of the epitaxial source/drain regions to be independently tuned (such as by including different semiconductor material layers in the various epitaxial source/drain regions), increasing flexibility for device design, increasing device performance, and reducing device defects.

In accordance with an embodiment, a semiconductor device includes a semiconductor substrate; a first nanostructure over the semiconductor substrate; a first gate stack over the semiconductor substrate and surrounding four sides of the first nanostructure; a first epitaxial source/drain region adjacent the first gate stack and the first nanostructure; a first inner spacer layer between the first gate stack and the first epitaxial source/drain region in a direction parallel to a major surface of the semiconductor substrate, the first inner spacer layer including a first material; a second nanostructure over the semiconductor substrate; a second gate stack over the semiconductor substrate and surrounding four sides of the second nanostructure; a second epitaxial source/drain region adjacent the second gate stack and the second nanostructure; and a second inner spacer layer between the second gate stack and the second epitaxial source/drain region in the direction parallel to the major surface of the semiconductor substrate, the second inner spacer layer including a second material different from the first material. In an embodiment, the first material includes a material having a dielectric constant less than 3.5, and the second material includes silicon. In an embodiment, a thickness of the first inner spacer layer in the direction parallel to the major surface of the semiconductor substrate is from 3 nm to 8 nm, and a thickness of the second inner spacer layer in the direction parallel to the major surface of the semiconductor substrate is from 2 nm to 4 nm. In an embodiment, the semiconductor device further includes first gate spacers adjacent sidewalls of the first gate stack and the first epitaxial source/drain region, the first gate spacers having first heights adjacent the sidewalls of the first epitaxial source/drain region; and second gate spacers adjacent sidewalls of the second gate stack and the second epitaxial source/drain region, the second gate spacers having second heights adjacent the sidewalls of the second epitaxial source/drain region greater than the first heights. In an embodiment, the first heights are from 5 nm to 15 nm and the second heights are from 10 nm to 20 nm. In an embodiment, the first epitaxial source/drain region has a height from 30 nm to 70 nm, and the second epitaxial source/drain region has a height from 30 nm to 70 nm.

In accordance with another embodiment, a method includes forming a multi-layer stack over a semiconductor substrate, the multi-layer stack including alternating layers of a first semiconductor material and a second semiconductor material different from the first semiconductor material; masking a first region of the multi-layer stack; etching a second region of the multi-layer stack to form a first opening exposing the semiconductor substrate; etching a sidewall of the first semiconductor material through the first opening to form a first recess; forming a first inner spacer in the first recess; epitaxially growing a first source/drain region in the first opening; masking the second region of the multi-layer stack; etching the first region of the multi-layer stack to form a second opening exposing the semiconductor substrate;

etching a sidewall of the first semiconductor material through the second opening to form a second recess; forming a second inner spacer in the second recess; and epitaxially growing a second source/drain region in the second opening. In an embodiment, the first recess is etched to a depth greater than the second recess. In an embodiment, forming the first inner spacer includes depositing a silicon material in the first recess, forming the second inner spacer includes depositing a material having a dielectric constant less than 3.5 in the second recess. In an embodiment, the method further includes etching the multi-layer stack to form a first nanostructure in the first region and a second nanostructure in the second region; forming a first spacer adjacent a sidewall of the first nanostructure; and forming a second spacer adjacent a sidewall of the second nanostructure, a first height of the first spacer being greater than a second height of the second spacer. In an embodiment, the first spacer has a height from 10 nm to 20 nm, and the second spacer has a height from 5 nm to 15 nm. In an embodiment, the second region is etched to a depth from 40 nm to 50 nm to form the first opening, and the first region is etched to a depth from 35 nm to 45 nm to form the second opening.

In accordance with yet another embodiment, a method includes forming a multi-layer stack over a first region of a semiconductor substrate, the multi-layer stack including alternating layers of a first semiconductor material and a second semiconductor material different from the first semiconductor material; etching the multi-layer stack to form a first nanostructure; etching a second region of the semiconductor substrate to form a first fin; masking the second region of the semiconductor substrate; etching the first nanostructure to form a first opening exposing the semiconductor substrate; etching a sidewall of the first semiconductor material through the first opening to form a first recess; forming a first inner spacer in the first recess; epitaxially growing a first source/drain region in the first opening; masking the first region of the semiconductor substrate; etching the first fin to form a second opening; and epitaxially growing a second source/drain region in the second opening. In an embodiment, the method further includes forming a first spacer adjacent a sidewall of the first nanostructure; and forming a second spacer adjacent a sidewall of the first fin, a first height of the first spacer being less than a second height of the second spacer. In an embodiment, the first height is from 5 nm to 20 nm, and the second height is from 20 nm to 35 nm. In an embodiment, the first nanostructure is etched to a depth from 51 nm to 71 nm to form the first opening, and the first fin is etched to a depth from 30 nm to 60 nm to form the second opening. In an embodiment, epitaxially growing the first source/drain region includes selectively depositing a third semiconductor material on the second semiconductor material and the semiconductor substrate; and depositing a fourth semiconductor material different from the third semiconductor material on the third semiconductor material, the fourth semiconductor material contacting the first inner spacer. In an embodiment, epitaxially growing the first source/drain region includes selectively depositing a third semiconductor material on the second semiconductor material and the semiconductor substrate; and depositing a fourth semiconductor material different from the third semiconductor material on the third semiconductor material, the fourth semiconductor material being separated from the first inner spacer, the second semiconductor material, and the semiconductor substrate by the third semiconductor material. In an embodiment, epitaxially growing the first source/drain region includes selectively depositing a third semiconductor material on the second semiconductor material and the semiconductor substrate; and epitaxially growing the second source/drain region includes selectively depositing a fourth semiconductor material on the semiconductor substrate, a thickness of the third semiconductor material being greater than a thickness of the fourth semiconductor material. In an embodiment, a height between a bottommost surface of the first source/drain region and a topmost surface of the first source/drain region is greater than a height between a bottommost surface of the second source/drain region and a topmost surface of the second source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a multi-layer stack over a semiconductor substrate, the multi-layer stack comprising alternating layers of a first semiconductor material and a second semiconductor material different from the first semiconductor material;
   masking a first region of the multi-layer stack;
   etching a second region of the multi-layer stack to form a first opening exposing the semiconductor substrate, wherein the first opening extends to a first depth below a top surface of the multi-layer stack in a first direction perpendicular to a major surface of the semiconductor substrate;
   etching a first sidewall of the first semiconductor material through the first opening to form a first recess;
   forming a first inner spacer in the first recess;
   epitaxially growing a first source/drain region in the first opening;
   masking the second region of the multi-layer stack;
   etching the first region of the multi-layer stack to form a second opening exposing the semiconductor substrate, wherein the second opening extends to a second depth below the top surface of the multi-layer stack, wherein the first depth is greater than the second depth in the first direction;
   etching a second sidewall of the first semiconductor material through the second opening to form a second recess;
   forming a second inner spacer in the second recess; and
   epitaxially growing a second source/drain region in the second opening.

2. The method of claim 1, wherein the first recess is etched to a depth greater than the second recess.

3. The method of claim 2, wherein forming the first inner spacer comprises depositing a silicon material in the first recess, wherein forming the second inner spacer comprises depositing a material having a dielectric constant less than 3.5 in the second recess.

4. The method of claim 1, further comprising:
   etching the multi-layer stack to form a first nanostructure in the first region and a second nanostructure in the second region;

forming a first spacer adjacent a third sidewall of the first nanostructure; and forming a second spacer adjacent a fourth sidewall of the second nanostructure, wherein a first height of the first spacer is greater than a second height of the second spacer.

5. The method of claim 4, wherein the first spacer has a third height from 10 nm to 20 nm, and wherein the second spacer has a fourth height from 5 nm to 15 nm.

6. The method of claim 1, wherein the first depth extends from 40 nm to 50 nm below the top surface of the multi-layer stack, and wherein the second depth extends from 35 nm to 45 below the top surface of the multi-layer stack.

7. A method comprising:
forming a multi-layer stack over a first region of a semiconductor substrate, the multi-layer stack comprising alternating layers of a first semiconductor material and a second semiconductor material different from the first semiconductor material;
etching the multi-layer stack to form a first nanostructure;
etching a second region of the semiconductor substrate to form a first fin, wherein the first fin comprises a third semiconductor material, wherein the third semiconductor material extends continuously from level with a bottom surface of the multi-layer stack to level with a top surface of the multi-layer stack;
masking the second region of the semiconductor substrate;
etching the first nanostructure to form a first opening exposing the semiconductor substrate;
etching a sidewall of the first semiconductor material through the first opening to form a first recess;
forming a first inner spacer in the first recess;
epitaxially growing a first source/drain region in the first opening;
masking the first region of the semiconductor substrate;
etching the first fin to form a second opening; and
epitaxially growing a second source/drain region in the second opening.

8. The method of claim 7, further comprising:
forming a first spacer adjacent a first sidewall of the first nanostructure; and
forming a second spacer adjacent a second sidewall of the first fin, wherein a first height of the first spacer is less than a second height of the second spacer.

9. The method of claim 8, wherein the first height is from 5 nm to 20 nm, and wherein the second height is from 20 nm to 35 nm.

10. The method of claim 7, wherein the first nanostructure is etched to a first depth from 51 nm to 71 nm to form the first opening, and wherein the first fin is etched to a second depth from 30 nm to 60 nm to form the second opening.

11. The method of claim 7, wherein epitaxially growing the first source/drain region comprises:
selectively depositing a fourth semiconductor material on the second semiconductor material and the semiconductor substrate; and
depositing a fifth semiconductor material different from the fourth semiconductor material on the fourth semiconductor material, wherein the fifth semiconductor material contacts the first inner spacer.

12. The method of claim 7, wherein epitaxially growing the first source/drain region comprises:
selectively depositing a fourth semiconductor material on the second semiconductor material and the semiconductor substrate; and
depositing a fifth semiconductor material different from the fourth semiconductor material on the fourth semiconductor material, wherein the fifth semiconductor material is separated from the first inner spacer, the second semiconductor material, and the semiconductor substrate by the fourth semiconductor material.

13. The method of claim 7, wherein:
epitaxially growing the first source/drain region comprises selectively depositing a fourth semiconductor material on the second semiconductor material and the semiconductor substrate; and
epitaxially growing the second source/drain region comprises selectively depositing a fifth semiconductor material on the semiconductor substrate, wherein a first thickness of the fourth semiconductor material is greater than a second thickness of the fifth semiconductor material.

14. The method of claim 7, wherein a first height between a first bottommost surface of the first source/drain region and a first topmost surface of the first source/drain region is greater than a second height between a second bottommost surface of the second source/drain region and a second topmost surface of the second source/drain region.

15. A method comprising:
forming a first nanostructure and a second nanostructure over a semiconductor substrate;
etching the first nanostructure to form a first recess;
forming a first inner spacer in the first recess, the first inner spacer comprising a first material;
forming a first epitaxial source/drain region adjacent the first inner spacer;
replacing the first nanostructure with a first gate stack, the first inner spacer being between the first gate stack and the first epitaxial source/drain region in a first direction parallel to a major surface of the semiconductor substrate, wherein the first gate stack is separated from the first epitaxial source/drain region by a first distance in the first direction;
etching the second nanostructure to form a second recess;
forming a second inner spacer in the second recess, the second inner spacer comprising a second material different from the first material;
forming a second epitaxial source/drain region adjacent the second inner spacer; and
replacing the second nanostructure with a second gate stack, the second inner spacer being between the second gate stack and the second epitaxial source/drain region in the first direction, wherein the second gate stack is separated from the second epitaxial source/drain region by a second distance in the first direction, and wherein the second distance is less than the first distance.

16. The method of claim 15, wherein the first material comprises a material having a dielectric constant less than 3.5, and wherein the second material comprises silicon.

17. The method of claim 16, wherein the first inner spacer is formed with a first thickness in the first direction from 3 nm to 8 nm, and wherein the second inner spacer is formed with a second thickness in the first direction from 2 nm to 4 nm.

18. The method of claim 15, further comprising:
forming a first gate spacer over the first nanostructure and the semiconductor substrate, the first gate spacer having a first height in a second direction perpendicular to the major surface of the semiconductor substrate, wherein the first epitaxial source/drain region is formed adjacent the first gate spacer; and forming a second gate spacer over the second nanostructure and the semiconductor substrate, the second gate spacer having a second height in the second direction greater than the first height, wherein the second epitaxial source/drain region is formed adjacent the second gate spacer.

19. The method of claim 18, wherein the first height is from 5 nm to 15 nm and wherein the second height is from 10 nm to 20 nm.

20. The method of claim 19, wherein the first epitaxial source/drain region has a third height from 30 nm to 70 nm in the second direction, and wherein the second epitaxial source/drain region has a fourth height from 30 nm to 70 nm in the second direction.

* * * * *